(12) United States Patent
Kim et al.

(10) Patent No.: US 8,878,273 B2
(45) Date of Patent: Nov. 4, 2014

(54) SEMICONDUCTOR MEMORY DEVICE INCLUDING NARROWER STORAGE NODE CONTACT PLUGS

(75) Inventors: Daeik Kim, Hwaseong-si (KR); Sooho Shin, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 262 days.

(21) Appl. No.: 13/369,900

(22) Filed: Feb. 9, 2012

(65) Prior Publication Data
US 2012/0217559 A1 Aug. 30, 2012

(30) Foreign Application Priority Data

Feb. 28, 2011 (KR) .......................... 10-2011-0017869

(51) Int. Cl.
*H01L 29/94* (2006.01)
*H01L 27/108* (2006.01)

(52) U.S. Cl.
CPC .... *H01L 27/10855* (2013.01); *H01L 27/10876* (2013.01)
USPC .......................................... 257/306; 257/311

(58) Field of Classification Search
CPC ............ H01L 27/1082; H01L 27/1052; H01L 27/10897; H01L 27/10882; H01L 27/10885; H01L 27/10888; H01L 27/10891
USPC .................................................. 257/306, 311
See application file for complete search history.

(56) References Cited

U.S. PATENT DOCUMENTS

| | | | | |
|---|---|---|---|---|
| 7,728,373 B2 * | 6/2010 | Seo et al. | ....................... | 257/306 |
| 2006/0134859 A1 * | 6/2006 | Koo | ............................... | 438/253 |
| 2007/0267676 A1 * | 11/2007 | Kim et al. | ..................... | 257/311 |
| 2008/0003798 A1 * | 1/2008 | Hwang | .......................... | 438/597 |
| 2010/0283091 A1 * | 11/2010 | Park | .............................. | 257/296 |
| 2011/0156262 A1 * | 6/2011 | Shin et al. | ..................... | 257/773 |
| 2012/0108057 A1 * | 5/2012 | Hwang | .......................... | 438/653 |

FOREIGN PATENT DOCUMENTS

| | | |
|---|---|---|
| KR | 1020100030015 A | 3/2010 |
| KR | 1020100046300 A | 5/2010 |
| KR | 1020100074718 A | 7/2010 |

* cited by examiner

*Primary Examiner* — Kevin Parendo
(74) *Attorney, Agent, or Firm* — Myers Bigel Sibley & Sajovec, PA

(57) ABSTRACT

A semiconductor memory device includes an active region protruding from a substrate. The active region includes first and second doped regions therein and a trench therein separating the first and second doped regions. A buried gate structure extends in a first direction along the trench between first and second opposing sidewalls thereof. A conductive interconnection plug is provided on the first doped region adjacent the first sidewall of the trench, and a conductive landing pad is provided on the second doped region adjacent the second sidewall of the trench. The landing pad has a width greater than that of the second doped region of the active region along the first direction. A conductive storage node contact plug is provided on the landing pad opposite the second doped region. The storage node contact plug has a narrower width than the landing pad along the first direction.

10 Claims, 55 Drawing Sheets

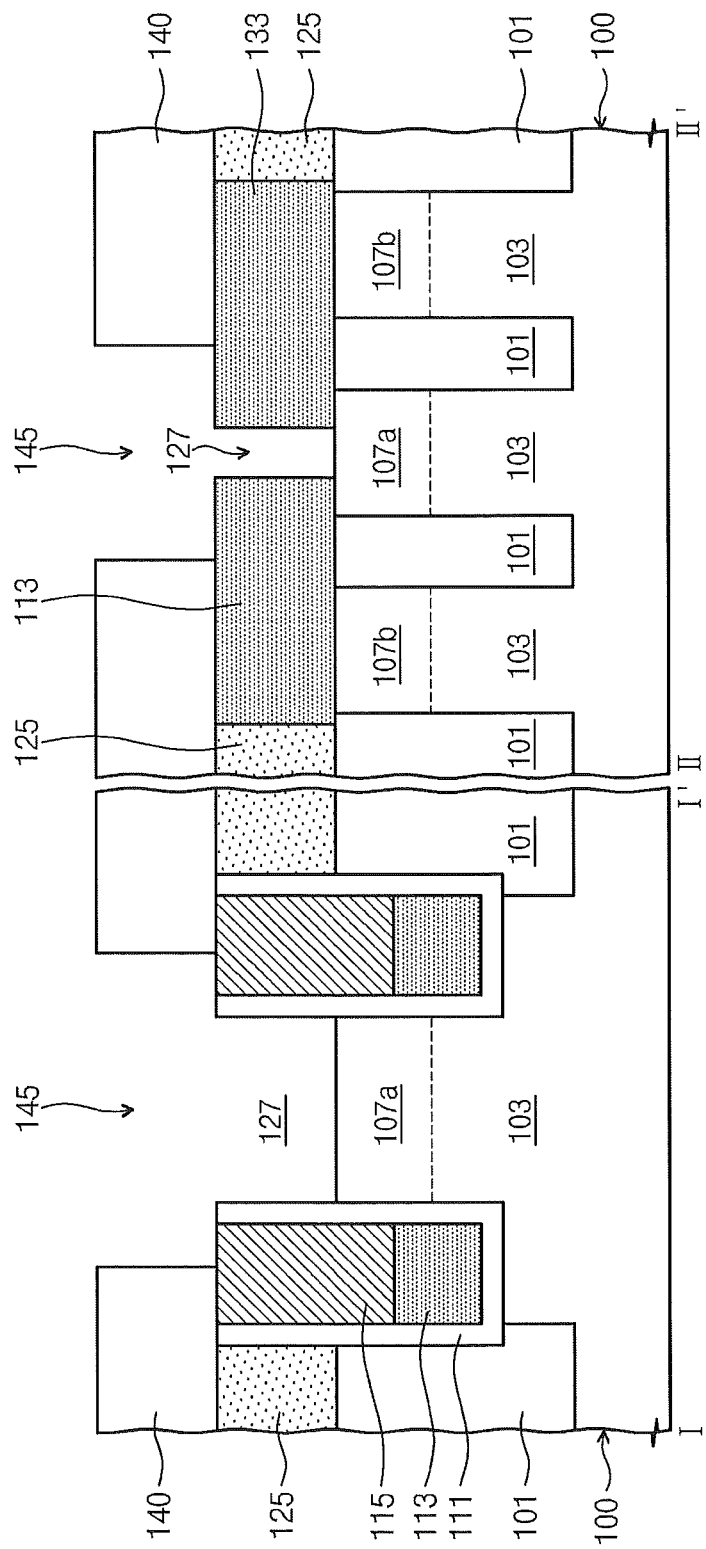

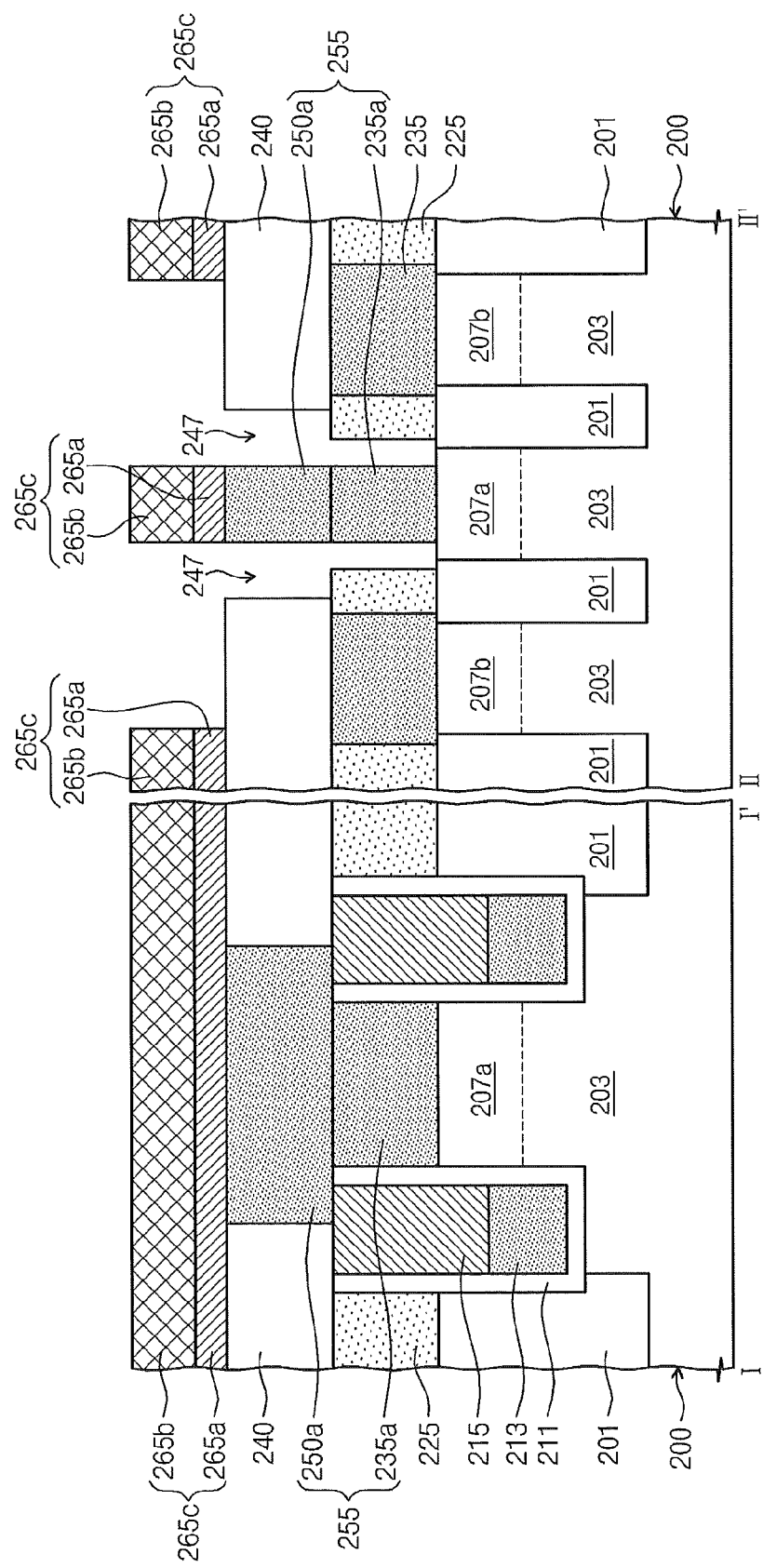

SEMICONDUCTOR MEMORY DEVICE INCLUDING NARROWER STORAGE NODE CONTACT PLUGS

CROSS-REFERENCE TO RELATED APPLICATIONS

This U.S. non-provisional patent application claims priority under 35 U.S.C. §119 to Korean Patent Application No. 10-2011-0017869, filed on Feb. 28, 2011, in the Korean Intellectual Property Office, the disclosure of which is hereby incorporated by reference herein in its entirety.

BACKGROUND OF THE INVENTION

Embodiments of the inventive concepts relate generally to semiconductor memory devices and methods of fabricating the same. More particularly, embodiments of the inventive concepts relate to semiconductor memory devices including a buried gate electrode and a method of fabricating the same.

Integration densities and fabrication process margins for semiconductor memory devices are increasing to meet growing demands for lightweight, small-sized, high speed, multifunctional, high performance, high reliable, and low cost devices. For instance, a word line structure may be modified to increase an integration density and an effective channel length of a semiconductor memory device to attempt to satisfy these demands. For this reason, a variety of research has been conducted to improve semiconductor memory devices having such a modified word line structure in terms of reliability and/or electrical characteristics.

SUMMARY

Embodiments of the inventive concepts provide a semiconductor memory device with improved reliability. Embodiments of the inventive concepts also provide a method of fabricating a semiconductor memory device with improved reliability.

According to example embodiments of the inventive concepts, a semiconductor memory device includes an active region protruding from a substrate. The active region includes first and second doped regions therein and a trench therein separating the first and second doped regions. A buried gate structure extends in a first direction along the trench between first and second opposing sidewalls thereof. A conductive interconnection plug is provided on the first doped region adjacent the first sidewall of the trench, and a conductive landing pad is provided on the second doped region adjacent the second sidewall of the trench. The landing pad has a width greater than that of the second doped region of the active region along the first direction. A conductive storage node contact plug is provided on the landing pad opposite the second doped region. The storage node contact plug has a narrower width than the landing pad along the first direction.

In some embodiments, in plan view, an overlap area between the conductive landing pad and the second doped region may be greater than an overlap area between the storage node contact plug and the second doped region.

In some embodiments, a contact area between the conductive landing pad and the second doped region may be greater than a cross-sectional area of a portion of the storage node contact plug that overlaps with the second doped region in plan view.

In some embodiments, an interconnection line may be provided on the interconnection plug opposite the first doped region. The interconnection line may extend in a second direction substantially perpendicular to the first direction. The interconnection line and the interconnection plug may have a substantially similar width along the first direction.

In some embodiments, a spacer layer extends between the interconnection plug and a landing pad of an adjacent active region of the substrate to provide electrical isolation therebetween.

In some embodiments, the landing pad of the adjacent active region and the interconnection plug may be portions of a same layer.

In some embodiments, a dielectric guide pattern may extend between the landing pad and a landing pad of an adjacent active region of the substrate. In some embodiments, the guide pattern may extend in the second direction. In some embodiments, the guide pattern may extend substantially parallel to the active region. In some embodiments, the active region may extend in a direction non-parallel and non-perpendicular to the first and second directions.

In some embodiments, the buried gate structure may extend into the substrate beyond the first doped region in the active region. In some embodiments, the buried gate structure may include a buried gate electrode and a capping pattern thereon in the trench, and the first doped region may extend into the substrate beyond a surface of the buried gate electrode.

In some embodiments, the interconnection line may include a first conductive layer on the interconnection plug, and a second conductive layer on the first conductive layer. The second conductive layer may include a material having a higher conductivity than that of the first conductive layer. In some embodiments, the interconnection plug and the first conductive layer of the interconnection line may be formed of a same material.

In some embodiments, a storage element may be provided on the storage node contact plug. The storage node contact plug and the landing pad may electrically connect the storage element to the second doped region.

According to further example embodiments of the inventive concepts, a semiconductor memory device may include a device isolation pattern provided in a substrate to define an active region, a buried gate electrode provided in the substrate, the buried gate electrode extending along a first direction to cross the active region and the device isolation pattern, a conductive interconnection plug provided on the substrate, the interconnection plug being disposed adjacent one side of the buried gate electrode, a conductive landing pad provided on the substrate, the landing pad being disposed adjacent the other side of the buried gate electrode, and a conductive interconnection line provided on the substrate, the interconnection line extending along a second direction crossing the first direction and being connected to the interconnection plug. The interconnection plug and the interconnection line may have a substantially similar width along the first direction.

In some embodiments, the device may further include a spacer provided on a sidewall of the interconnection line. The spacer may include an extended portion extending downward to cover a sidewall of the interconnection plug.

In some embodiments, the extended portion of the spacer may be interposed between the landing pad and the interconnection plug.

In some embodiments, the device may further include a dielectric guide pattern provided on the substrate. The landing pad may have a first sidewall and a second sidewall being in contact with the extended portion of the spacer and the dielectric guide pattern, respectively.

In some embodiments, the dielectric guide pattern may extend along the second direction to be parallel to the interconnection line.

In some embodiments, the device may further include a pair of dielectric guide patterns provided on the substrate. The landing pad may be disposed between the pair of the dielectric guide patterns.

In some embodiments, the active region has a rectangular shape extending along a third direction being non-perpendicular to and non-parallel to the first and second directions, and the pair of the dielectric guide patterns may extend parallel to the third direction.

In some embodiments, the interconnection plug may include a first portion and a second portion, and the first portion of the interconnection plug may include the same conductive material as the landing pad.

In some embodiments, the device may further include a first doped region provided in a portion of the active region adjacent one side of the buried gate electrode, a second doped region provided in other portion of the active region adjacent the other side of the buried gate electrode, and a storage plug provided on the landing pad. The interconnection plug may be coupled to the first doped region, the storage plug may be coupled to the landing pad, and the landing pad may be coupled to the second doped region.

In some embodiments, an overlap area between the landing pad and a top surface of the second doped region may be greater than that between the storage plug and the top surface of the second doped region in plan view.

In some embodiments, the interconnection line may include a first pattern and a second pattern sequentially stacked. The first pattern may include the same conductive material as the interconnection plug.

According to still further example embodiments of the inventive concepts, a method of fabricating a semiconductor memory device may include forming a device isolation pattern in a substrate to define an active region, forming a conductive pattern on the substrate, the conductive pattern being in contact with a portion of the active region, patterning the conductive pattern to form a landing pad being in contact with a portion of the active region, the patterning of the conductive pattern including forming a groove in the substrate to cross the active region and the conductive pattern, and forming a buried gate electrode in the groove.

In some embodiments, the forming of the conductive pattern may include forming a pair of guide patterns on the substrate to extend substantially parallel to a longitudinal axis of the active region, forming a conductive layer to fill an internal space between the pair of the guide patterns, and etching the conductive layer to expose top surfaces of the guide patterns. The guide patterns may be cut by the groove to form dielectric patterns.

In some embodiments, the groove may extend substantially perpendicular to a longitudinal axis of the active region.

In some embodiments, the groove may be formed non-perpendicular to and non-parallel to a longitudinal axis of the active region.

In some embodiments, the method may further include forming a first doped region in a portion of the active region adjacent one side of the buried gate electrode, forming a second doped region in other portion of the active region adjacent the other side of the buried gate electrode, at least a portion of the second doped region being in contact with the landing pad, and forming a storage plug provided on the landing pad.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3A through 12A are plan views illustrating methods of fabricating a semiconductor memory device according to example embodiments of the inventive concepts;

FIGS. 3B through 12B are cross-sectional views taken along lines I-I' and II-II' of FIGS. 3A through 12A, respectively;

FIGS. 15A through 23A are plan views illustrating methods of fabricating a semiconductor memory device according to yet further example embodiments of the inventive concepts;

FIGS. 15B through 23B are cross-sectional views taken along lines I-I' and II-II' of FIGS. 15A through 23A, respectively;

FIGS. 24A through 24D are cross-sectional views illustrating methods of fabricating a semiconductor memory device according to still further example embodiments of the inventive concepts;

Figure 1A:
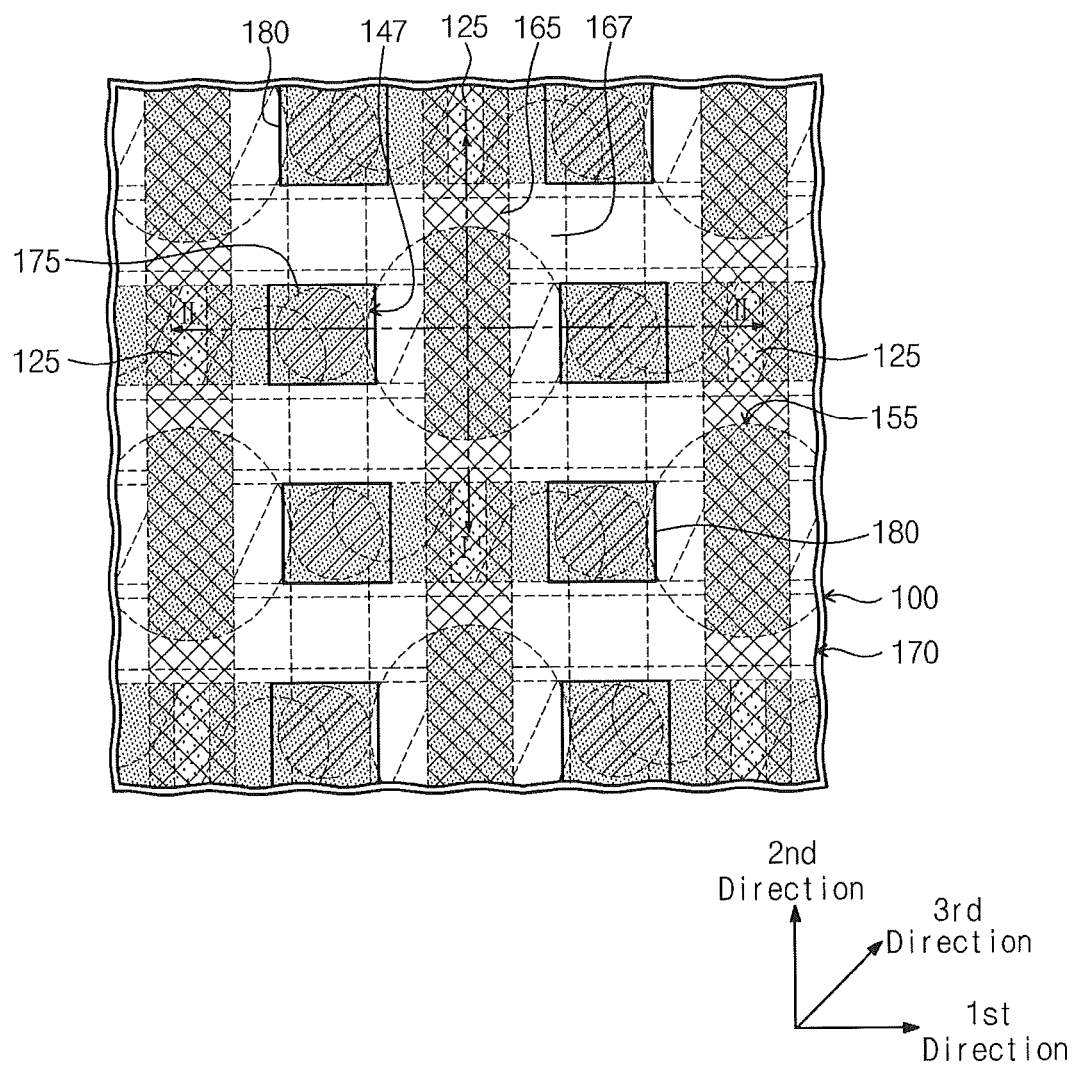
FIG. 1A is a plan view of a semiconductor memory device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like numbers indicate like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. As used herein the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a semiconductor memory device according to example embodiments of the inventive concepts will be described in more detail with reference to the accompanying drawings. FIG. 1A is a plan view of a semiconductor memory device according to example embodiments of the inventive concepts, and FIG. 1B is a cross-sectional view taken along lines I-I' and II-II' of FIG. 1A.

Figure 1B:
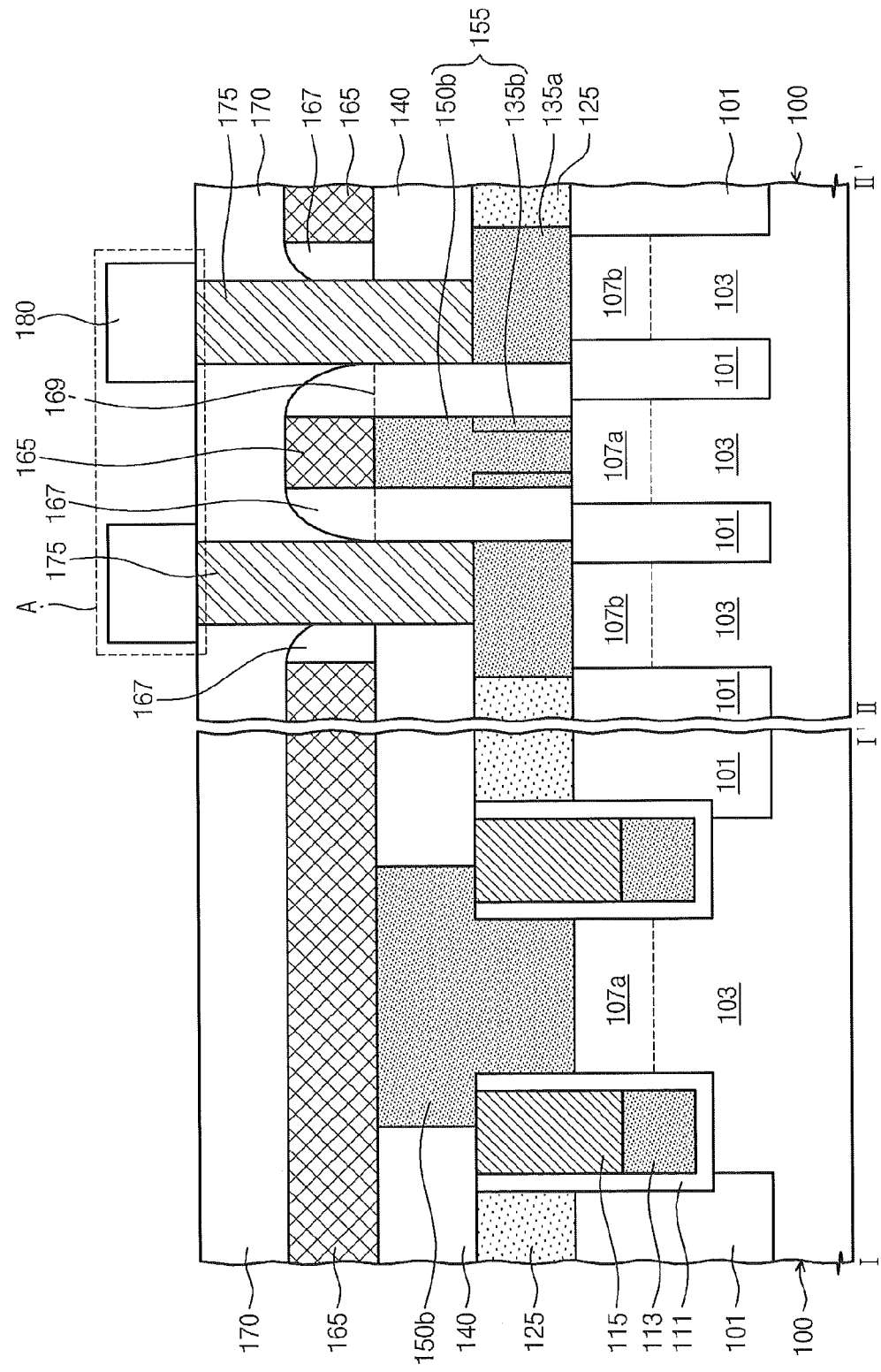
FIG. 1B is a cross-sectional view taken along lines I-I' and II-II' of FIG. 1A.

Referring to FIGS. 1A and 1B, a device isolation pattern 101 may be provided in a substrate 100 to define at least one active region 103. The device isolation pattern 101 may be formed to have a shallow-trench isolation (STI) structure, but example embodiments of the inventive concepts may not be limited thereto. The device isolation pattern 101 may include an insulating material. For instance, the device isolation pattern 101 may include at least one of silicon oxide, silicon nitride, or silicon oxynitride. The substrate 100 may include a semiconductor material. For instance, the substrate 100 may include at least one of silicon or germanium.

In some embodiments, the at least one active region 103 may include a plurality of active regions 103 provided in the substrate 100. The active regions 103 may be classified into a first group and a second group according to position thereof. The first group of the active regions 103 may be two-dimensionally arranged in rows and in columns. For the sake of convenience, a term "first direction" will be used to represent a direction parallel to the rows (e.g., the rows extend in the first direction), and a term "second direction" will be used to represent a direction parallel to the columns (e.g., the columns extend in the second direction) or crossing the first direction. The first group of the active regions 103 may be arranged at a first pitch along the first direction and at a second pitch along the second direction. The second group of the active regions 103 may be two-dimensionally arranged in rows and in columns, and each of the active regions 103 in the second group may be disposed at a position moved from the corresponding one of the active regions 103 in the first group by half the first pitch along the first direction and by half the second pitch along the second direction.

Each of the active regions 103 may have an elongated rectangular shape extending along a third direction, where the third direction may be non-parallel to and non-perpendicular to both of the first and second directions. The active regions 103 may be formed to have a longitudinal direction parallel to the third direction. The term "longitudinal direction" refers to the orientation of the long axis or major axis of an element or object constituting the semiconductor memory device. As also used herein, the direction in which an element or object "extends" corresponds to the longitudinal direction or major axis of the element or object.

A trench or groove 105 may be provided in the substrate 100. In a plan view, the groove 105 may have a substantially linear shape that extends along the first direction to cross the active region 103 and the device isolation pattern 101. A buried gate electrode 113 may be provided in the groove 105. In a plan view, the buried gate electrode 113 may have a substantially linear shape extending along the first direction.

A level of a top surface of the buried gate electrode 113 may be lower than that of the substrate 100 and/or the active region 103 therein. In other words, the buried gate electrode 113 may have a configuration buried in the groove 105. The buried gate electrode 113 may include a doped semiconductor layer, a conductive metal nitride layer (e.g., of titanium nitride, tantalum nitride, or tungsten nitride), and/or a metal layer (e.g., of ruthenium, iridium, titanium, or tantalum).

A gate dielectric pattern 111 may be provided between the buried gate electrode 113 and the groove 105. The gate dielectric pattern 111 may include oxide, nitride, oxynitride, and/or high-k materials. The high-k material may be a dielectric material having a dielectric constant greater than that of silicon nitride. For instance, the high-k material may be at least one of insulating metal oxides, such as hafnium oxide or aluminum oxide. In some embodiments, as shown in FIG. 1B, the gate dielectric pattern 111 may be provided to cover the entire inner surface of the groove 105 (including sidewalls of the groove 105 and the surface therebetween), thereby providing a 'U'-shaped cross-sectional structure.

A capping pattern 115 may be provided on the buried gate electrode 113. The capping pattern 115 may be provided to fill a portion of the groove 105. In a plan view, the capping pattern 115 may have a linear shape extending along the first direction. In some embodiments, the uppermost top surface of the capping pattern 115 may be positioned at a higher level than the uppermost top surface of the substrate 100. Accordingly, in cross-section, an upper portion of the capping pattern 115 may protrude upward relative to a top surface of the substrate 100 including the active region 103 therein.

The capping pattern 115 may be a single-layered or multi-layered structure. The capping pattern 115 may include an insulating material. For instance, the capping pattern 115 may include oxide, nitride, or oxynitride materials.

In some embodiments, the gate dielectric pattern 111, the buried gate electrode 113, and the capping pattern 115 may constitute or define a buried gate pattern.

A first doped region 107a and a second doped region 107b may be provided in portions of the active region 103 laterally adjacent the buried gate electrode 113. Bottom surfaces or lower boundaries of the first and second doped regions 107a and 107b may be below or formed at positions downward spaced apart from the top surface of the active region 103, but may be positioned above or at a higher level than the bottom surface of the groove 105 in which the buried gate pattern is provided.

In some embodiments, a plurality of the grooves 105 may be disposed to cross the active region 103. For instance, a pair of the grooves 105 may be provide to cross the active region 103, while a pair of the buried gate electrodes 113 may be provided in the pair of the grooves 105, respectively. In this case, the first doped region 107a and a pair of the second doped regions 107b may be provided in the active region 103. The pair of the buried gate electrodes 113 and the first doped region 107a may be provided between the pair of the second doped regions 107b, and the first doped region 107a may be provided between the pair of the buried gate electrodes 113.

A landing pad 135a may be provided on the substrate 100. The landing pad 135a may be electrically connected to the second doped region 107b and spaced apart from the first doped region 107a. In some embodiments, at least a portion of the landing pad 135a may be in direct contact with the second doped region 107b). In some embodiments, the uppermost top surface of the landing pad 135a may be positioned at the substantially same level as the uppermost top surface of the capping pattern 115. The landing pad 135a may include a conductive material. For instance, the landing pad 135a may include a doped semiconductor layer and/or a metal layer (e.g., of titanium, tungsten, and/or tantalum).

A first interlayer dielectric 140 may be provided on the capping pattern 115 and the landing pad 135a. The first interlayer dielectric 140 may include silicon oxide, silicon nitride, and/or silicon oxynitride.

An interconnection plug 155 may be provided on the substrate 100. The interconnection plug 155 may penetrate the first interlayer dielectric 140 to be connected to the first doped region 107a. The interconnection plug 155 may include semiconductor materials (e.g., polysilicon), metal-semiconductor compounds (e.g., tungsten silicide), conductive metal nitrides (e.g., titanium nitride, tantalum nitride or tungsten nitride), and/or metals (e.g., titanium, tungsten, or tantalum).

In some embodiments, the interconnection plug 155 may include a first conductive pattern 150b and a pair of second conductive patterns 135b. The first conductive pattern 150b may include a first portion and a second portion. The first portion of the first conductive pattern 150b may be disposed in an opening defined by the pair of the second conductive patterns 135b and a pair of the capping patterns 115. The second portion of the first conductive pattern 150b may penetrate the first interlayer dielectric 140 and be connected to the first portion thereof. The first portion of the first conductive pattern 150b may be in direct contact with the first doped region 107a in some embodiments.

The second conductive patterns 135b may be provided to have the substantially same height as the landing pad 135a (e.g., such that the second conductive patterns 135b and the landing pad 135a have coplanar upper surfaces). In addition, the second conductive patterns 135b may have the substantially same or coplanar top surface levels as that of the capping pattern 115. The second conductive pattern 135b may include the same conductive material as the landing pad 135a. For instance, in the case where the landing pad 135a includes a polycrystalline semiconductor layer, the second conductive pattern 135b may also include the same polycrystalline semiconductor layer.

In some embodiments, the second portion of the second conductive pattern 135b may have a greater width than the first portion thereof, in terms of a second directional width. Accordingly, the second portion of the second conductive pattern 135b may cover at least a portion of top surfaces of the pair of the capping patterns 115.

A dielectric pattern 125 may be provided on the substrate 100. The dielectric pattern 125 may be provided at one side of the landing pad 135a, while the interconnection plug 155 may be provided at the other side of the landing pad 135a. In other words, the landing pad 135a may be provided between the dielectric pattern 125 and the interconnection plug 155. Accordingly, the dielectric pattern 125, the landing pad 135a, and the interconnection plug 155 may be arranged and/or may extend parallel to the first direction.

In some embodiments, a top surface of the dielectric pattern 125 may be shaped like a rectangle extending along the second direction. The dielectric pattern 125 may include an insulating material. For instance, the dielectric pattern 125 may include silicon oxide, silicon nitride, and/or silicon oxynitride.

In some embodiments, a pair of the landing pads 135a may be provided in one of the active regions 103. A pair of the grooves 105 may be provided between the pair of the landing pads 135a to cross the active region 103. The buried gate electrodes 113 and the capping patterns 115 may be provided in each of the grooves 105. The interconnection plug 155 may be provided between the pair of the grooves 105. The pair of landing pads 135a may be coupled to a pair of the second doped regions 107b of the active region 103. The interconnection plug 155 may be coupled to the first doped region 107a of the active region 103.

An interconnection line 165 may be provided on the first interlayer dielectric 140. The interconnection line 165 may be electrically connected to the interconnection plug 155. The interconnection line 165 may have a linear shape extending along the second direction. The interconnection line 165 may include a conductive material. For instance, the interconnection line 165 may include semiconductor materials (e.g., polysilicon), metal-semiconductor compounds (e.g., tungsten silicide), conductive metal nitrides (e.g., titanium nitride, tantalum nitride or tungsten nitride), and/or metals (e.g., titanium, tungsten, or tantalum).

The interconnection line 165 may have the same or a substantially similar width along the first direction as the interconnection plug 155. Accordingly, both sidewalls of the interconnection line 165 may be aligned with both sidewalls of the interconnection plug 155 in a self-aligned manner.

A sidewall spacer 167 may be provided on a sidewall of the interconnection line 165. The sidewall spacer 167 may further include an extended portion 169 extending toward the substrate 100 to cover a sidewall of the interconnection plug 155. In some embodiments, the extended portion 169 may be in direct contact with the substrate 100. The extended portion 169 may be provided between the interconnection plug 155 and the landing pad 135a. In some embodiments, the extended portion 169 may be in direct contact with a sidewall of the landing pad 135a.

A second interlayer dielectric 170 may be provided on the first interlayer dielectric 140 to cover the interconnection line 165. The second interlayer dielectric 170 may be a single-layered or multi-layered structure. The second interlayer dielectric 140 may include an oxide, nitride, or oxynitride. In some embodiments, the second interlayer dielectric 170 may include the same material as the first interlayer dielectric 140.

A storage node contact plug (or "storage plug") 175 may be provided on the substrate 100 to penetrate the first and second interlayer dielectrics 140 and 170. The storage plug 175 may be electrically connected to the landing pad 135a. In some embodiments, a bottom surface of the storage plug 175 may be in direct contact with the landing pad 135a.

The storage plug 175 may include semiconductor materials (e.g., polysilicon), metal-semiconductor compounds (e.g., tungsten silicide), conductive metal nitrides (e.g., titanium nitride, tantalum nitride or tungsten nitride), and/or metals (e.g., titanium, tungsten, or tantalum).

In plan view, an overlap area between the storage plug 175 and the second doped region 107b may be smaller than an overlap area between the landing pad 135a the second doped region 107b when seen in plan view. As such, a contact area between the conductive landing pad 135a and the second doped region 107b is greater than a cross-sectional area of a portion of the storage plug 175 that overlaps with the second doped region 107b in plan view. In other words, due to the presence of the landing pad 135a, the storage plug 175 can be electrically connected to the second doped region 107b with an increased contact area.

According to some embodiments of the inventive concepts, the storage plug 175 may be disposed on the landing pad 135a provided on the substrate 100. An overlap area between the landing pad 135a and the second doped region 107b may be greater than an overlap area between the storage plug 175 and the second doped region 107b when viewed in plan view. This configuration can provide improved reliability of a semiconductor memory device. In greater detail, a contact area between the second doped region 107b and the storage plug 175 may be reduced in the case of the absence of the landing pad 135a, compared with the case of the presence of the landing pad 135a, and this reduction in the contact area may result in a deterioration in the reliability of a semiconductor memory device. In this sense, in the case that the landing pad 135a is provided as in the above-described embodiments of the inventive concepts, it is possible to increase the contact area between the storage plug 175 and the second doped region 107 and therefore to improve the reliability of a semiconductor memory device.

Furthermore, since the storage plug 175 is provided on the landing pad 135a, it is possible to prevent or reduce the likelihood of the storage plug 175 from being in direct contact with the active region 103. In particular, providing the storage plug 175 in direct contact with the second doped region 107b of the active region 103 may require excessive etching of the device isolation pattern 101 during formation of the storage plug 175, which may result in product failures. However, according to the above-described embodiments of the inventive concepts, since the storage plug 175 is provided on the landing pad 135a, it is possible to reduce or prevent failures associated with excessive etching of the device isolation pattern 101.

In addition, the first directional widths of the interconnection plug 155 and the interconnection line 165 may be the substantially same as each other. Accordingly, it is possible to reduce or prevent the interconnection plug 155 from being in electrical contact with storage plugs and/or other interconnection lines adjacent thereto, thereby reducing the likelihood of an electrical short circuit. This may result in semiconductor memory devices having improved reliability.

As shown in FIG. 1B, an information storing element 180, such as a storage node, may be provided on the second interlayer dielectric 170 and be electrically connected to the storage plug 175. The inventive concepts are not limited to a specific type of the information storing elements 180 and can be realized in various manners.

Figure 2A:
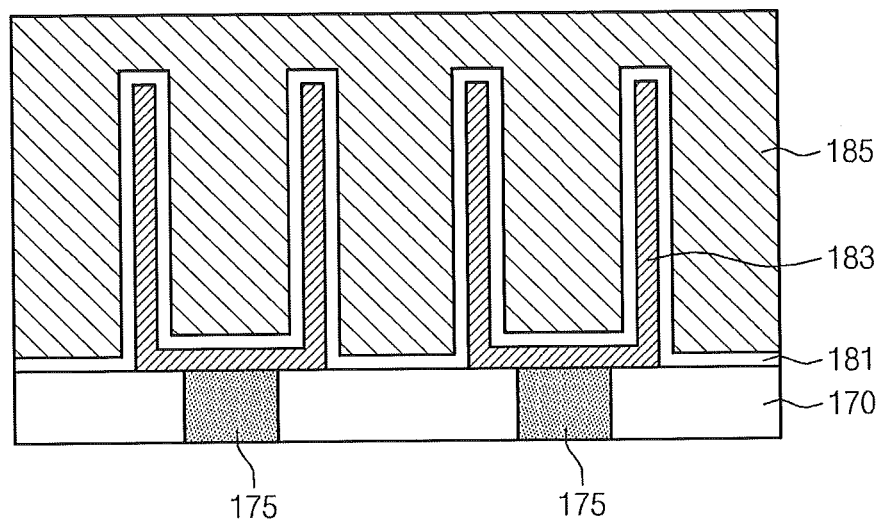
FIG. 2A is an enlarged cross-sectional view of a portions A of FIG. 1B, provided to describe examples of some embodiments of an information storing element of FIG. 1B.
Figure 2B:
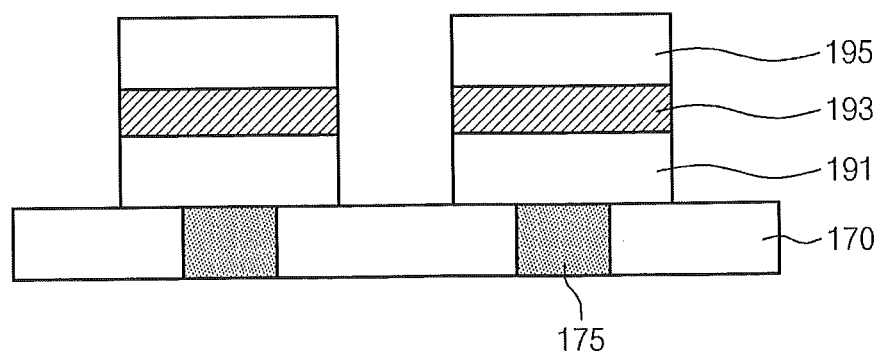
FIG. 2B is an enlarged cross-sectional view of a portions A of FIG. 1B, provided to describe examples of further embodiments of the information storing element of FIG. 1B.

FIG. 2A is an enlarged cross-sectional view of a portions A of FIG. 1B, provided to describe some example embodiments of the information storing element 180 of FIG. 1B, and FIG. 2B is an enlarged cross-sectional view of a portions A of FIG. 1B, provided to describe other example embodiments of the information storing element 180 of FIG. 1B.

Referring to FIG. 2A, in some embodiments, the information storing element 180 may be a capacitor. The information storing element 180 may include a storage node 183 connected to the storage plug 175. The storage node 183 may have a cylindrical shape. For instance, the storage node 183 may include a plate portion connected to the storage plug 175 and a sidewall portion upward extending from an edge of the plate portion. The storage node 183 may include a conductive material. For instance, the storage node 183 may include a doped semiconductor layer, a conductive metal nitride layer (e.g., of titanium nitride, tantalum nitride, or tungsten nitride), a metal layer (e.g., of ruthenium, iridium, titanium, or tantalum), and/or a conductive metal oxide layer (e.g., of iridium oxide).

The information storing element 180 may further include a capacitor dielectric 181 conformally covering a surface of the storage node 183. In some embodiments, top and side surfaces of the storage node 183 may be covered with the capacitor dielectric 181. In other embodiments, the capacitor dielectric 181 may cover a portion of the second interlayer dielectric 170 including a top surface thereof. The capacitor dielectric 181 may include oxide, nitride, oxynitride, and/or high-k materials.

The information storing element 180 may further include an upper electrode 185 that is disposed on the second interlayer dielectric 170 to cover the capacitor dielectric 181. The upper electrode 185 may include a conductive material. For instance, the upper electrode 185 may a doped semiconductor layer, a metal layer, a conductive metal nitride layer, and/or a metal silicide layer.

Referring to FIG. 2B, in some embodiments the information storing element 180 may be a variable resistance element. For instance, the information storing element 180 may include a first electrode 191, a variable resistance element 193, and a second electrode 195. The variable resistance element 193 may be provided between the first electrode 191 and the second electrode 195. In other words, the information storing element 180 according to the present embodiments may include the first electrode 191, the variable resistance element 193, and the second electrode 195 sequentially stacked.

In some embodiments, the variable resistance element 193 may include a phase changeable material configured to be switched between amorphous and crystalline states or phases. The phase changeable material may be a compound including at least one chalcogenide elements, such as Te and Se, and/or at least one of Ge, Sb, Bi, Pb, Sn, Ag, As, S, Si, P, O, or N. For instance, the variable resistance element 193 may include at least one of Ge—Te, Sb—Te, Ge—Sb, Ga—Sb, In—Sb, In—Se, Ge—Sb—Te, Ge—Bi—Te, Ga—Se—Te, Ga—Sb—Te, In—Sb—Te, As—Sb—Te, As—Ge—Sb—Te, Sn—Sb—Te, In—Sn—Sb—Te, Ag—In—Sb—Te, 5A group element—Sb—Te, 6A group element-Sb—Te, 5A group element-Sb—Se, and/or 6A group element-Sb—Se.

The first and second electrodes 191 and 195 may include conductive materials having low reactivity. For instance, the first and second electrodes 191 and 195 may include a conductive metal nitride layer (e.g., of titanium nitride, tantalum nitride and/or titanium-aluminum nitride). In some embodiments, the first electrode 191 may serve as a heating electrode. For instance, the first electrode 191 may be formed to have a higher electric resistance as compared with the second electrode 195. In this case, the variable resistance element 193 may be heated by Joule heat generated from the first electrode 191 and be switched into one of the amorphous and crystalline phases. A difference in resistance between the amorphous and crystalline phases of the variable resistance element 193 may be used to determine data stored in the variable resistance element 193.

In some embodiments, the information storing element 180 may further include an ohmic layer interposed between the storage plug 175 and the first electrode 191. The ohmic layer may include a metal-semiconductor compound. For instance, the ohmic layer may include a cobalt-semiconductor compound (e.g., cobalt silicide), a nickel-semiconductor compound (e.g., nickel silicide), and/or a titanium-semiconductor compound (e.g., titanium silicide).

In other embodiments, the variable resistance element 193 may include a transition metal oxide layer. For instance, the variable resistance element 193 may include at least one layer formed of nickel (Ni), niobium (Nb), titanium (Ti), zirconium (Zr), hafnium (Hf), cobalt (Co), iron (For instance,), copper (Cu), chromium (Cr), or any alloys thereof.

In this case, the first electrode 191 and the second electrode 195 may include a conductive material. For instance, the first electrode 191 and the second electrode 195 may include at least one layer formed of aluminum (Al), gold (Au), platinum (Pt), ruthenium (Ru), iridium (Ir), or titanium (Ti). Resistance of the variable resistance element 193 may be changed depending on a voltage difference generated between the first electrode 191 and the second electrode 195, and this change in resistance may be used as mechanism for storing information into the information storing element 180 according to the present embodiments.

In still other embodiments, the variable resistance element 193 may be a magnetic tunnel junction (MTJ) pattern. For instance, the variable resistance element 193 may include a free layer, a reference layer, and a tunnel barrier interposed between the free and reference layers. The free layer may be configured to have a variable magnetization, and the reference layer may be configured to have a fixed magnetization.

According to further example embodiments of the inventive concepts, the semiconductor memory device may include an interconnection line configured to have a different shape from that of the aforementioned embodiments. Hereinafter, a semiconductor memory device according to further example embodiments of the inventive concepts will be described in more detail with reference to FIG. 1C.

Figure 1C:
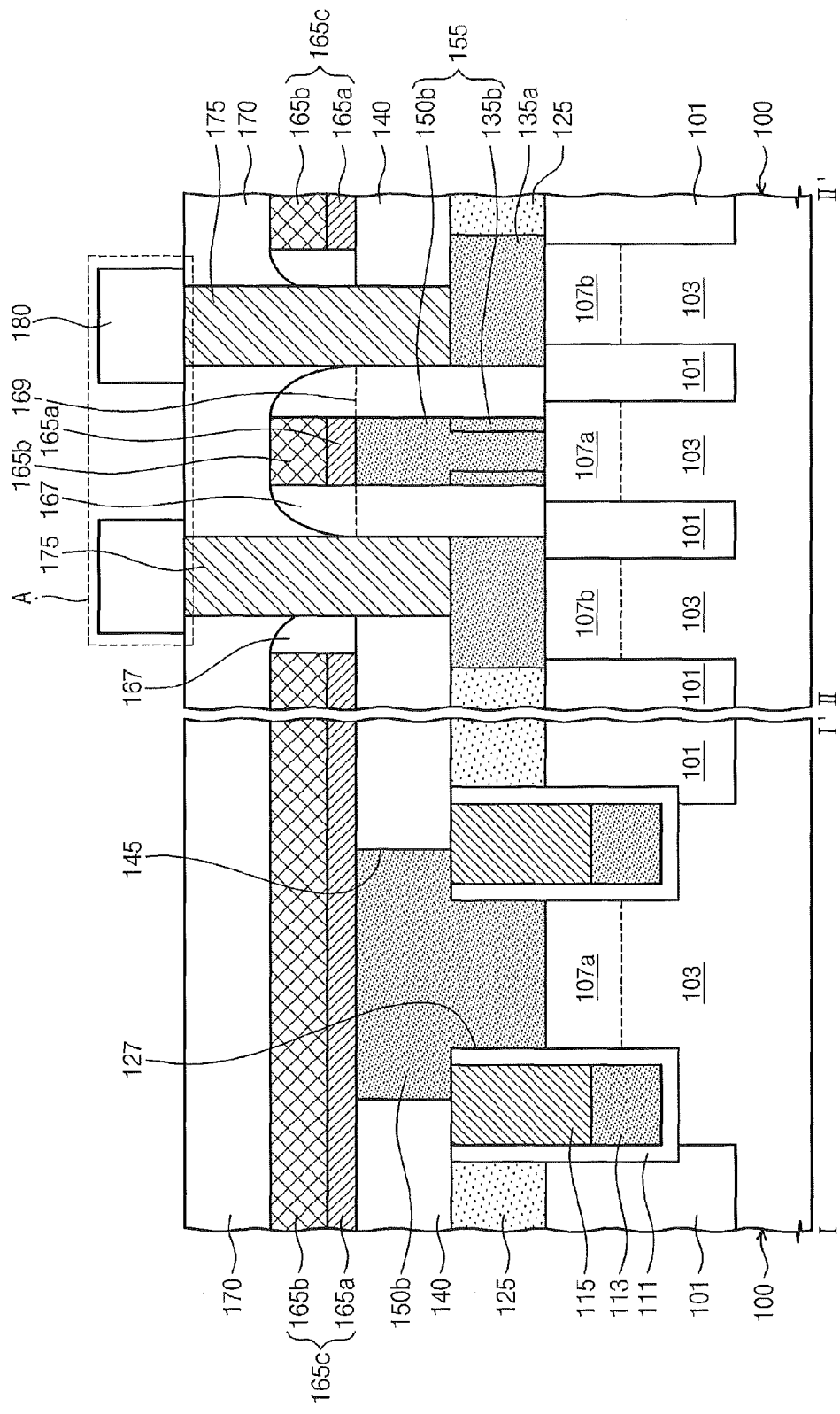
FIG. 1C is a cross-sectional view of a semiconductor memory device according to further example embodiments of the inventive concepts.

Referring to FIG. 1C, the interconnection plug 155 may be provided on the substrate 100 to extend through or penetrate the first interlayer dielectric 140 and be connected to the first doped region 107a. According to FIG. 1C, an interconnection line 165c may be provided on the first interlayer dielectric 140. The interconnection line 165c may be coupled to the interconnection plug 155. The interconnection line 165c may include a first pattern 165a and a second pattern 165b sequentially stacked on the substrate 100.

The first pattern 165a may include the substantially same conductive material as that included in the interconnection plug 155. For instance, in the case where the interconnection plug 155 includes a polycrystalline semiconductor layer, the first pattern 165a may also include the same polycrystalline semiconductor layer. The second pattern 165b may include a conductive material having higher conductivity than the first pattern 165a. For instance, in the case that the first pattern 165a includes a polycrystalline semiconductor layer, the second pattern 165b may include a metal layer (e.g., of tungsten).

According to FIG. 1C, the interconnection line 165c may include the first pattern 165a including the same conductive material as the interconnection plug 155 and the second pattern 165b including a conductive material having higher conductivity than the first pattern 165a. In this case, since the interconnection plug 155 and the first pattern 165a include the same conductive material as each other, it is possible to reduce contact resistance between the interconnection plug 155 and the interconnection line 165c. In addition, since the second pattern 165b includes a conductive material having higher conductivity than the first pattern 165a, it is possible to reduce resistance of the interconnection line 165c. As a result, it is possible to realize a semiconductor memory device having improved electrical characteristics and improved reliability.

Hereinafter, a method of fabricating a semiconductor memory device according to example embodiments of the inventive concepts will be described in more detail with reference to the accompanying drawings. FIGS. 3A through 13A are plan views illustrating a method of fabricating a semiconductor memory device according to example embodiments of the inventive concepts, and FIGS. 3B through 13B are cross-sectional views taken along lines I-I' and II-II' of FIGS. 3A through 13A, respectively.

Figure 3A:
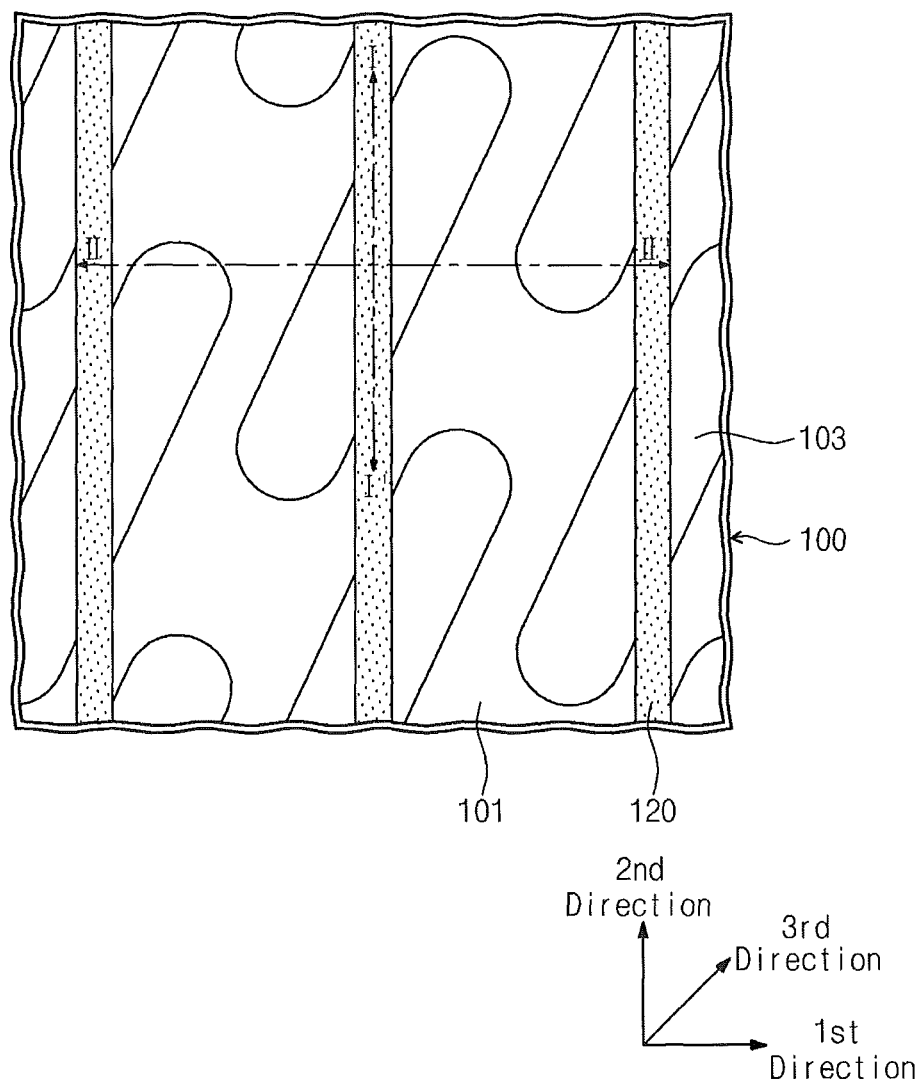
Figure 3B:
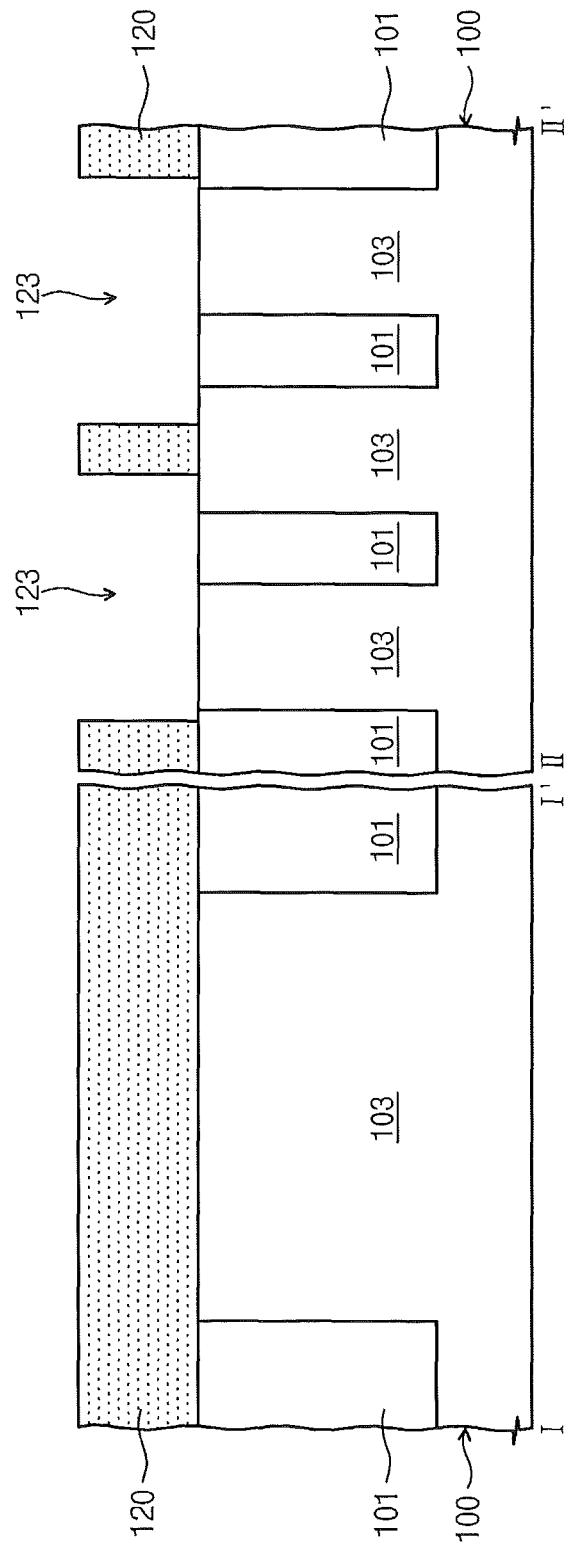

Referring to FIGS. 3A and 3B, a device isolation pattern 101 may be formed in a substrate 100 to define at least one active region 103. The formation of the device isolation pattern 101 may include forming an etch-mask on the substrate 100, etching the substrate 100 using an etch-mask to form trench, and filling the trench with an insulating material to form the device isolation pattern 101. The device isolation pattern 101 may include an insulating material. For instance, the device isolation pattern 101 may include at least one of silicon oxide, silicon nitride or silicon oxynitride. The substrate 100 may include a semiconductor material. For instance, the substrate 100 may include at least one of silicon or germanium.

In some embodiments, the at least one active region 103 may include a plurality of active regions 103 separated from each other by the device isolation pattern 101. The plurality of active regions 103 may be classified into a first group and a second group according to position thereof. The first group of the active regions 103 may be formed in the substrate 100 in such a way that they are two-dimensionally arranged in rows and in columns. For the sake of convenience, a term "first direction" will be used to represent a direction parallel to the rows, and a term "second direction" will be used to represent a direction parallel to the columns or crossing the first direction. The first group of the active regions 103 may be arranged at a first pitch or spacing along the first direction and at a second pitch or spacing along the second direction. The second group of the active regions 103 may be two-dimensionally arranged in rows and in columns, and each of the active regions 103 in the second group may be disposed at a position moved from the corresponding one of the active regions 103 in the first group by half the first pitch along the first direction and by half the second pitch along the second direction.

Guide patterns 120 may be formed on the substrate 100 to cross the active region 103 and the device isolation pattern 101. The guide patterns 120 may extend along the second direction and be parallel to each other. The guide patterns 120 may include at least one of oxide, nitride, or oxynitride materials.

An empty region 123 may be formed between a pair of the guide patterns 120 disposed adjacent each other. In some embodiments, the number of the guide patterns 120 disposed on each of the active regions 103 may be one.

In some embodiments, the formation of the guide pattern 120 may include forming a mask pattern on the substrate, conformally forming a dielectric layer on the substrate, anisotropically etching the dielectric layer to form a guide pattern 120 having a spacer shape on a sidewall of the mask pattern, and then, removing the mask pattern.

Additionally or alternatively, the formation of the guide pattern 120 may include forming a pair of first guide patterns on the substrate, conformally a spacer layer on the substrate, anisotropically etching the spacer layer to form the spacers on the sidewall of the first guide pattern, forming a second guide pattern to fill a gap region between the pair of the first guide patterns, and then removing the spacers. In these embodiments, the first and second guide patterns may serve as the guide patterns 120.

Figure 4A:
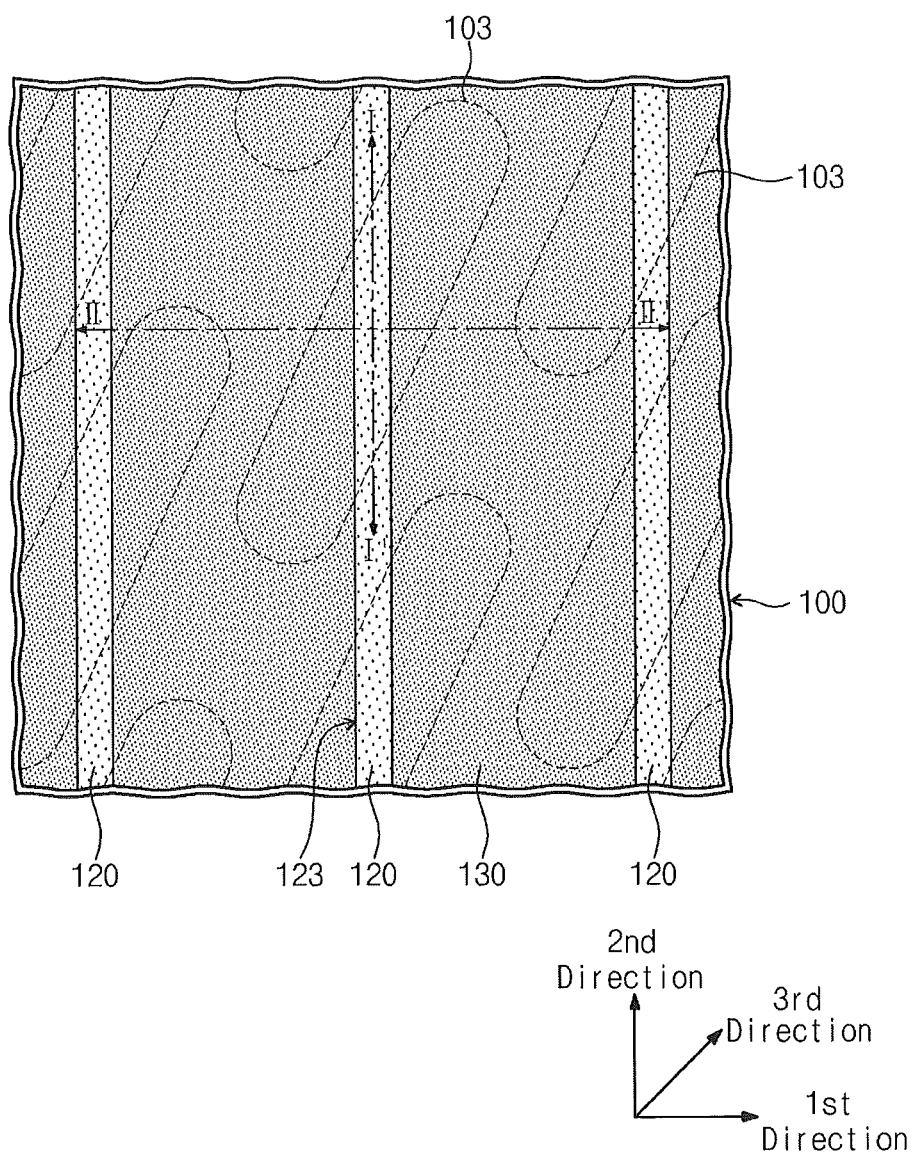
Figure 4B:
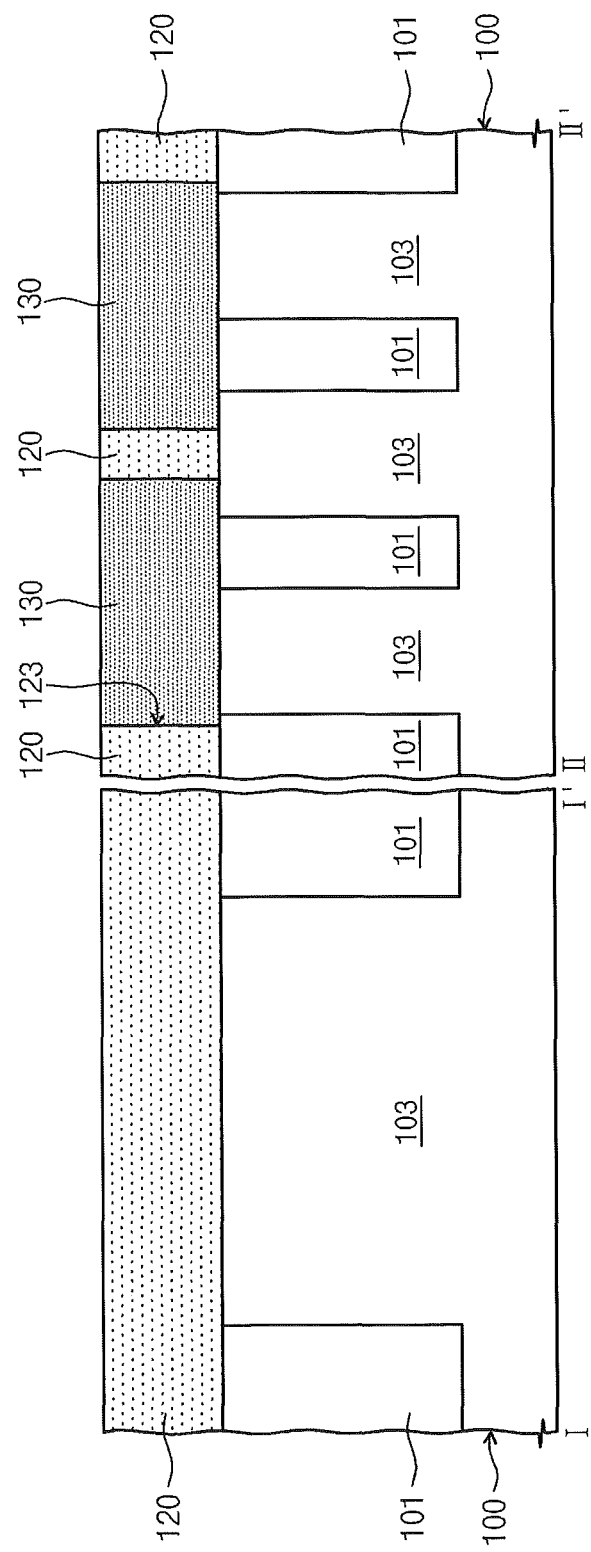

Referring to FIGS. 4A and 4B, a bulk conductive pattern 130 may be formed in the empty regions 123 between the guide patterns 120. The formation of the bulk conductive pattern 130 may include forming a conductive layer on the substrate 100 to fill the empty regions 123, and then, etching the conductive layer to expose a top surface of the guide patterns 120. The conductive layer may be formed using a physical vapor deposition (PVD) process, a chemical vapor deposition (CVD) process, and/or an atomic layer deposition (ALD) process. The etching of the conductive layer may be performed using a dry etching process, a wet etching process, and/or a chemical mechanical polishing (CMP) process. The bulk conductive pattern 130 may include semiconductor materials (e.g., polysilicon), metal-semiconductor compounds (e.g., tungsten silicide), conductive metal nitrides (e.g., titanium nitride, tantalum nitride or tungsten nitride), and/or metals (e.g., titanium, tungsten, or tantalum).

Figure 5A:
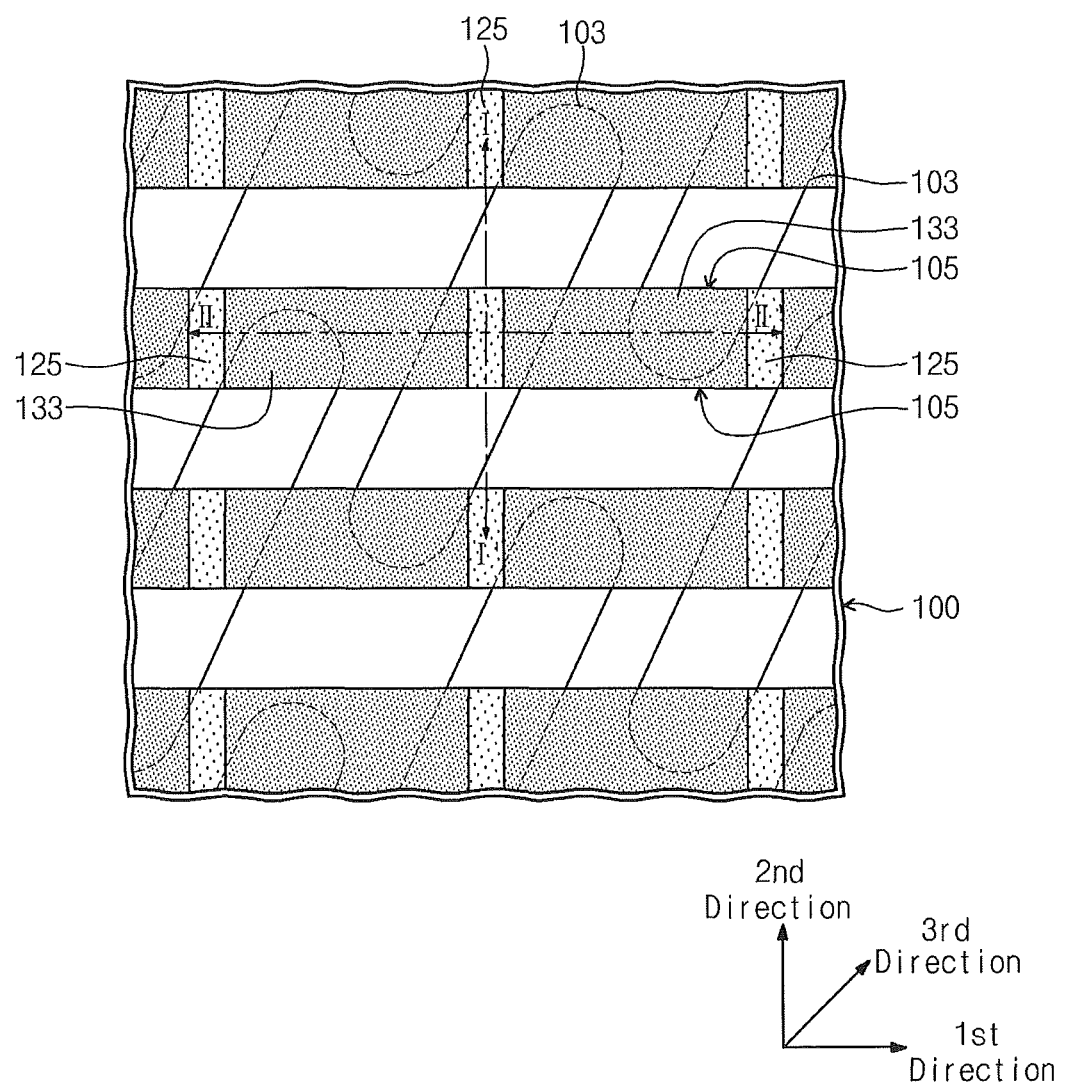
Figure 5B:
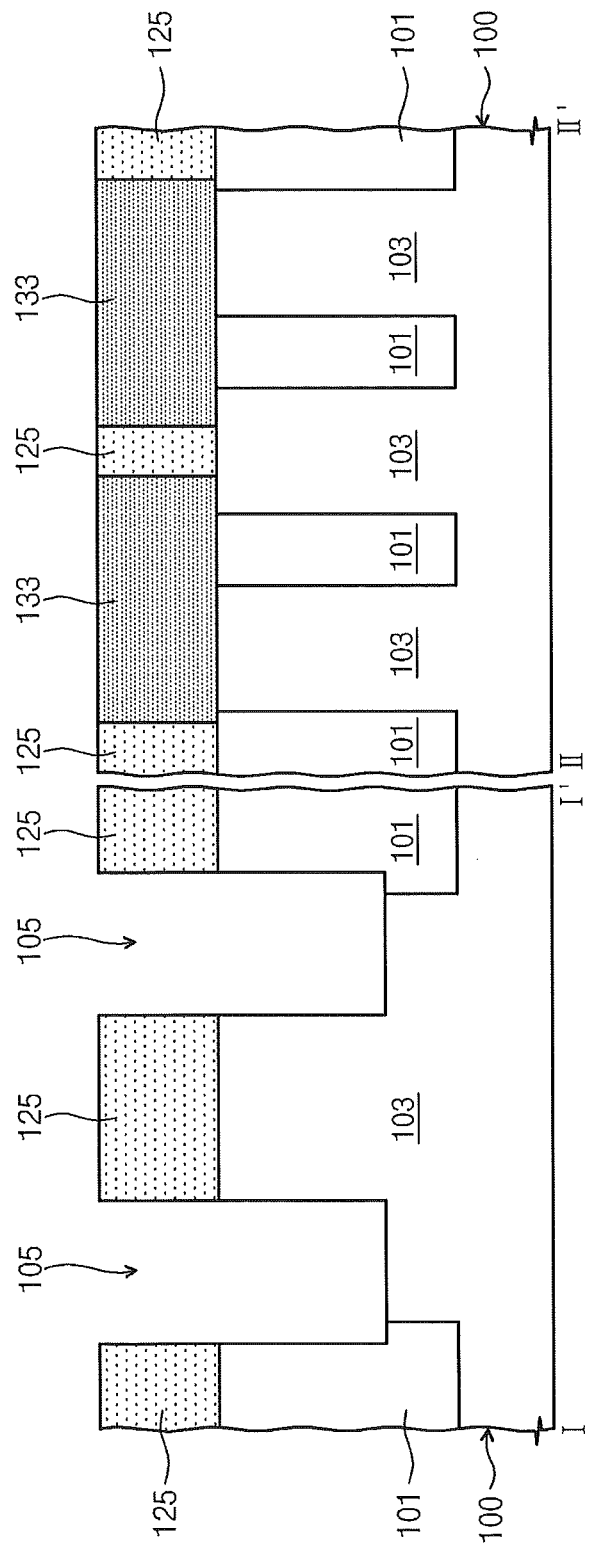

Referring to FIGS. 5A and 5B, a groove 105 may be formed in the substrate 100. The groove 105 may be formed to have a substantially linear shape crossing the active region 103 and the device isolation pattern 101 and extending along the first direction. The formation of the groove 105 may include forming a pair of groove mask patterns on substrate 100, and then etching the guide pattern 120, the bulk conductive pattern 130, the active region 103, and the device isolation pattern 101 using the groove mask patterns as an etch-mask.

As the result of the etching of the guide patterns 120 and the bulk conductive pattern 130, dielectric patterns 125 and landing pads 133 may be formed at both sides of the groove 105. Each of the landing pads 133 may be coupled to at least a portion of the active region 103. The landing pads 133 may be spaced apart from each other by the dielectric patterns 125.

Figure 6A:
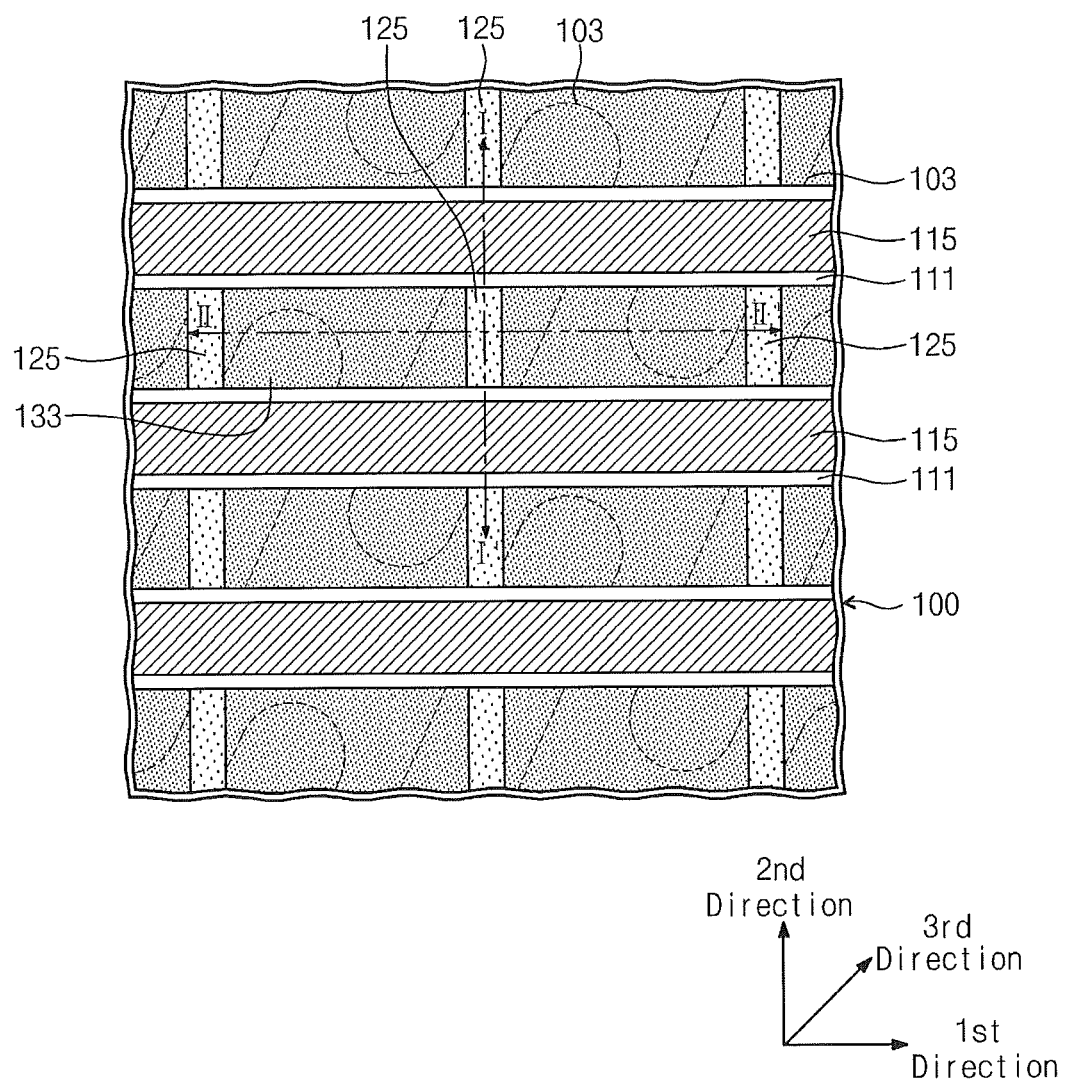
Figure 6B:
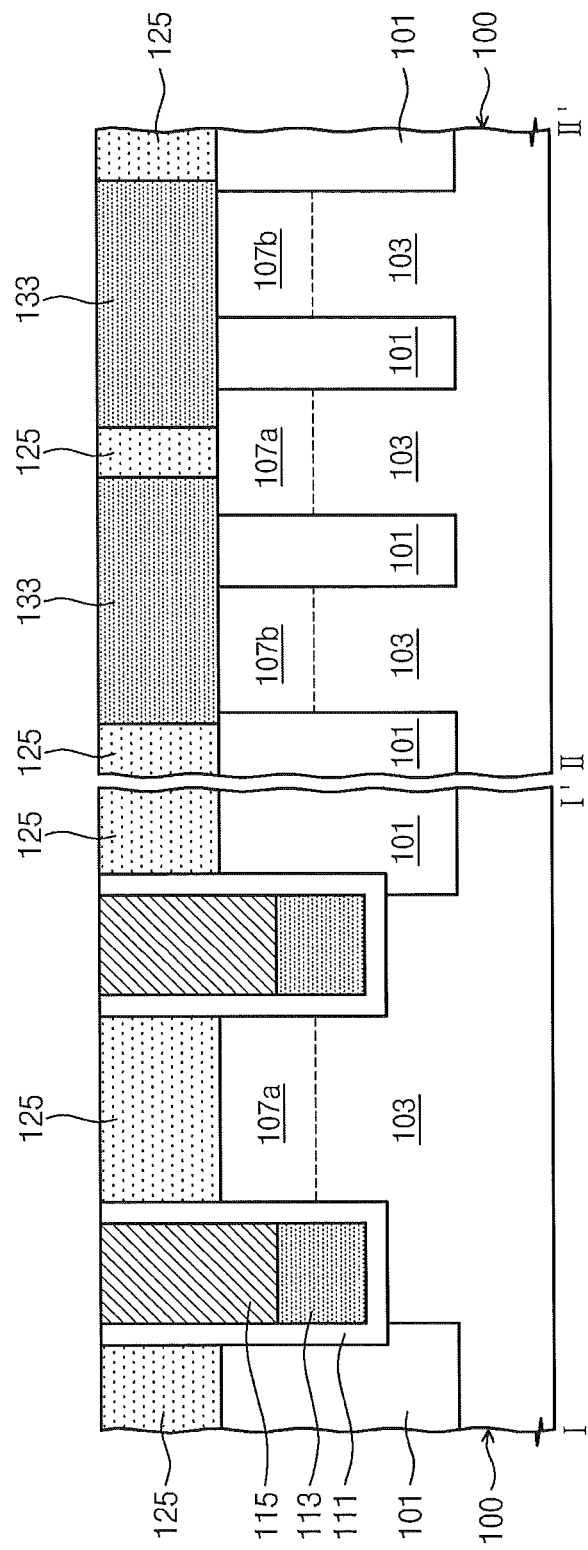

Referring to FIGS. 6A and 6B, a gate dielectric pattern 111, a buried gate electrode 113 and a capping pattern 115 may be formed in each of the grooves 105. The formation of the buried gate electrode 113 may include forming a gate dielectric layer on the substrate 100 to conformally cover an inner surface of the groove 105, forming a gate conductive layer on the substrate 100 to fill the groove 105, and then performing a first etching process to etch the gate conductive layer.

The formation of the gate dielectric pattern 111 and the capping pattern 115 may include forming a capping layer on the substrate 100, and then performing a second etching process including etching the capping layer and the gate dielectric layer to expose a top surface of the landing pad 133.

The gate dielectric layer may be formed using an oxidation process. In some embodiments, the oxidation process may be performed one or more times to form the gate dielectric layer. Additionally or alternatively, the gate dielectric layer may be formed using at least one of CVD or ALD processes.

The gate dielectric layer may include at least one of a high-k material, oxide, nitride, or oxynitride. Here, the high-k material may be an insulating material having a dielectric constant greater than that of silicon nitride. For instance, the high-k material may be at least one of insulating metal oxides, such as hafnium oxide or aluminum oxide.

The gate conductive layer may be formed using at least one of PVD, CVD or ALD processes. The gate conductive layer may include at least one of a polycrystalline semiconductor layer, a conductive metal nitride layer (e.g., of titanium nitride, tantalum nitride, or tungsten nitride), or a metal layer (e.g., of ruthenium, iridium, titanium, tungsten, or tantalum).

The first etching process of etching the gate conductive layer may be performed using at least one of a dry etching process or a CMP process. As the result of the first etching process, the uppermost top surface of the buried gate electrode 113 may be formed at a lower level than a top surface of the substrate 100.

The capping layer may be formed using at least one of PVD or CVD processes. The capping layer may include an insulating material. For instance, the capping layer may include at least one of silicon oxide, silicon nitride, or oxynitride.

The second etching process of etching the capping layer and the gate dielectric may be performed using at least one of a CMP process, a dry etching process, or a wet etching process. As the result of the second etching process, a top surface of the capping pattern 115 may be formed at substantially the same level as top surfaces of the dielectric patterns 125 and the landing pad 133. In addition, the gate dielectric layer may be partially removed from top surfaces of the dielectric patterns 125 and the landing pad 133 during the etching process, thereby forming the gate dielectric pattern 111

A first doped region 107a and a second doped region 107b may be formed in the active region 103. The first doped region 107a may be formed in a portion of the active region 103 adjacent one side of the buried gate electrode 113, and the second doped region 107b may be formed in another portion of the active region 103 adjacent the other side of the buried gate electrode 113. In some embodiments, the first and second doped regions 107a and 107b may be formed by an implantation process injecting dopants into the active region 103 through the landing pad 133.

The first and second doped regions 107a and 107b may be formed to have lower boundaries or bottom surfaces downward spaced apart from the top surface of the active region 103 at a specific depth. The lower boundaries or bottom surfaces of the first and second doped regions 107a and 107b may be formed above or at a higher level than the bottom surface of the buried gate electrode 113. In some embodiments, the lower boundaries of the first and second doped regions 107a and/or 107b may be below or at a lower level than the upper surface of the buried gate electrode 113.

In some embodiments, the first doped region 107a and a pair of the second doped regions 107b may be formed in the active region 103. In this case, the first doped region 107a may be formed between the pair of the buried gate electrodes 113 formed in the pair of the grooves 105. Furthermore, the pair of the second doped regions 107b may be formed in such a way that the pair of the buried gate electrodes 113 and the first doped region 107a are arranged between the pair of the second doped regions 107b.

Additionally or alternatively, the implantation process for forming the first and second doped regions 107a and 107b may be performed before forming the guide pattern 120. For instance, a bulk doped region may be formed in the active region 103, and then, the groove 105 may be formed in the substrate 100 to cross the active region 103 and the device isolation pattern 101. The bulk doped region may be formed using an ion implantation process injecting dopants into the active region 103, after forming the device isolation pattern 101. A bottom surface of the groove 105 may be formed at a lower level than a bottom surface or lower boundary of the bulk doped region, and thus, the bulk doped region may be separated into the first and second doped regions 107a and 107b.

Figure 7A:
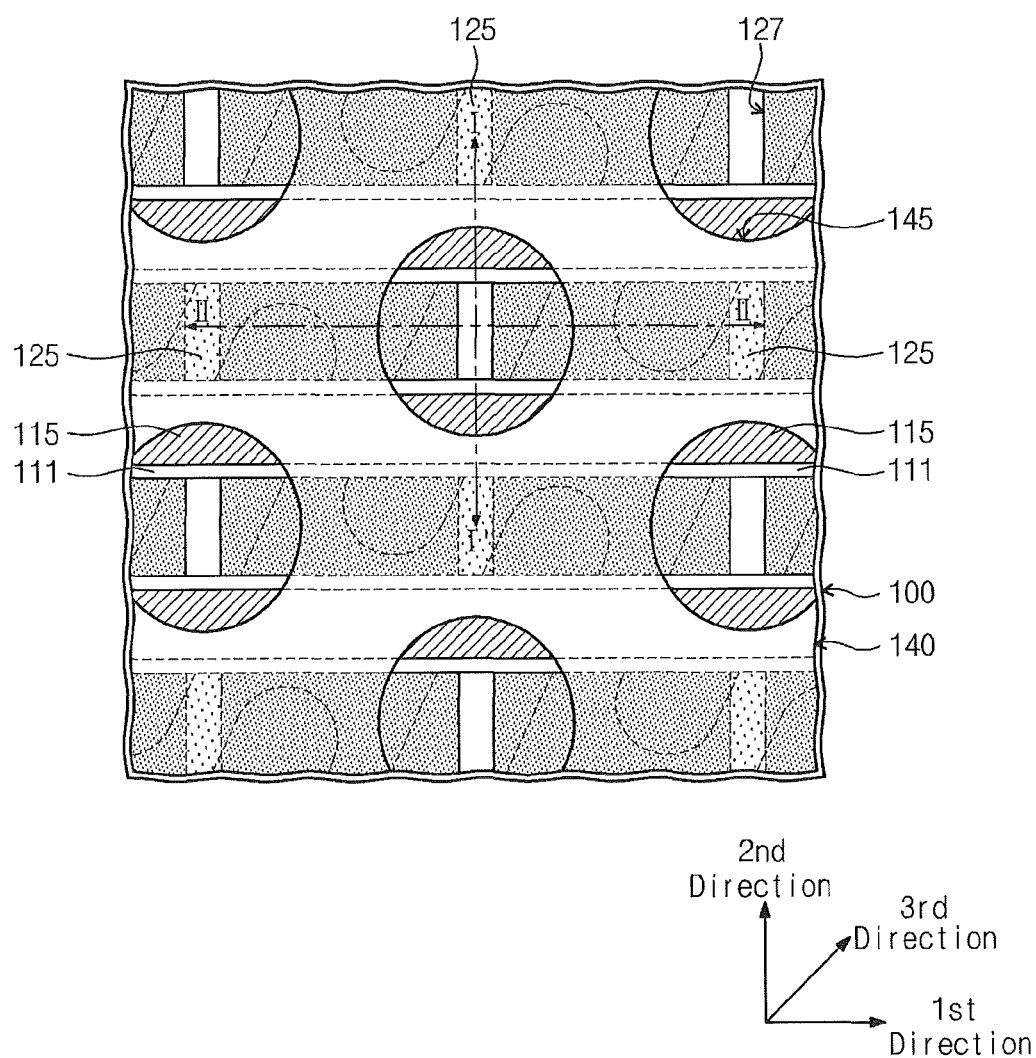

Referring to FIGS. 7A and 7B, a first interlayer dielectric 140 may be formed on the substrate 100. The first interlayer dielectric 140 may be formed to have a single-layered or multi-layered structure. The first interlayer dielectric 140 may be formed using at least one of PVD, CVD or ALD processes. The first interlayer dielectric 140 may include at least one of silicon oxide, silicon nitride, or oxynitride.

The first interlayer dielectric 140 may be patterned to form a first hole 145 exposing a portion of the landing pad 133 through the first interlayer dielectric 140. In some embodiments, the first hole 145 may be formed by performing at least one etching process.

In a plan view, the first hole 145 may be formed in such a way that it is overlapped with at least a portion of the first doped region 107a of the active region 103. In some embodiments, the dielectric pattern 125 on the first doped region 107a of the active region 103 may be exposed during the formation of the first hole 145. The exposed dielectric pattern 125 may be removed to form a first opening 127 exposing a portion of the first doped region 107a. The first opening 127 may be formed between a pair of landing pads 133 that are disposed adjacent each other along the first direction. In other words, the first opening 127 may be a region confined by sidewalls of the pair of the landing pads 133 and sidewalls of the pair of the capping patterns 115.

In some embodiments, the first hole 145 and the first opening 127 may be formed by an etching process performed in the same and single reaction chamber.

In some embodiments, the first hole 145 may be formed to have a second directional width greater than that of the first doped region 107a. For instance, the first hole 145 may be formed to expose a portion of the pair of the capping patterns 115 disposed at both sides of the first doped region 107a.

Figure 8A:
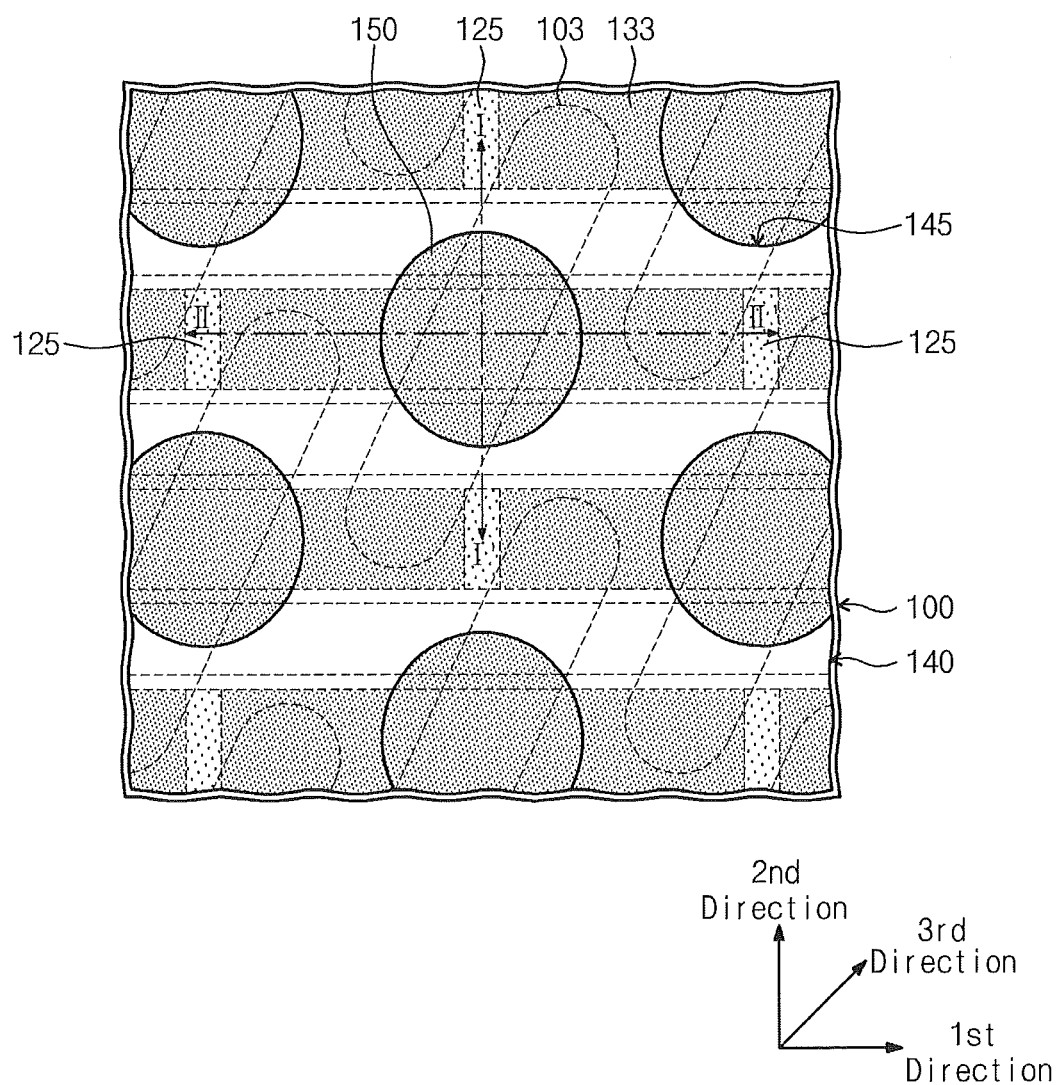
Figure 8B:
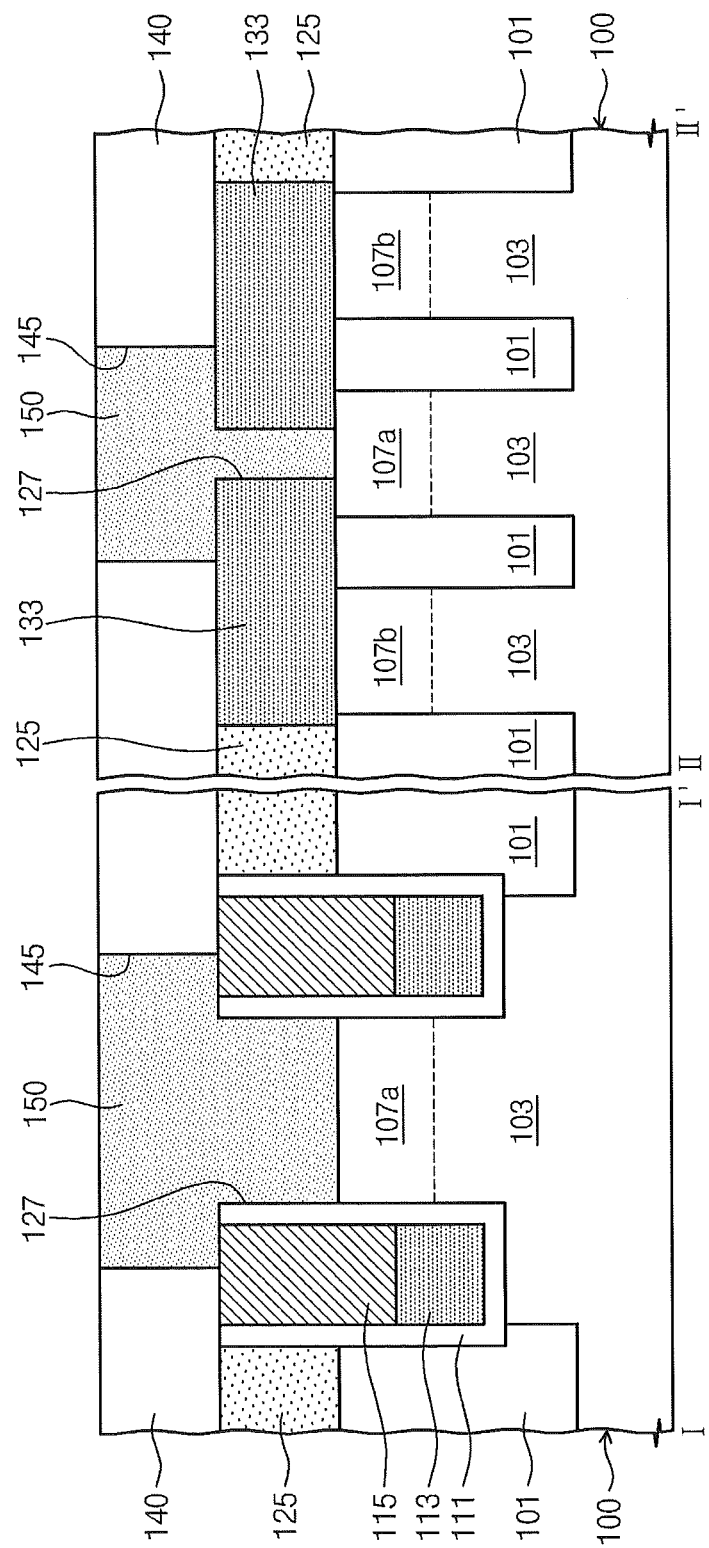

Referring to FIGS. 8A and 8B, a conductive gap-filling pattern 150 may be formed in the first hole 145 and the first opening 127. The conductive gap-filling pattern 150 may be in direct contact with sidewalls of the pair of the landing pads 133 exposed by the first opening 127. Accordingly, the pair of the landing pads 133 and the conductive gap-filling pattern 150 may be electrically connected to each other.

The formation of the conductive gap-filling pattern 150 may include forming a conductive gap-filling layer on the first interlayer dielectric 140 to fill the first opening 127 and the first hole 145, and then etching the conductive gap-filling layer to expose a top surface of the first interlayer dielectric 140. The conductive gap-filling layer may be formed using at least one of PVD, CVD or ALD processes. The etching of the conductive gap-filling layer may be performed using at least one of a CMP process or a dry etching process.

The conductive gap-filling pattern 150 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum). In some embodiments, the conductive gap-filling pattern 150 may be formed of the same conductive material as the landing pad 133. For instance, in the case where the landing pad 133 includes a polycrystalline semiconductor layer, the conductive gap-filling pattern 150 may also include the same polycrystalline semiconductor layer.

Figure 9A:
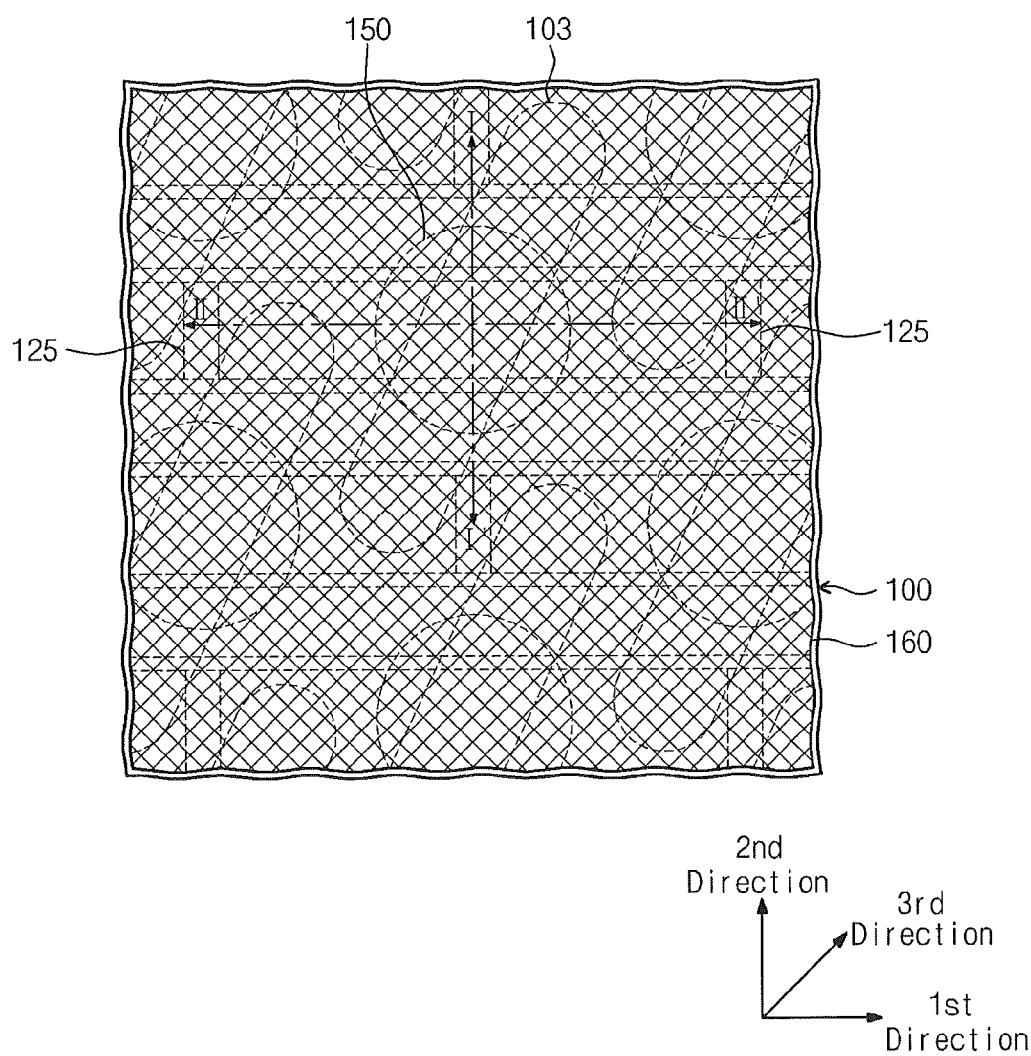
Figure 9B:
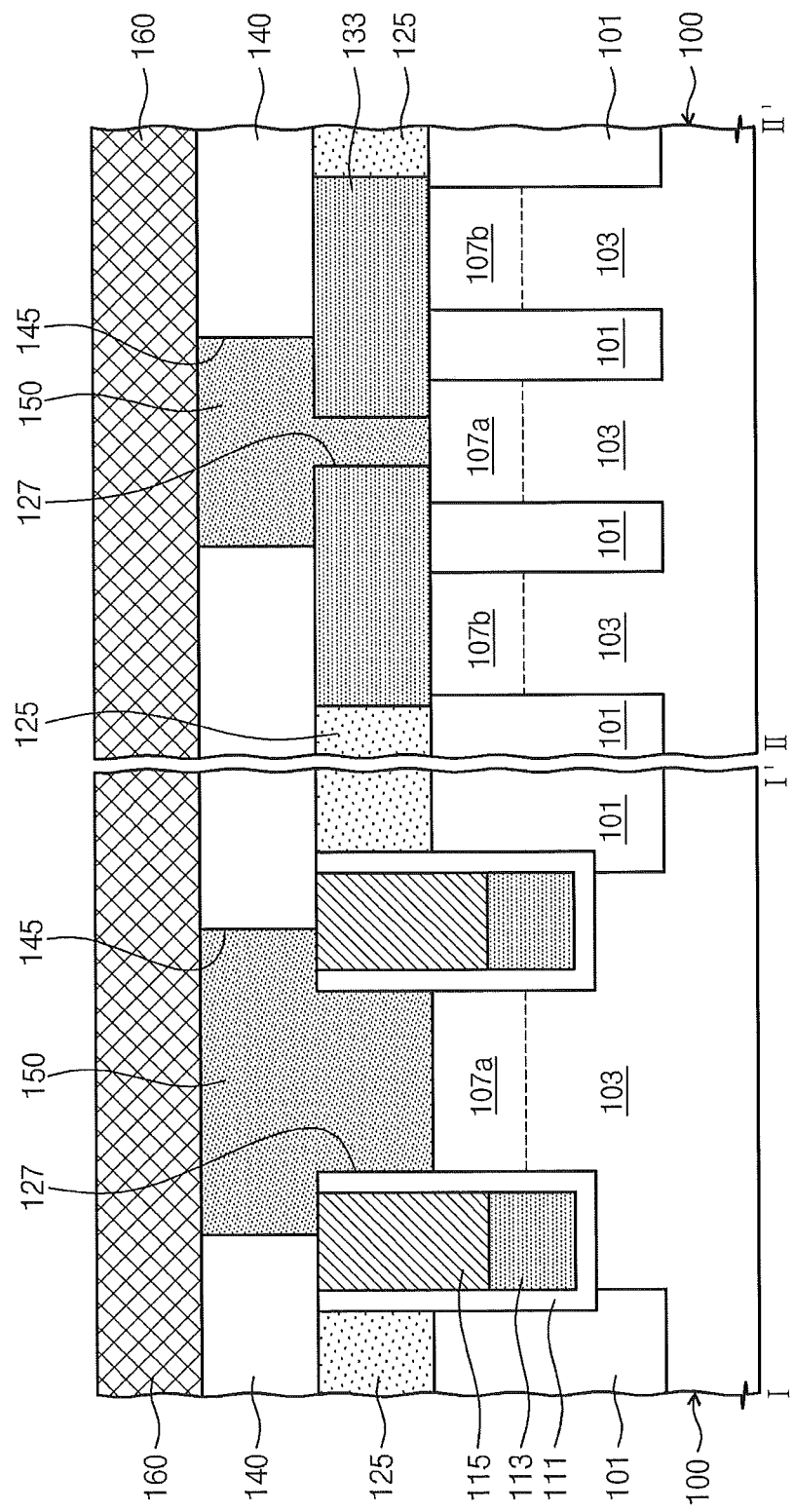

Referring to FIGS. 9A and 9B, a conductive interconnection layer 160 may be formed on the first interlayer dielectric 140. The conductive interconnection layer 160 may be formed using at least one of PVD, CVD or ALD processes. The conductive interconnection layer 160 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum).

Figure 10A:
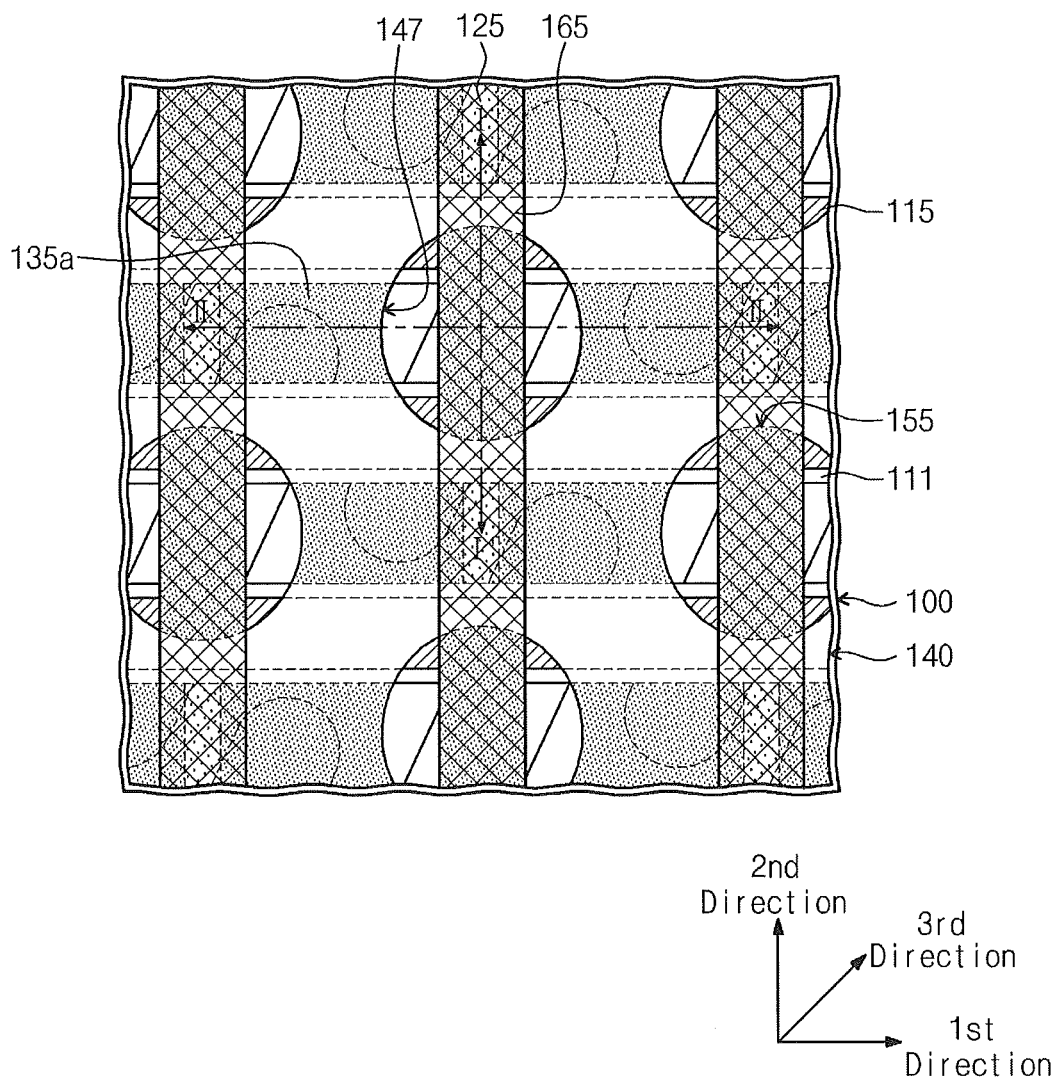
Figure 10B:
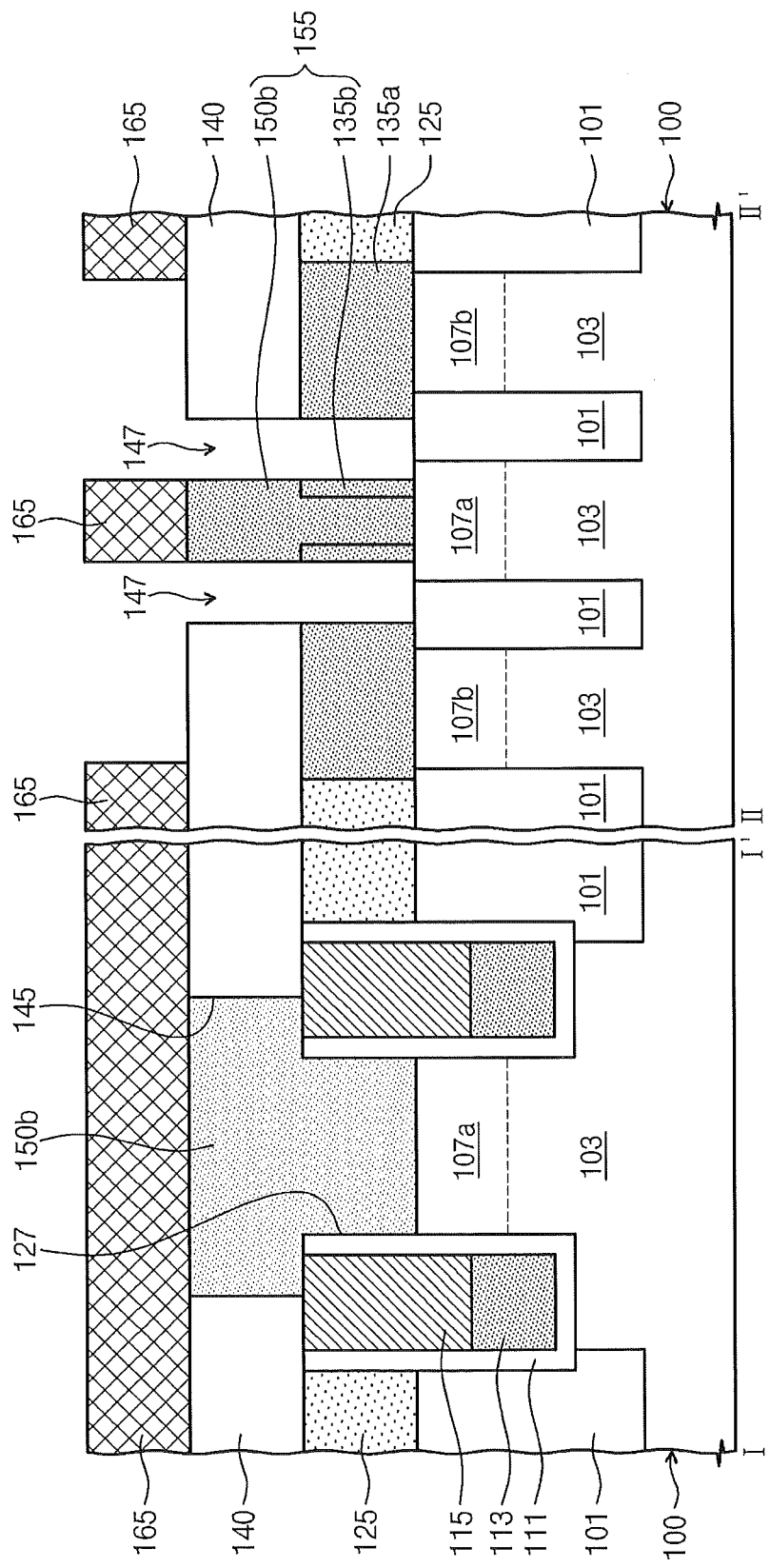

Referring to FIGS. 10A and 10B, the conductive interconnection layer 160, the conductive gap-filling pattern 150, and the landing pad 133 may be sequentially patterned to form an interconnection line 165 and an interconnection plug 155.

The formation of the interconnection line 165 may include forming a mask pattern on the conductive interconnection layer 160, and then etching the conductive interconnection layer 160 using the mask pattern as an etch-mask. The interconnection plug 155 may be formed by the etching process using the mask pattern for forming the interconnection line 165 as an etch-mask. The interconnection plug 155 may include a first conductive pattern 150b, which may be formed by etching a portion of the conductive gap-filling pattern 150 exposed at both sides of the interconnection line 165.

The landing pad 133 may be etched using the mask pattern as an etch-mask. For instance, a portion of the landing pad 133 exposed by the first conductive pattern 150b may be removed, and as a result, an etched landing pad 135a may remain under the first interlayer dielectric 140. The etched landing pad 135a may be spaced apart from the first conductive pattern 150b of the interconnection plug 155. As the result of the etching of the landing pad 133, a second conductive pattern 135b, serving as a part of the interconnection plug 155, may be formed. The second conductive pattern 135b of the interconnection plug 155 may be coupled to the first conductive pattern 150b of the interconnection plug 155. In some embodiments, the etching of the conductive interconnection layer 160, the etching of the conductive gap-filling pattern 150, and the etching of the landing pad 133 may be performed in the same and single reaction chamber.

As the result of the etching process for forming the interconnection plug 155 and the etched landing pad 135a, a second opening 147 may be formed between the etched landing pad 135a and the interconnection plug 155. In some embodiments, the second opening 147 may be formed to partially expose the active region 103 and the device isolation pattern 101.

The interconnection line 165 may be formed to have a linear shape extending along the second direction. The interconnection line 165 may be electrically coupled to the interconnection plug 155. The interconnection plug 155 may be electrically coupled to the first doped region 107a of the active region 103.

Figure 11A:
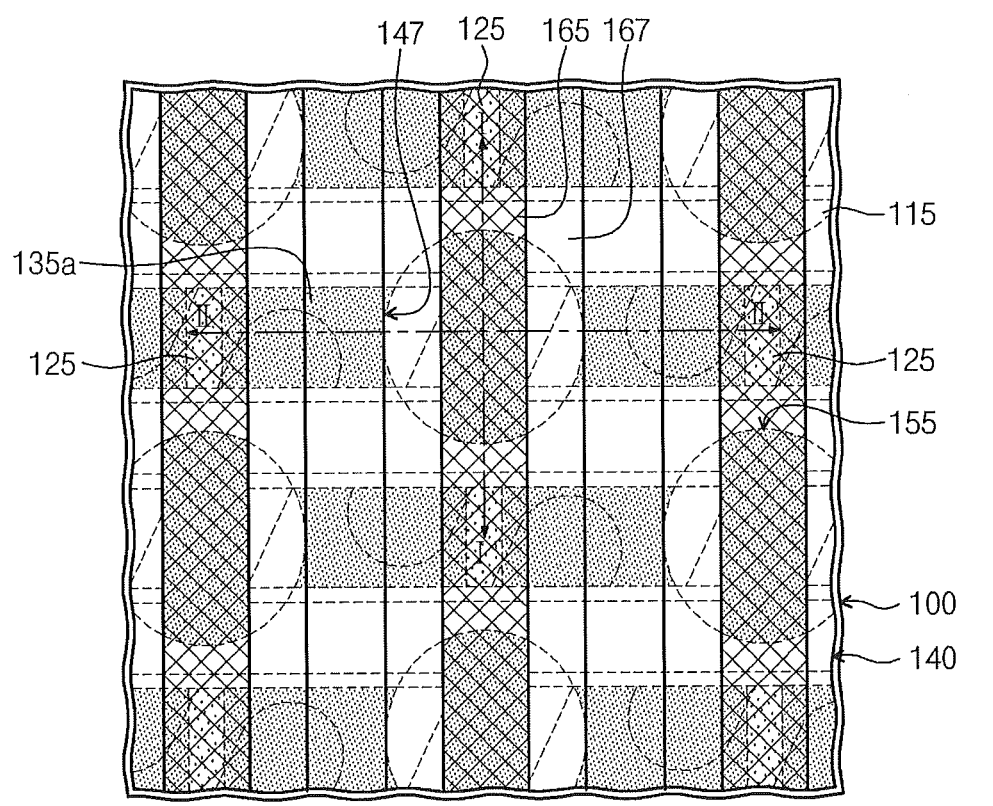
Figure 11A:
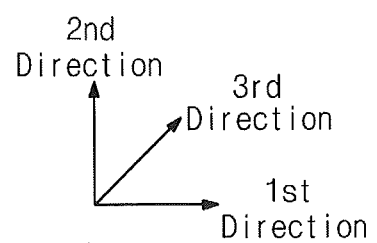
Figure 11B:
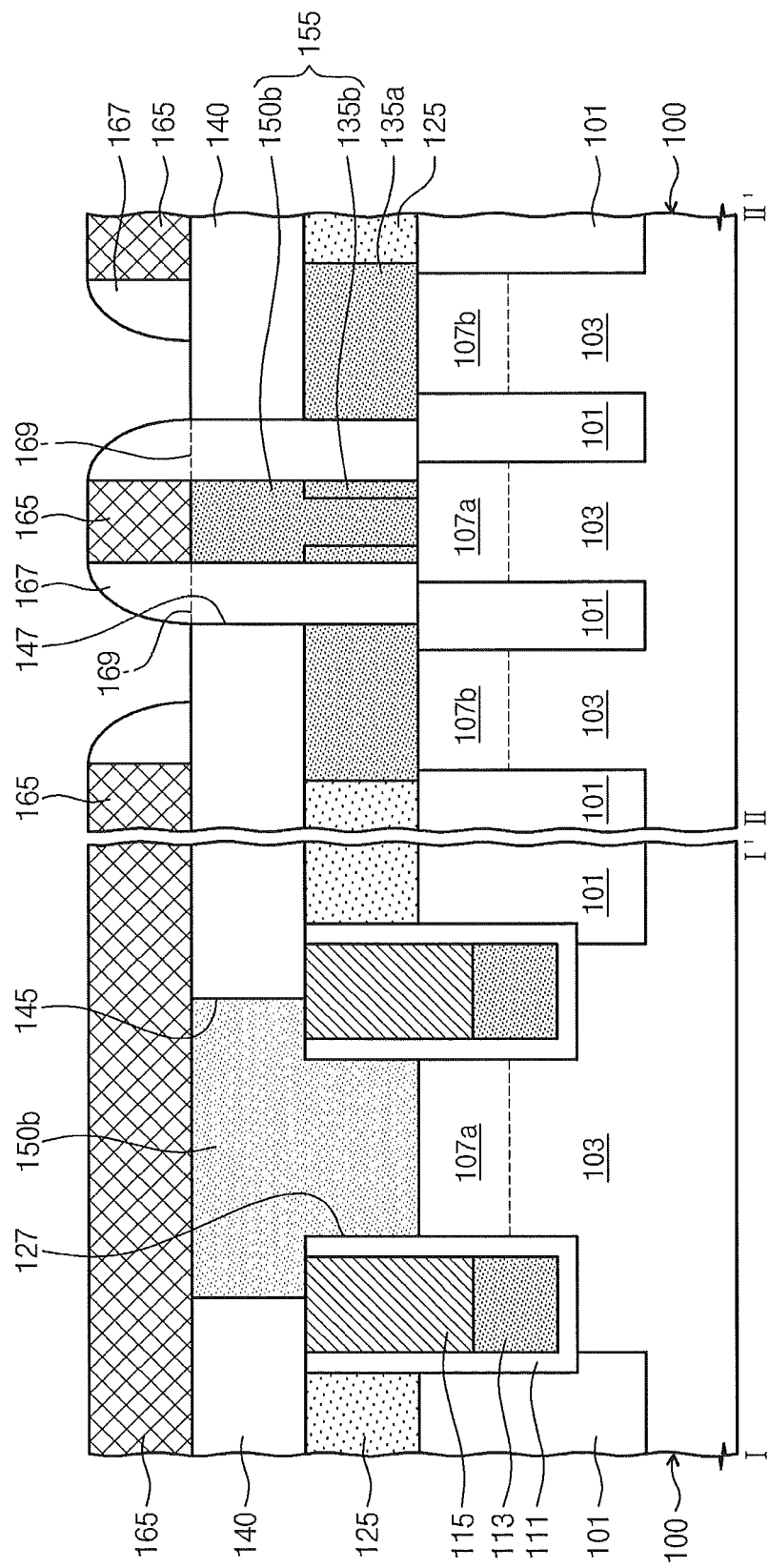

Referring to FIGS. 11A and 11B, a sidewall spacer 167 may be formed on a sidewall of the interconnection line 165. The sidewall spacer 167 may include an extended portion 169 filling the second opening 147. The extended portion 169 may be formed to cover the sidewall of the interconnection plug 155. The extended portion 169 may be formed between the interconnection plug 155 and the etched landing pad 135a.

The formation of the sidewall spacer 167 may include forming a sidewall spacer dielectric on the first interlayer dielectric 140 to fill the second opening 147 and then anisotropically etching the sidewall spacer layer to expose a top surface of the first interlayer dielectric 140. The sidewall spacer layer may be formed using at least one of PVD, CVD or ALD processes. The sidewall spacer layer may include at least one of oxide, nitride, or oxynitride.

Figure 12A:
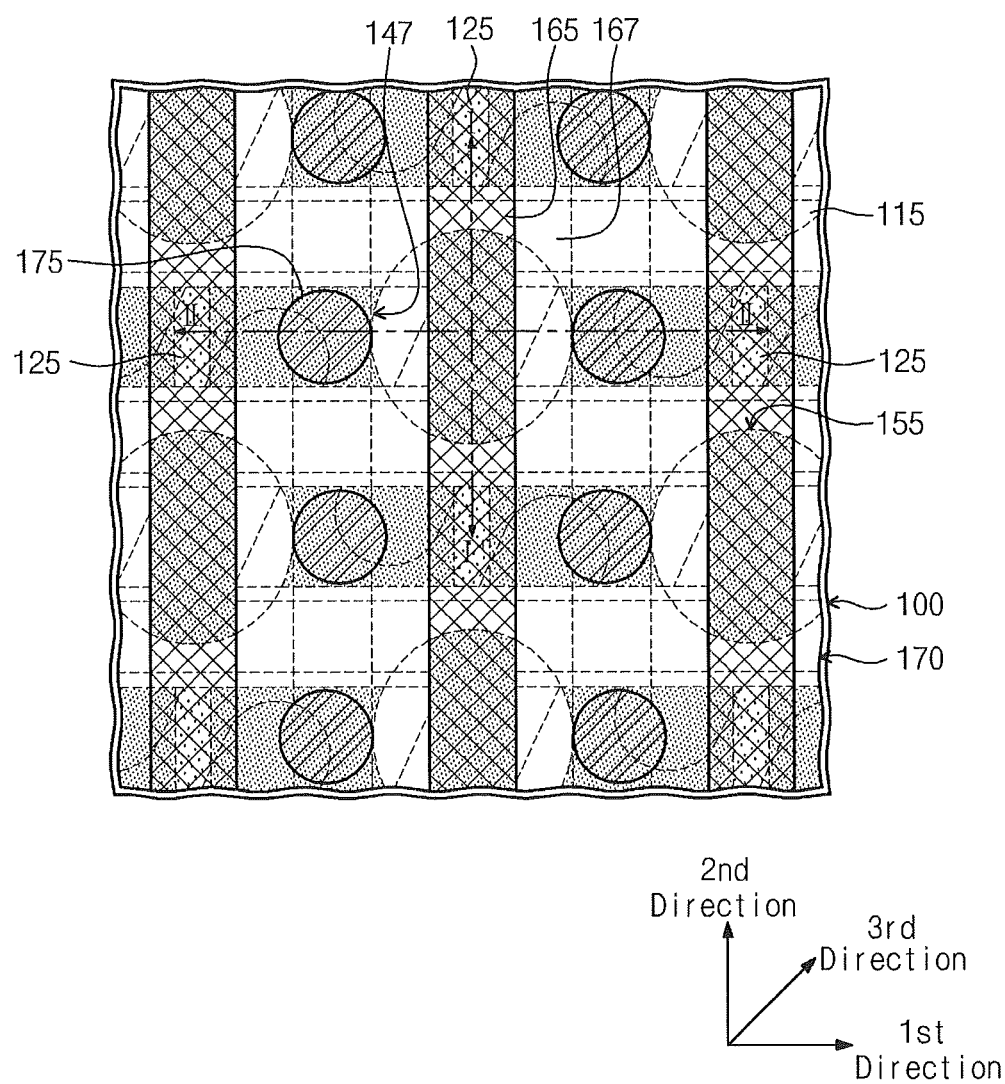
Figure 12B:
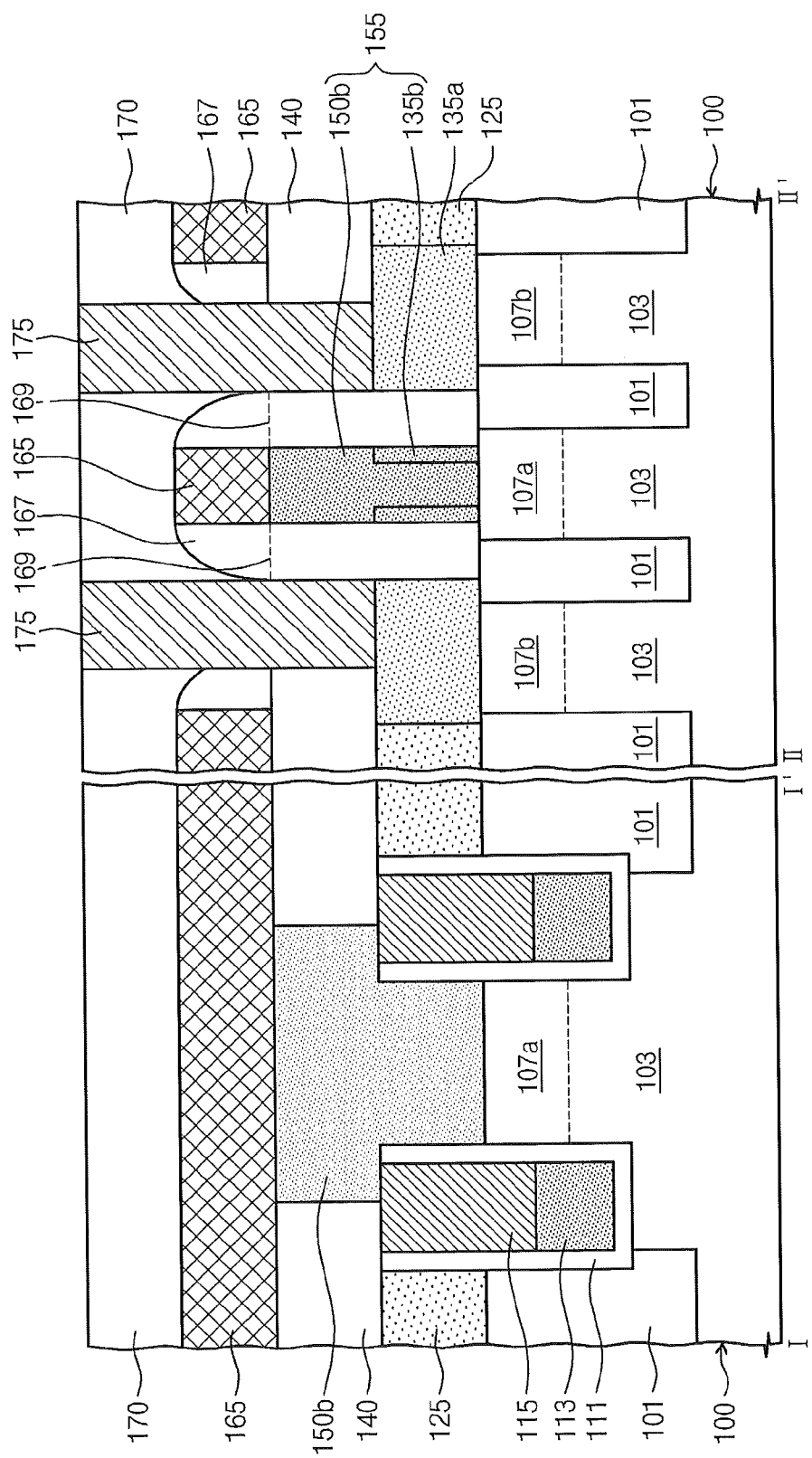

Referring to FIGS. 12A and 12B, a second interlayer dielectric 170 may be formed on the first interlayer dielectric 140 to cover the interconnection line 165. The second interlayer dielectric 170 may be formed using at least one of PVD, CVD or ALD processes. The second interlayer dielectric 170 may include at least one of oxide, nitride or oxynitride materials.

A storage plug 175 may be formed on the etched landing pad 135a to penetrate the first interlayer dielectric 140 and the second interlayer dielectric 170. The formation of the storage plug 175 may include consecutively etching the second and first interlayer dielectrics 170 and 140 to form a second hole exposing a top surface of the etched landing pad 135a, and then filing the second hole with a conductive material. The storage plug 175 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum). The storage plug 175 may be electrically connected to the etched landing pad 135a. In some embodiments, the storage plug 175 may be in direct contact with the etched landing pad 135a.

In some embodiments, the storage plug 175 may be formed on the etched landing pad 135a provided on the substrate 100. An overlap area between the etched landing pad 135a and the second doped region 107b may be greater than an overlap area between the storage plug 175 and the second doped region 1071) in plan view. This configuration enables improved reliability of a semiconductor memory device. In greater detail, a contact area between the second doped region 107b and the storage plug 175 may be reduced, in the case where the etched landing pad 135a is absent, as compared with the case where the etched landing pad 135a is present. This reduction in contact area may result in deterioration in the reliability of the semiconductor memory device. In this sense, in the case where the etched landing pad 135a is provided as in the above-described embodiments of the inventive concepts, it is possible to overcome the contact area reduction (occurring in the case where the etched landing pad 135a is absent) and therefore to improve the reliability of a semiconductor memory device.

Furthermore, since the storage plug 175 is formed on the etched landing pad 135a, it is possible to prevent or reduce the likelihood of the storage plug 175 from being in direct contact with the active region 103. Otherwise (e.g., without the landing pad 135a), the storage plug 175 may be in direct contact with the second doped region 107b of the active region 103, and in this case, the device isolation pattern 101 may be excessively etched during a subsequent etching process, (for instance, the etching of the first interlayer dielectric 140 to form the second hole for disposing the storage plug 175) which may result in product failures. However, according to the above-described embodiments of the inventive concepts, since the storage plug 175 is provided on the etched landing pad 135a, it is possible to reduce or prevent failures associated with an excessive etching of the device isolation pattern 101.

According to further example embodiments of the inventive concepts, the semiconductor memory device may include an interconnection line configured to have a different shape from that of the aforementioned embodiments. Hereinafter, a method of fabricating a semiconductor memory device according to further example embodiments of the inventive concepts will be described in more detail with reference to cross-sectional views shown in FIGS. 13A through 13D.

Figure 13A:
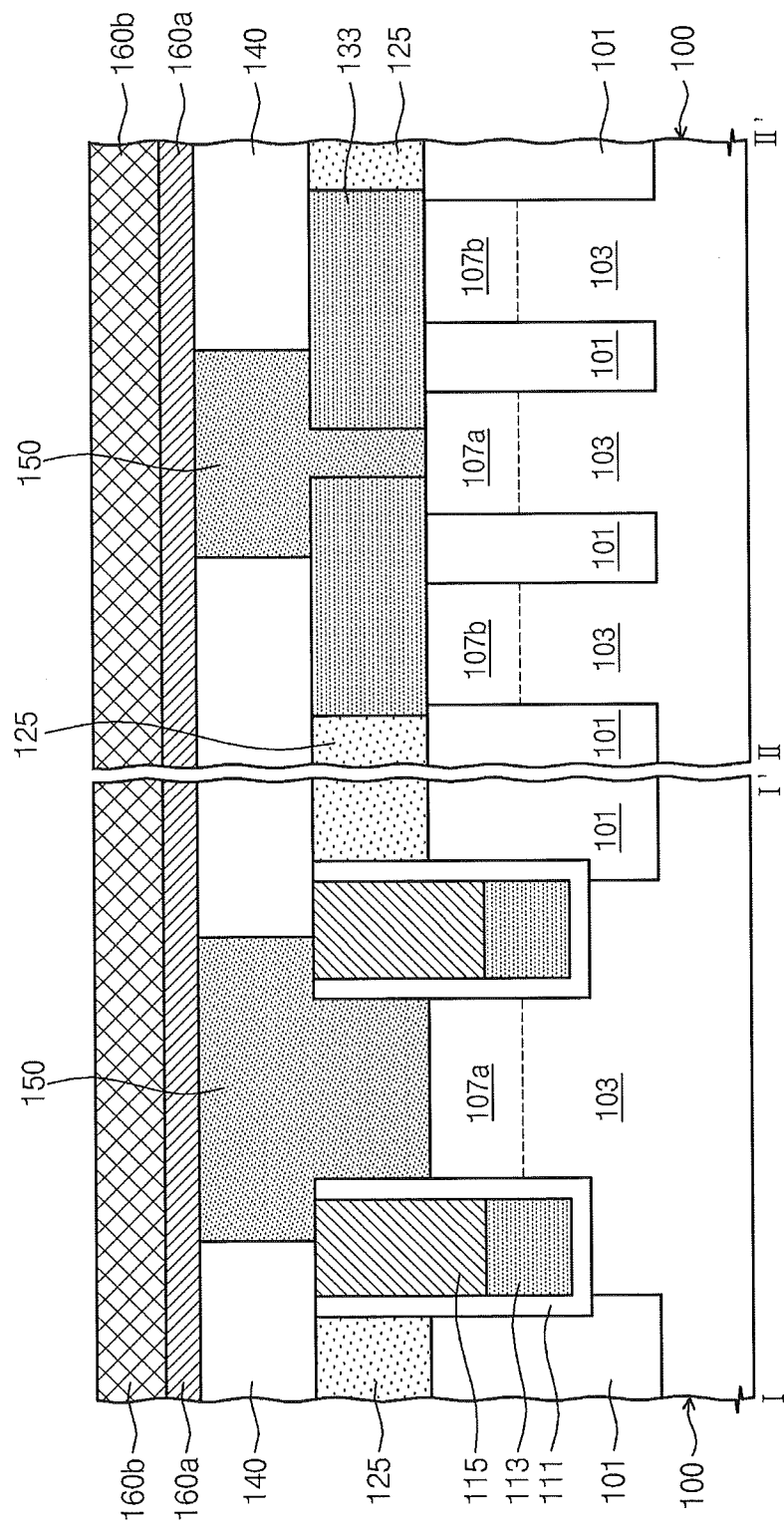
FIGS. 13A through 13D are cross-sectional views illustrating methods of fabricating a semiconductor memory device according to further example embodiments of the inventive concepts.

Referring to FIG. 13A, a first conductive interconnection layer 160a and a second conductive interconnection layer 160b may be formed on the first interlayer dielectric 140. The first and second conductive interconnection layers 160a and 160b may be formed using at least one of PVD, CVD, or ALD processes. The first and second conductive interconnection layers 160a and 160b may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum).

The first conductive interconnection layer 160a may be formed of the same conductive material as the conductive gap-filling pattern 150. For instance, the conductive gap-filling pattern 150 and the first conductive interconnection layer 160a may be formed of a polycrystalline semiconductor layer.

The second conductive interconnection layer 160b may include a conductive material having higher conductivity than that of the first conductive interconnection layer 160a. For instance, in the case where the first conductive interconnection layer 160a includes a polycrystalline semiconductor layer, the second conductive interconnection layer 160b may include a metal layer (e.g., of tungsten).

Figure 13B:
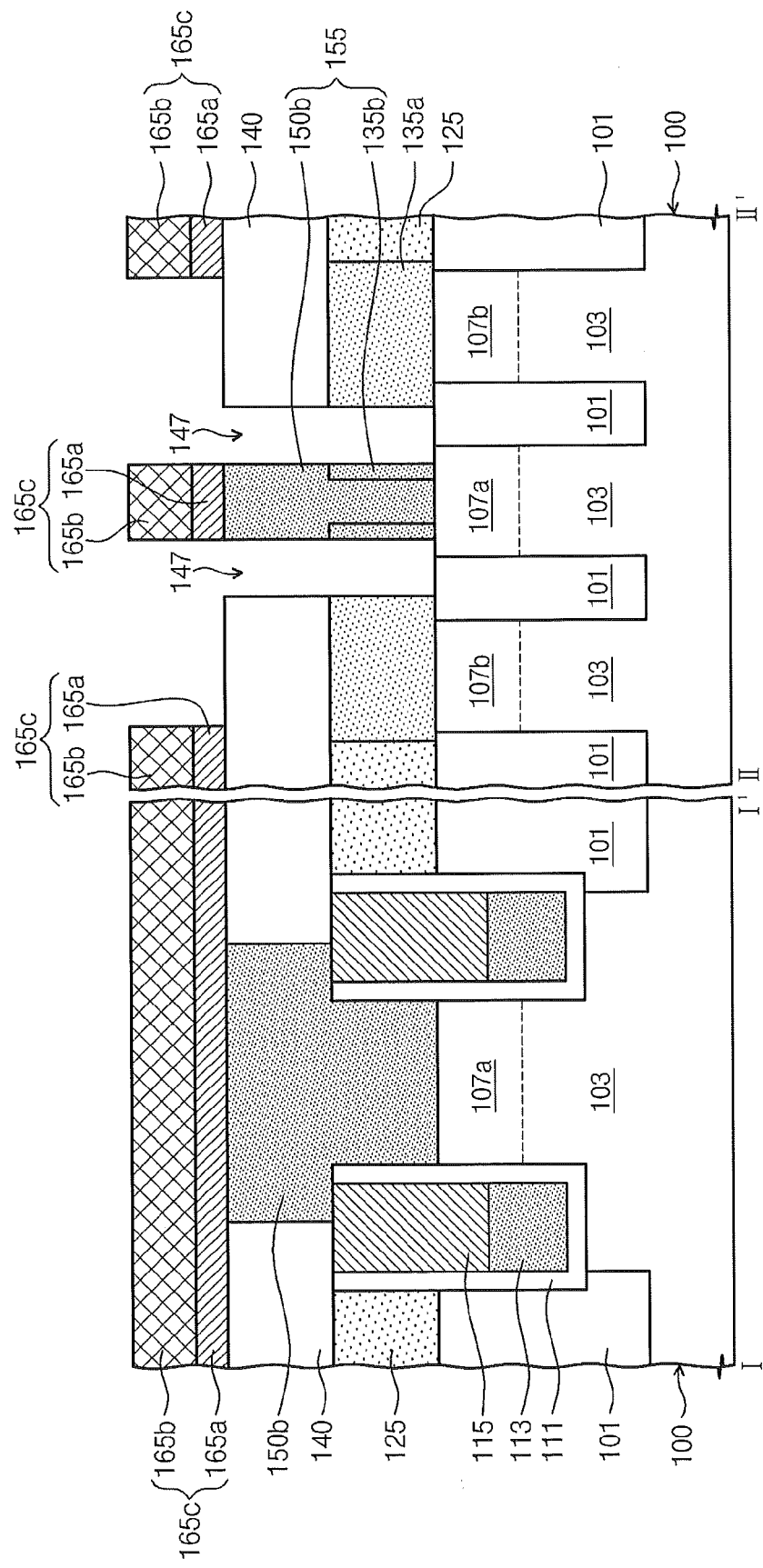

Referring to FIG. 13B, the first and second conductive interconnection layers 160a and 160b, the conductive gap-filling pattern 150, and the landing pad 133 may be sequentially patterned to form the interconnection line 165c and the interconnection plug 155. As the result of the patterning process, the landing pad 133 may be etched to be spaced apart from the interconnection plug 155.

The interconnection line 165c may include a first pattern 165a and a second pattern 165b that are the resultant structures obtained from the patterning of the first and second conductive interconnection layers 160a and 160b, respectively. In some embodiments, the first pattern 165a may be formed to be in direct contact with the first portion 150a of the interconnection plug 155.

The interconnection plug 155 may be formed by the etching process using the mask pattern for forming the interconnection line 165c as an etch-mask. The interconnection plug 155 may include the first conductive pattern 150b, which may be formed by etching a portion of the conductive gap-filling pattern 150 exposed at both sides of the interconnection line 165c.

The landing pad 133 may be etched using the mask pattern as an etch-mask. For instance, a portion of the landing pad 133 exposed by the first conductive pattern 150b may be removed, and as a result, an etched landing pad 135a may remain under the first interlayer dielectric 140. The etched landing pad 135a may be spaced apart from the first conductive pattern 150b of the interconnection plug 155. As the result of the etching of the landing pad 133, a second conductive pattern 135b, serving as a part of the interconnection plug 155, may be formed. The second conductive pattern 135b of the interconnection plug 155 may be coupled to the first conductive pattern 150b of the interconnection plug 155.

According to the embodiments of FIGS. 13A-13D, the interconnection line 165c may include the first pattern 165a including the same conductive material as the interconnection plug 155 and the second pattern 165b including a conductive material having higher conductivity than the first pattern 165a. In this case, since the interconnection plug 155 and the first pattern 165a include the same conductive material, it is possible to reduce contact resistance between the interconnection plug 155 and the interconnection line 165c. In addition, since the second pattern 165b includes a conductive material having higher conductivity than the first pattern 165a, it is possible to reduce resistance of the interconnection line 165c. As a result, it is possible to realize a semiconductor memory device having improved electrical characteristics and improved reliability.

Figure 13C:
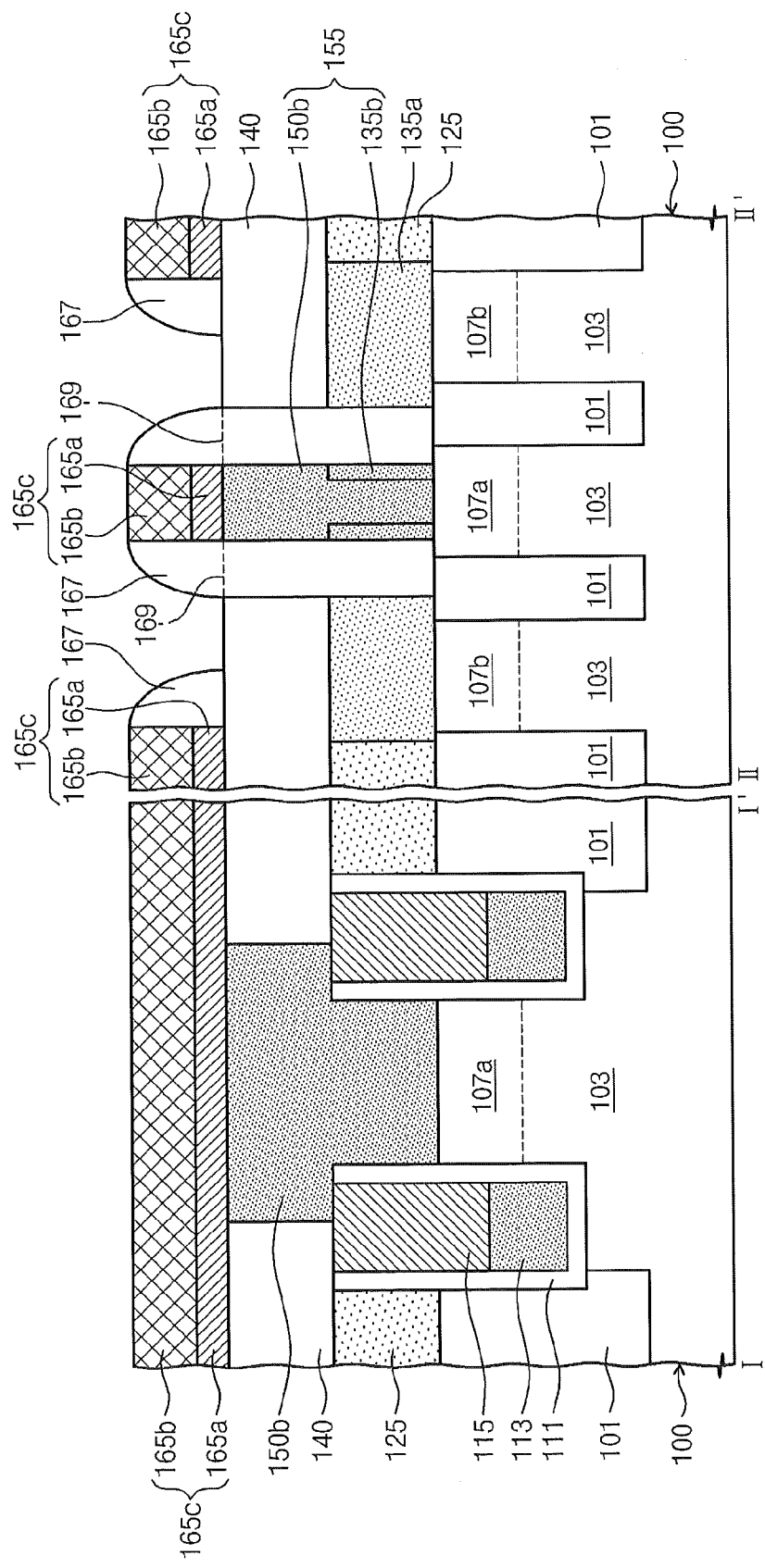

Referring to FIG. 13C, a sidewall spacer 167 may be formed on a sidewall of the interconnection line 165c. The sidewall spacer 167 may include an extended portion 169 filling the second opening 147. The extended portion 169 may be formed to cover the sidewall of the interconnection plug 155. The sidewall spacer 167 may be formed using the same or similar fabrication methods as that of the embodiments described above with reference to FIGS. 11A and 11B.

Figure 13D:
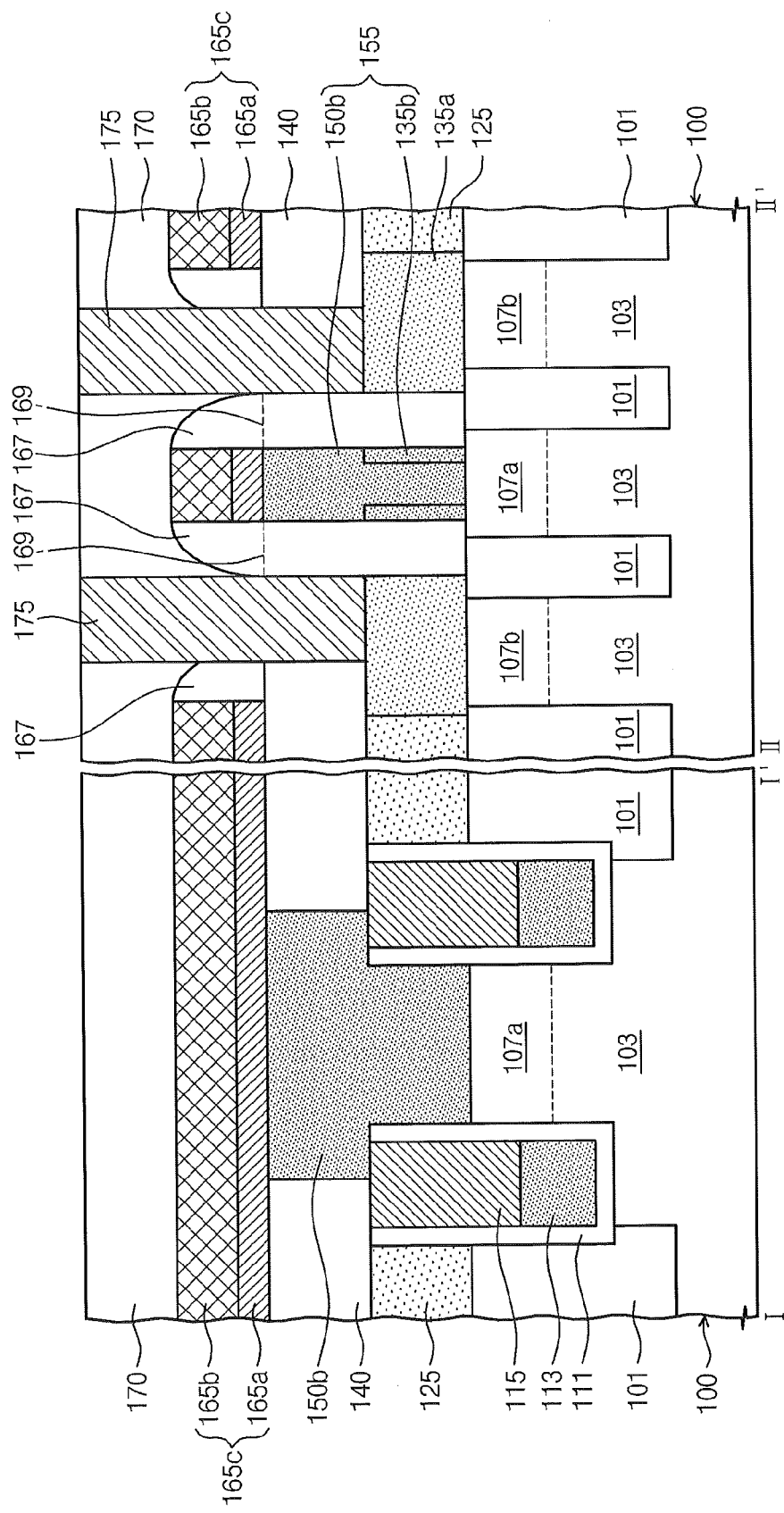

Referring to FIG. 13D, a second interlayer dielectric 170 may be formed on the first interlayer dielectric 140 to cover the interconnection line 165c. A storage plug 175 may be formed on the etched landing pad 135a to extend through or penetrate the first interlayer dielectric 140 and the second interlayer dielectric 170. The second interlayer dielectric 170 and the storage plug 175 may be formed using the same or similar fabrication methods as that of the embodiments described above with reference to FIGS. 12A and 12B.

Figure 14A:
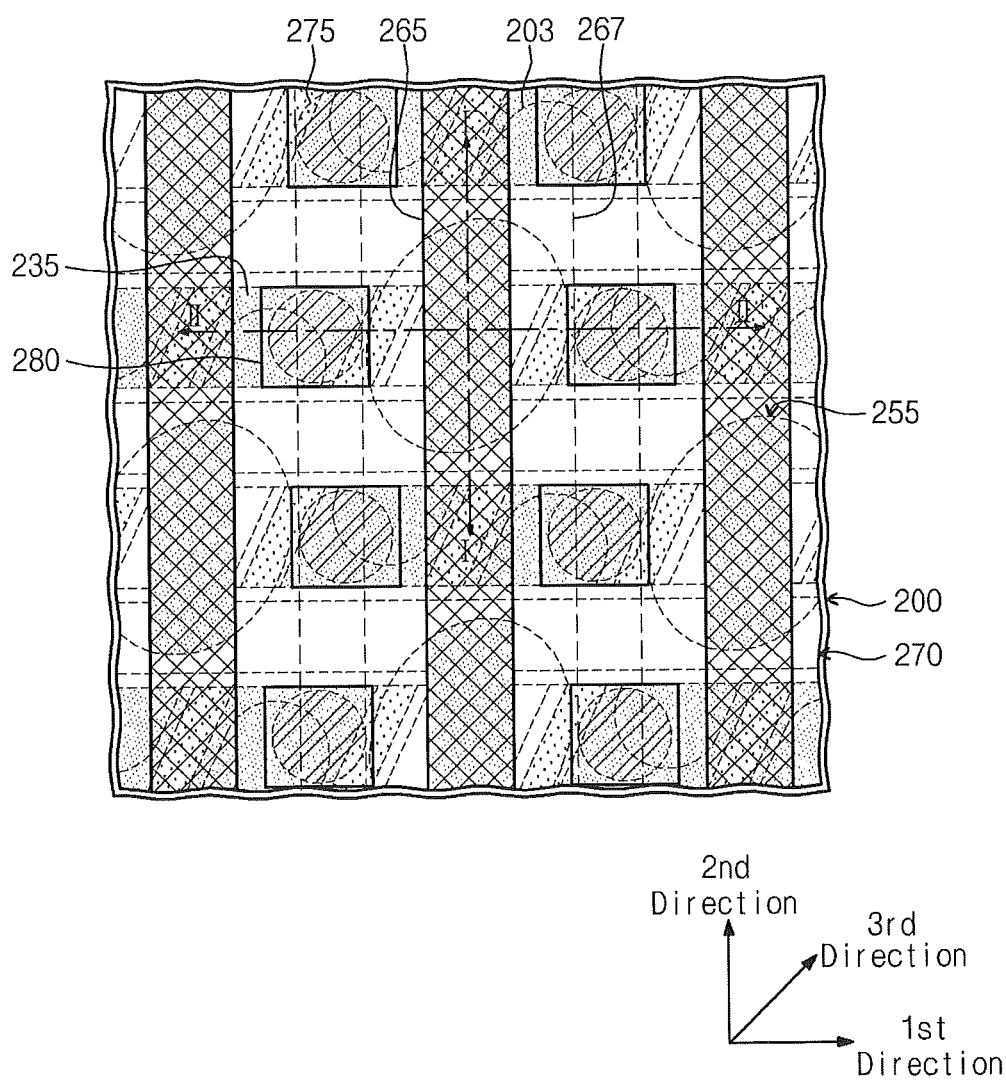
FIG. 14A is a plan view of a semiconductor memory device according to further example embodiments of the inventive concepts.

Hereinafter, a semiconductor memory device according to other example embodiments of the inventive concepts will be described in more detail with reference to the accompanying drawings. FIG. 14A is a plan view of a semiconductor memory device according to example embodiments of the inventive concepts, and FIG. 14B is a cross-sectional view taken along lines I-I' and II-II' of FIG. 14A.

Figure 14B:
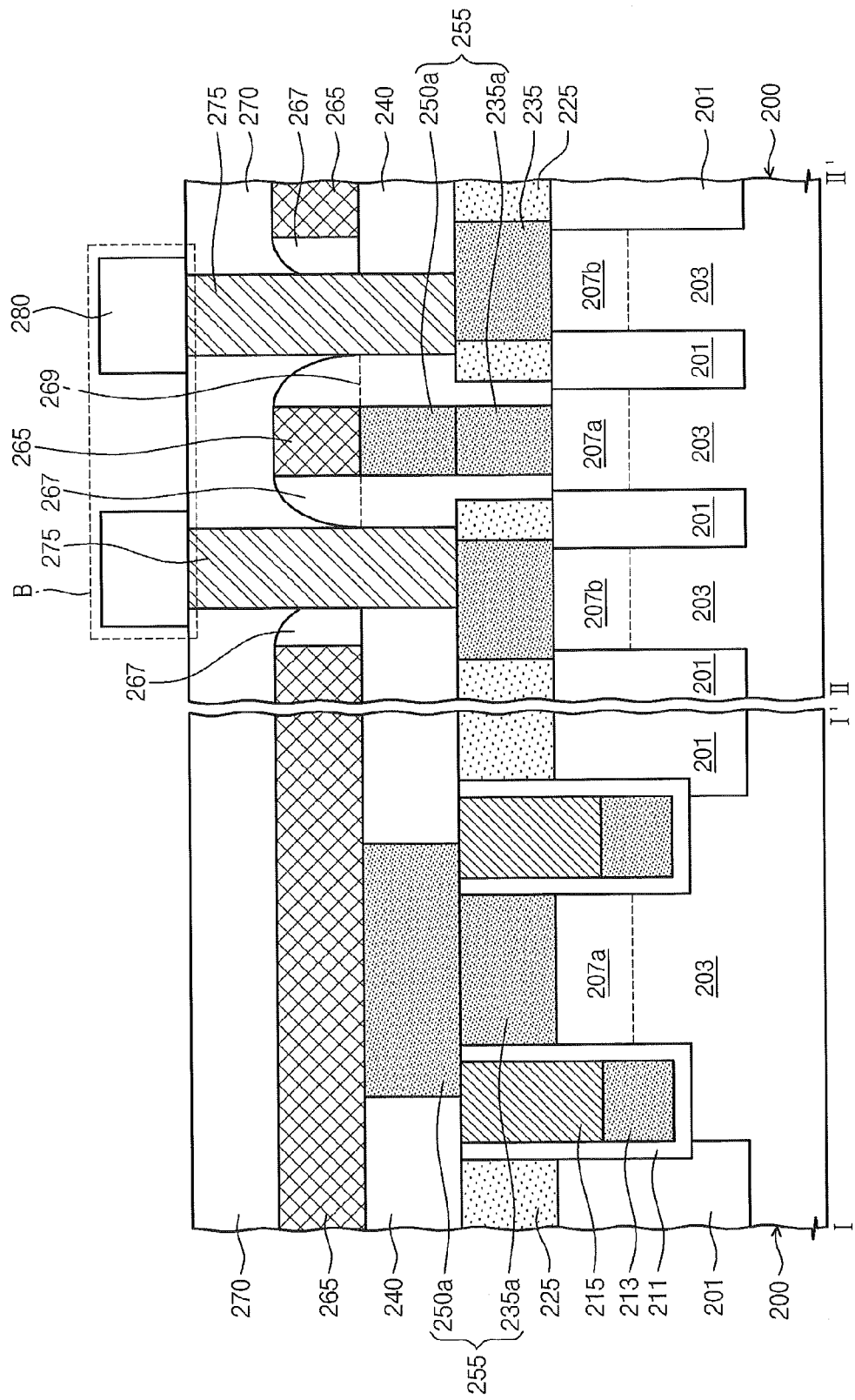
FIG. 14B is a cross-sectional view taken along lines I-I' and II-II' of FIG. 14A.

Referring to FIGS. 14A and 14B, a device isolation pattern 201 may be provided in a substrate 200 to define at least one active region 203. The device isolation pattern 201 may be formed to have a shallow-trench isolation (STI) structure, but example embodiments of the inventive concepts may not be limited thereto, The device isolation pattern 201 may include an insulating material. For instance, the device isolation pattern 201 may include at least one of silicon oxide, silicon nitride, or silicon oxynitride material. The substrate 200 may include a semiconductor material. For instance, the substrate 200 may include at least one of silicon or germanium.

In some embodiments, the at least one active region 203 may include a plurality of active regions 203 provided in the substrate 200. The active regions 203 may be classified into a first group and a second group according to position thereof. The first group of the active regions 203 may be two-dimensionally arranged in rows and in columns. For the sake of convenience, a term "first direction" will be used to represent a direction parallel to the rows, and a term "second direction" will be used to represent a direction parallel to the columns or crossing the first direction. The first group of the active regions 203 may be arranged at a first pitch along the first direction and at a second pitch along the second direction. The second group of the active regions 203 may be two-dimensionally arranged in rows and in columns, and each of the active regions 203 in the second group may be disposed at a position moved from the corresponding one of the active regions 203 in the first group by half the first pitch along the first direction and by half the second pitch along the second direction.

Each of the active regions 203 may have a rectangular shape extending along a third direction, where the third direction may be non-parallel to and non-perpendicular to both of the first and second directions.

A groove 205 may be provided in the substrate 200. In a plan view, the groove 205 may have substantially linear shape that extends along the first direction to cross the active region 203 and the device isolation pattern 201.

A buried gate electrode 213 may be provided in the groove 205. The buried gate electrode 213 may be the same as or similar to the buried gate electrode 113 of the above-described embodiments, in terms of material and/or shape.

A gate dielectric pattern 211 may be provided between the buried gate electrode 213 and the groove 205. A capping pattern 215 may be provided on the buried gate electrode 213. The gate dielectric pattern 211 may be the same as or similar to the gate dielectric pattern 111 of the afore-described embodiments in terms of material and/or shape. In addition, the capping pattern 215 may be the same as or similar to the capping pattern 115 of the afore-described embodiments in terms of material and/or shape. In some embodiments, the gate dielectric pattern 211, the buried gate electrode 213, and the capping pattern 215 may constitute or define a buried gate pattern.

A first doped region 207a and a second doped region 207b may be provided in portions of the active region 203 laterally adjacent the buried gate electrode 213. Bottom surfaces or lower boundaries of the first and second doped regions 207a and 207b may be formed at positions downward spaced apart from the top surface of the active region 203, while the bottom surfaces/lower boundaries of the first and second doped regions 207a and 207b may be above (or positioned at a higher level than) the bottom surface of the groove 205 and/or below (or positioned at a lower level than) an upper surface of the buried gate electrode 213.

In some embodiments, a plurality of the grooves 205 may cross the active region 203. For instance, a pair of the grooves 205 may be provide to cross the active region 203, while a pair of the buried gate electrodes 213 may be provided in the pair of the grooves 205, respectively. In this case, the first doped region 207a and a pair of the second doped regions 207b may be provided in the active region 203. The pair of the buried gate electrodes 213 and the first doped region 207a may be provided between the pair of the second doped regions 207b, and the first doped region 207a may be provided between the pair of the buried gate electrodes 213.

A landing pad 235 may be provided on the substrate 200. The landing pad 235 may be electrically connected to the second doped region 207b. In some embodiments, the landing pad 235 may be directly disposed on the second doped region 207b. In addition, the landing pad 235 may be electrically isolated and/or spaced apart from the first doped region 207a. In some embodiments, at least a portion of the landing pad 235 may be in direct contact with the second doped region 207b.

Dielectric patterns 225 may be provided on the substrate 200 at both sides of the landing pad 235. In other words, the landing pad 235 may be provided between the pair of the dielectric patterns 225. Thus, the landing pad 235 and the pair of the dielectric patterns 225 may be arranged parallel to the first direction.

The dielectric pattern 225 may have a shape extending along the third direction. In other words, the dielectric pattern 225 may have a shape extending substantially parallel to the active region 103. The dielectric patterns 225 may include at least one of oxide, nitride or oxynitride.

In some embodiments, the uppermost top surface of the landing pad 235 may be positioned at substantially the same level as (e.g., coplanar with) the uppermost top surface of the capping pattern 215. The landing pad 235 may include a conductive material. For instance, the landing pad 235 may include at least one of a doped semiconductor layer or a metal layer (e.g., of titanium, tungsten, or tantalum).

The landing pad 235 may include a pair of first sidewalls extending substantially parallel to the first direction and a pair of second sidewalls extending substantially parallel to the third direction. In some embodiments, the second sidewalls may be substantially parallel to the active region 203. The second sidewalls may be in direct contact with the pair of the dielectric patterns 225.

A first interlayer dielectric 240 may be provided on the substrate 200 to cover the capping pattern 215 and the landing pad 235. The first interlayer dielectric 240 may include at least one of silicon oxide, silicon nitride, or silicon oxynitride.

An interconnection plug 255 may be provided on the substrate 200. The interconnection plug 255 may penetrate or extend through the first interlayer dielectric 240 to be connected to the first doped region 207a. The interconnection plug 255 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum).

In some embodiments, the interconnection plug 255 may include a first portion 250a and a second portion 235a. In some embodiments, the second portion 235a of the interconnection plug 255 may be in direct contact with the first doped region 207a.

The second portion 235a of the interconnection plug 255 may have the same height as the landing pad 235. In addition, the second portion 235a of the interconnection plug 255 may have the same top surface level as the capping pattern 215. The second portion 235a of the interconnection plug 255 may include the same material as the landing pad 235. For instance, in the case that the landing pad 235 includes a polycrystalline semiconductor material, the second portion 235a of the interconnection plug 255 may also include the same polycrystalline semiconductor material.

The first portion 250a of the interconnection plug 255 may be coupled to the second portion 235a of the interconnection plug 255 through the first interlayer dielectric 240. The first portion 250a of the interconnection plug 255 may have a second directional width greater than that of the second portion 235a of the interconnection plug 255. Accordingly, the first portion 250a of the interconnection plug 255 may cover a portion of top surfaces of a pair of capping patterns 115, which are adjacent both sides of the second portion 235a of the interconnection plug 255.

In some embodiments, the first portion 250a of the interconnection plug 255 may have the substantially same width along the first direction as the second portion 235a of the interconnection plug 255. In this case, the first and second portions 250a and 235a of the interconnection plug 255 may be completely overlapped with each other in cross section along the first direction.

In some embodiments, a pair of the landing pads 235 may be provided in one of the active regions 203. A pair of the grooves 205 may be provided between the pair of the landing pads 235 to cross the active region 203. The buried gate electrodes 213 and the capping patterns 215 may be provided in each of the pair of the grooves 205. The interconnection plug 255 may be provided between the pair of the grooves 205. The pair of the landing pads 235 may be coupled to a pair of the second doped regions 207b of the active region 203. The interconnection plug 255 may be coupled to the first doped region 207a of the active region 203.

An interconnection line 265 may be provided on the first interlayer dielectric 240. The interconnection line 265 may be electrically connected to the interconnection plug 255. The interconnection line 265 may have a substantially linear shape extending along the second direction. The interconnection line 265 may include a conductive material. For instance, the interconnection line 265 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum).

The interconnection line 265 may have the same width along the first direction as the interconnection plug 255. Accordingly, both sidewalls of the interconnection line 265 may be aligned with both sidewalls of the interconnection plug 255 in a self-aligned manner.

A sidewall spacer 267 may be provided on a sidewall of the interconnection line 265. The sidewall spacer 267 may include an extended portion 269 extending toward the substrate 200 to cover a sidewall of the interconnection plug 255. In some embodiments, the extended portion 269 may be in direct contact with the substrate 200. The extended portion 269 may be provided between the interconnection plug 255 and the landing pad 235.

A second interlayer dielectric 270 may be provided on the first interlayer dielectric 240 to cover the interconnection line 265. The second interlayer dielectric 270 may be the same as the second interlayer dielectric 170 of the afore-described embodiments in terms of material and shape.

A storage plug 275 may be provided on the substrate 200 to penetrate or extend through the first and second interlayer dielectrics 240 and 270. The storage plug 275 may be connected to the landing pad 235. In some embodiments, a bottom surface of the storage plug 275 may be in direct contact with the landing pad 235. The storage plug 275 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum). In plan view, an overlap area between the storage plug 275 and the second doped region 207b may be smaller than that between the landing pad 235 and the second doped region 207b in plan view. In other words, due to the presence of the landing pad 235, the storage plug 275 can be electrically connected to the second doped region 207b with an increased contact area.

According to some embodiments of the inventive concepts, the storage plug 275 may be disposed on the landing pad 235 provided on the substrate 200. An overlap area between the landing pad 235 and the second doped region 207b may be greater than an overlap area between the storage plug 275 and the second doped region 207b in plan view. This configuration enables improved reliability of a semiconductor memory device. In greater detail, a contact area between the second doped region 207b and the storage plug 275 may be reduced in the case where the landing pad 235 is absent, compared with the case where the landing pad 235 is present. This reduction in the contact area may result in deterioration in the reliability of the semiconductor memory device. In this sense, in the case where the landing pad 235 is provided as in the above-described embodiments of the inventive concepts, it is possible to overcome the contact area reduction in the case where the landing pad 235 is absent, and therefore, to improve the reliability of the semiconductor memory device.

Furthermore, since the storage plug 275 is provided on the landing pad 235, it is possible to prevent the likelihood of the storage plug 275 from being in direct contact with the active region 203. Otherwise (e.g., without the landing pad 235), the storage plug 275 may be in direct contact with the second doped region 207b of the active region 203, and in this case, the device isolation pattern 201 may be excessively etched during forming the storage plug 275 to cause product failures. However, according to the above-described embodiments of the inventive concepts, since the storage plug 275 is provided on the landing pad 235, it is possible to reduce or prevent failures associated with excessive etching of the device isolation pattern 201.

In addition, the widths of the interconnection plug 255 and the interconnection line 265 along the first direction may be substantially the same as each other. Accordingly, it is possible to prevent or reduce the likelihood of the interconnection plug 255 from being connected to or in electrical contact with storage plugs and/or other interconnection lines adjacent thereto, thereby causing an electrical short circuit. This enables a semiconductor memory device having improved reliability.

As shown in FIG. 14B, an information storing element 280 may be provided on the second interlayer dielectric 270 and be electrically connected to the storage plug 275. The inventive concepts are not limited to a specific type of the information storing element 280 and can be realized in various manners. A portion B of FIG. 14B may have the substantially same shape as the portion A of the above-described embodiments described with reference to FIG. 1B. In other words, the information storing element 280 may be configured to have the same shape and function as the information storing element 180 of FIG. 1B.

According to further example embodiments of the inventive concepts, the semiconductor memory device may include an interconnection line configured to have a different shape from that of the aforementioned embodiments. Hereinafter, a semiconductor memory device according to modifications of the example embodiments of the inventive concepts will be described in more detail with reference to FIG. 14C.

Figure 14C:
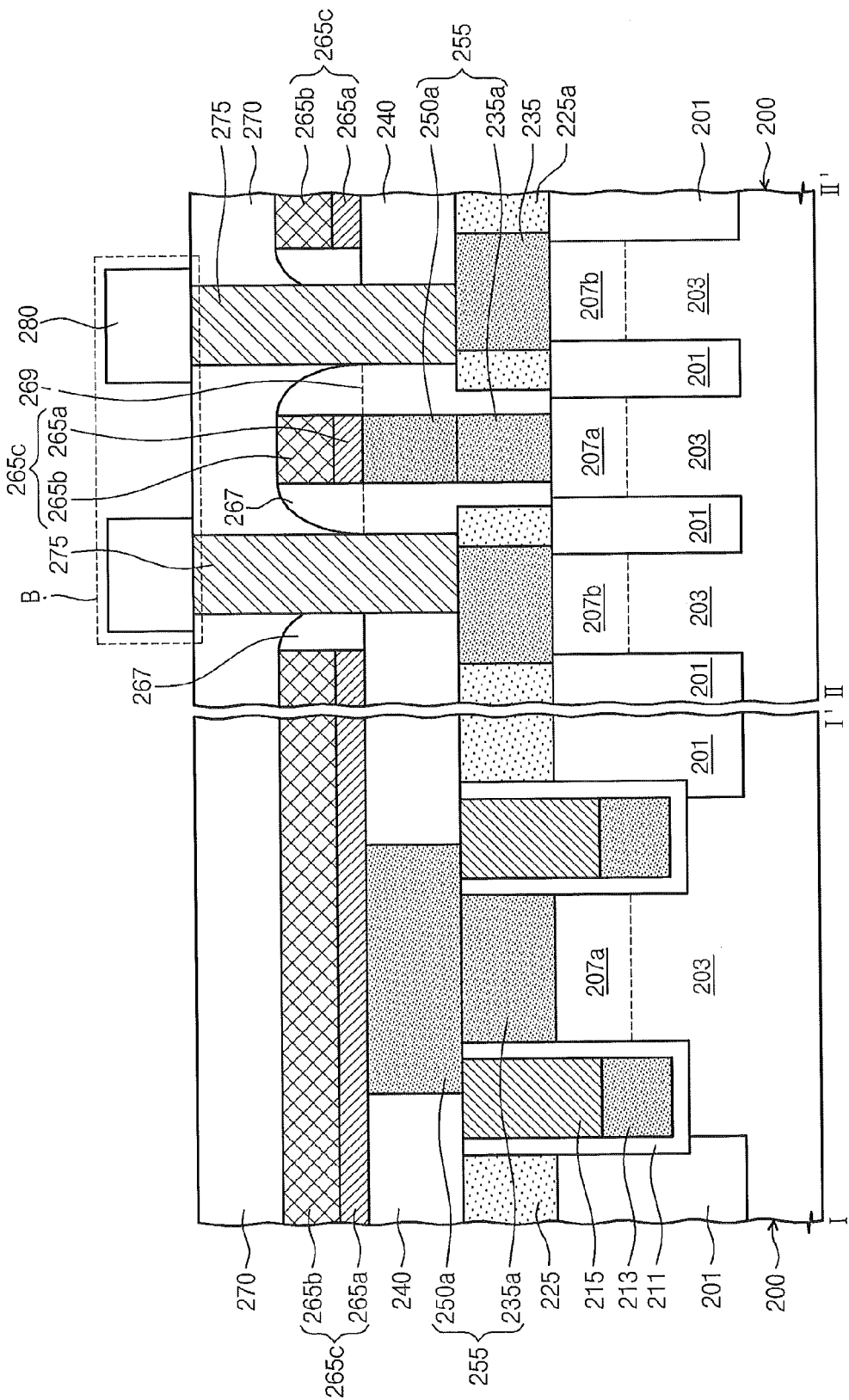
FIG. 14C is a cross-sectional view of a semiconductor memory device according to still further example embodiments of the inventive concepts.

Referring to FIG. 14C, the interconnection plug 255 may be provided on the substrate 200 to penetrate or extend through the first interlayer dielectric 240 and be connected to the first doped region 207a.

According to FIG. 14C, an interconnection line 265c may be provided on the first interlayer dielectric 240. The interconnection line 265c may be coupled to the interconnection plug 255. The interconnection line 265c may include a first pattern 265a and a second pattern 265b sequentially stacked on the substrate 200.

The first pattern 265a may include the substantially same conductive material as that included in the interconnection plug 255. For instance, in the case that the interconnection plug 255 includes a polycrystalline semiconductor layer, the first pattern 265a may also include the same polycrystalline semiconductor layer. The second pattern 265b may include a conductive material having higher conductivity than the first pattern 265a. For instance, in the case that the first pattern 265a includes a polycrystalline semiconductor layer, the second pattern 265b may include a metal layer (e.g., of tungsten).

According to the embodiments of FIG. 14C, the interconnection line 265c may include the first pattern 265a including the same conductive material as the interconnection plug 255 and the second pattern 265b including a conductive material having higher conductivity than the first pattern 265a. In this case, since the interconnection plug 255 and the first pattern 265a include the same conductive material as each other, it is possible to reduce contact resistance between the interconnection plug 255 and the interconnection line 265c. In addition, since the second pattern 265b includes a conductive material having higher conductivity than the first pattern 265a, it is possible to reduce resistance of the interconnection line 265c. As a result, it is possible to realize a semiconductor memory device having improved electrical characteristics and improved reliability.

Hereinafter, a method of fabricating a semiconductor memory device according to example embodiments of the inventive concepts will be described in more detail with reference to the accompanying drawings. FIGS. 15A through 23A are plan views illustrating a method of fabricating a semiconductor memory device according to example embodiments of the inventive concepts, and FIGS. 15B through 23B are cross-sectional views taken along lines I-I' and II-II' of FIGS. 15A through 23A, respectively.

Figure 15A:
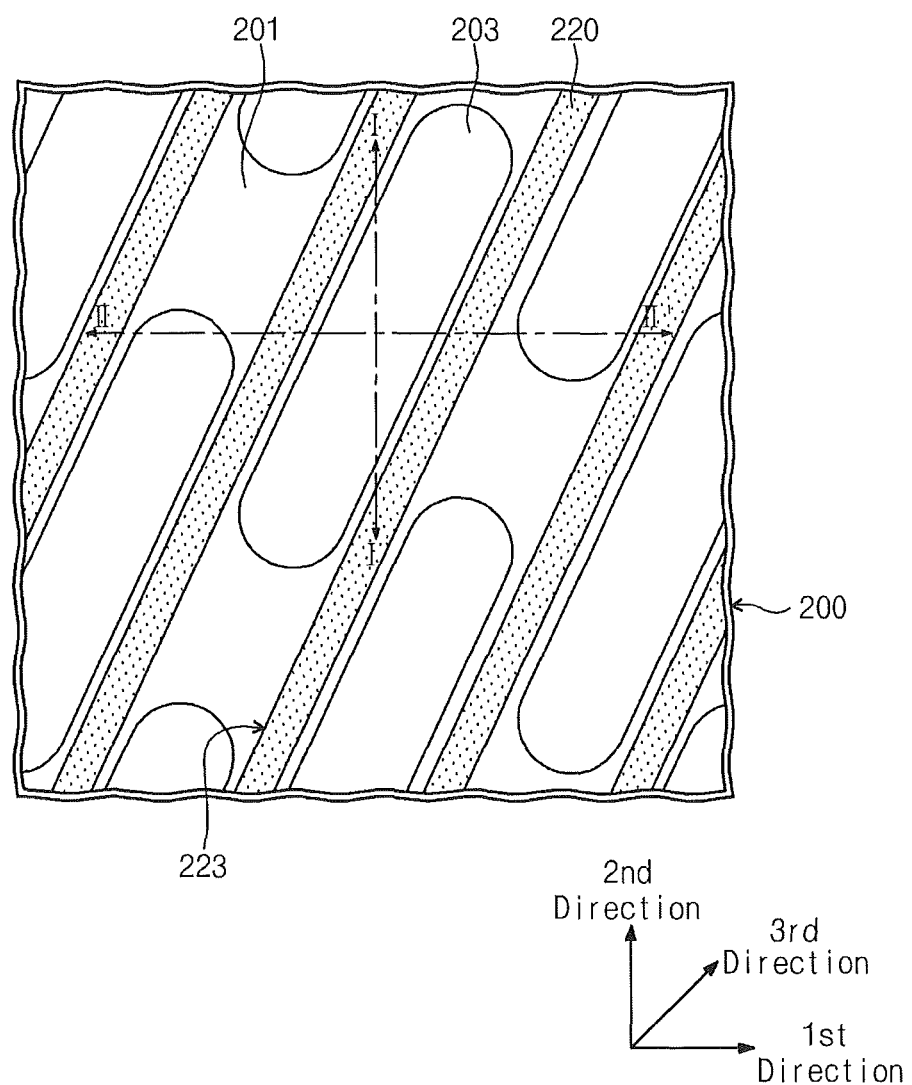
Figure 15B:
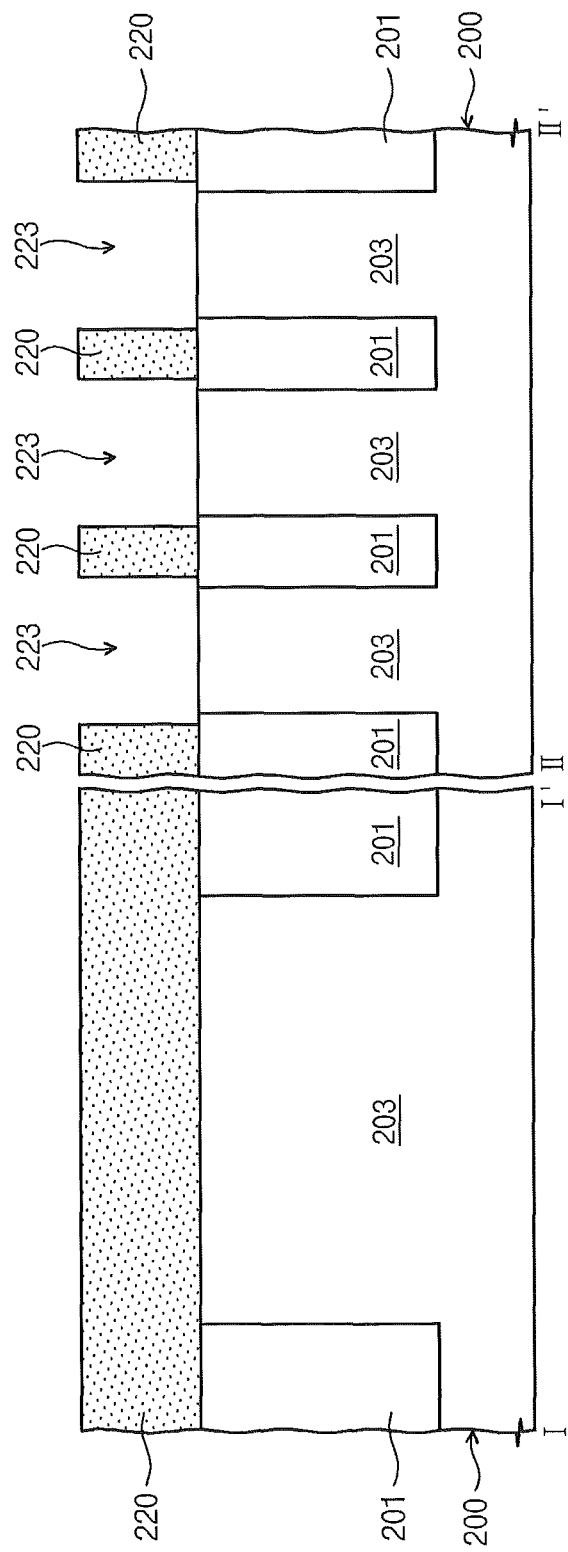

Referring to FIGS. 15A and 15B, a device isolation pattern 201 may be formed in a substrate 200 to define at least one active region 203. The substrate 200 may be formed of a semiconductor material. For instance, the substrate 200 may include at least one of silicon or germanium. The device isolation pattern 201 may be formed using the same or similar methods as the formation of the device isolation pattern 101 in the above-described embodiments to have a similar shape and/or configuration as the device isolation pattern 101.

In some embodiments, the at least one active region 203 may include a plurality of active regions 203 separated from each other by the device isolation pattern 201. The active regions 203 may be formed in the substrate 200 in such a way that they are two-dimensionally arranged in rows and in columns. For the sake of convenience, a term "first direction" will be used to represent a direction parallel to the rows, and a term "second direction" will be used to represent a direction parallel to the columns or crossing the first direction. The active regions 203 may be formed to have the same or similar arrangement or configuration as the active regions 103 of the above-described embodiments.

Each of the active regions 203 may be formed to have a rectangular shape extending along a third direction, which may be non-parallel to and non-perpendicular to both of the first and second directions.

Guide patterns 220 may be formed on the substrate 200. The guide patterns 220 may extend along the third direction and be parallel to each other. Accordingly, the guide patterns 220 may be substantially parallel to the active region 203. In some embodiments, the guide patterns 220 may be disposed on the device isolation pattern 201. The guide patterns 220 may include at least one of oxide, nitride, or oxynitride materials. An empty region 223 may be formed between a pair of the guide patterns 220 disposed adjacent each other. The guide pattern 220 may be formed using the same or similar methods as the formation of the guide pattern 120 in the afore-described embodiments.

Figure 16A:
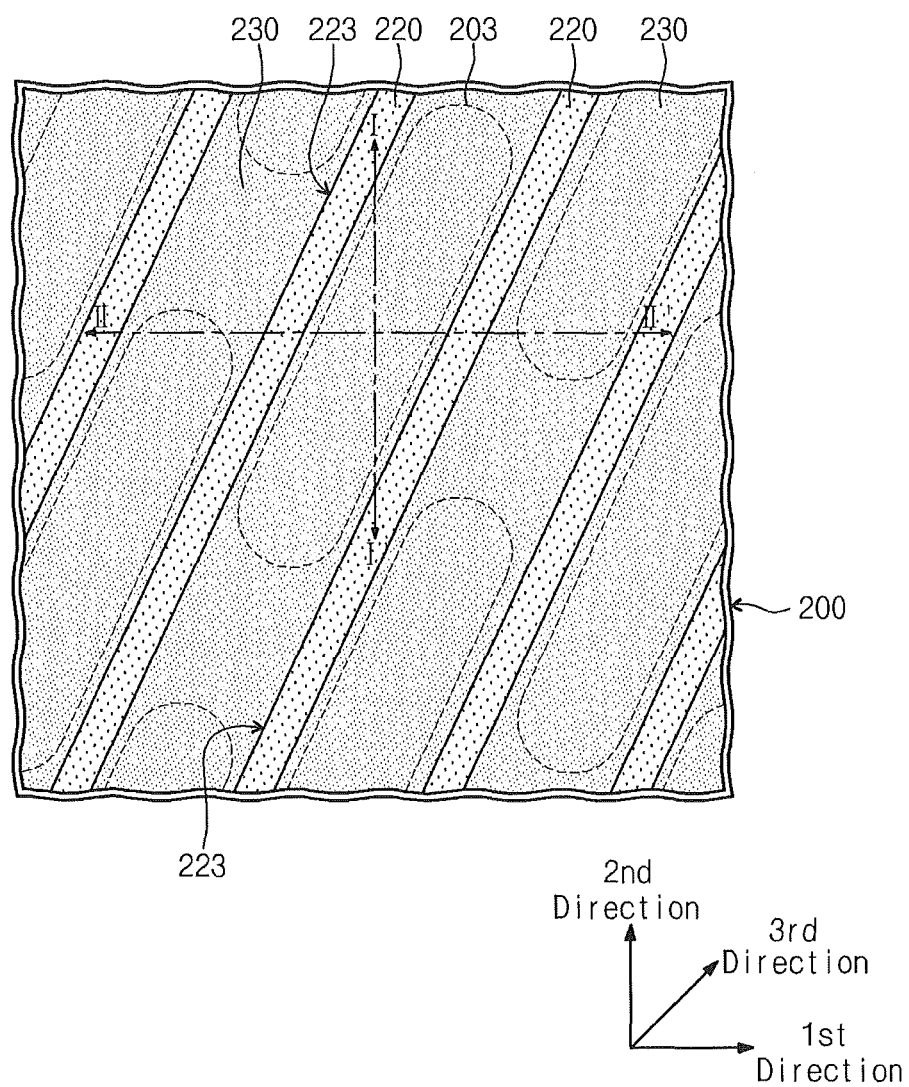
Figure 16B:
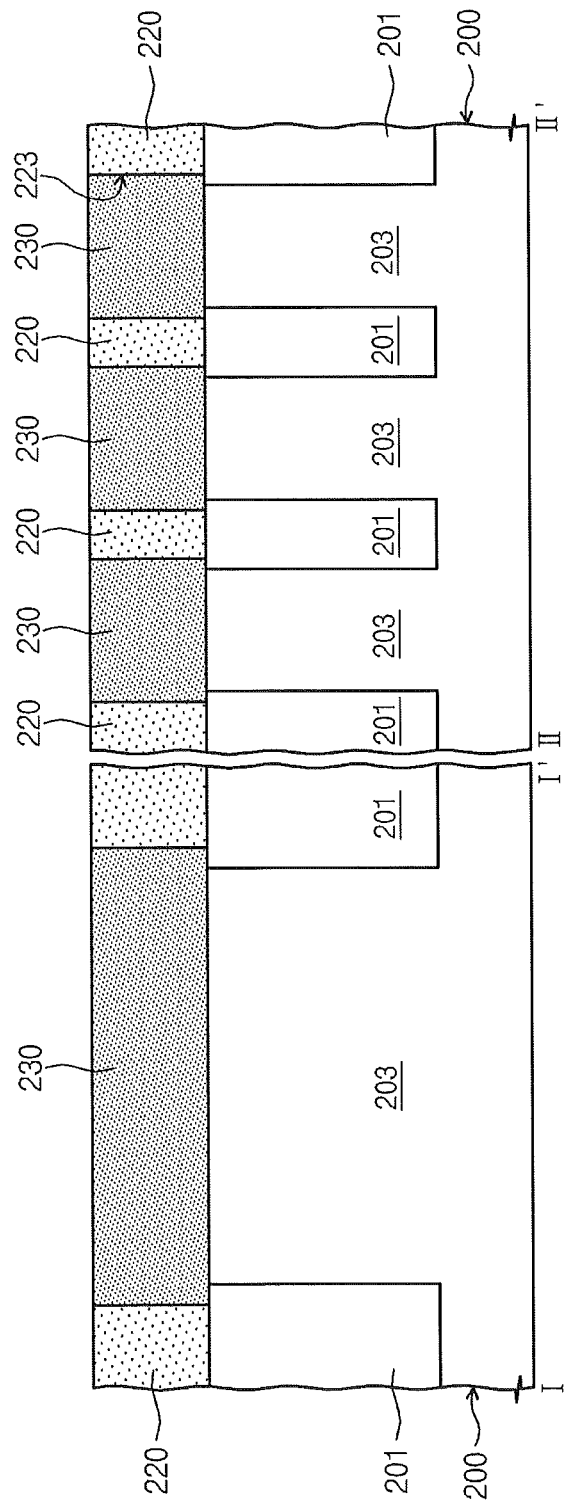

Referring to FIGS. 16A and 16B, a bulk conductive pattern 230 may be formed in the empty region 223 between the guide patterns 220. The bulk conductive pattern 230 may be formed to have a substantially linear shape extending along the third direction. The bulk conductive pattern 230 may be formed using the same or similar methods as the formation of the bulk conductive pattern 130 in the above-described embodiments. The bulk conductive pattern 230 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum).

Figure 17A:
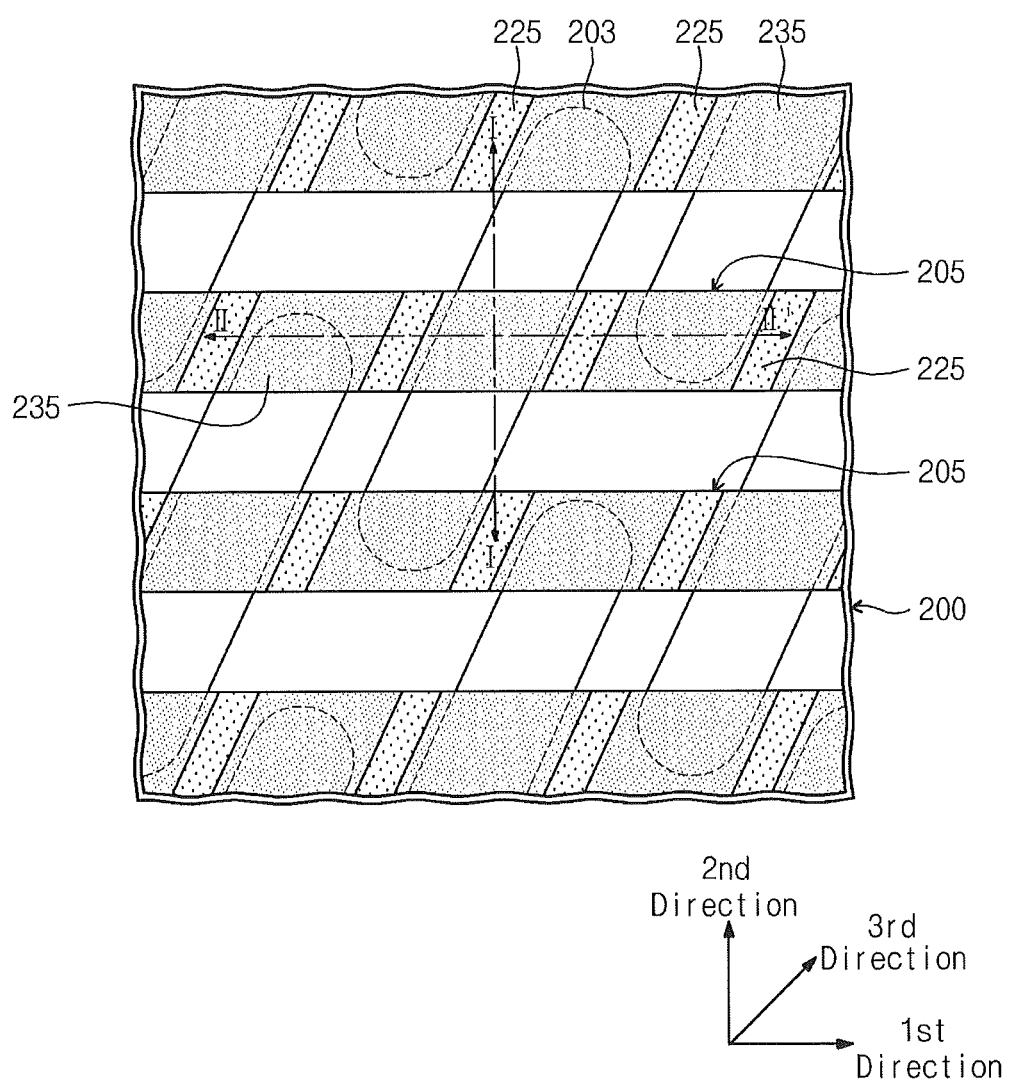
Figure 17B:
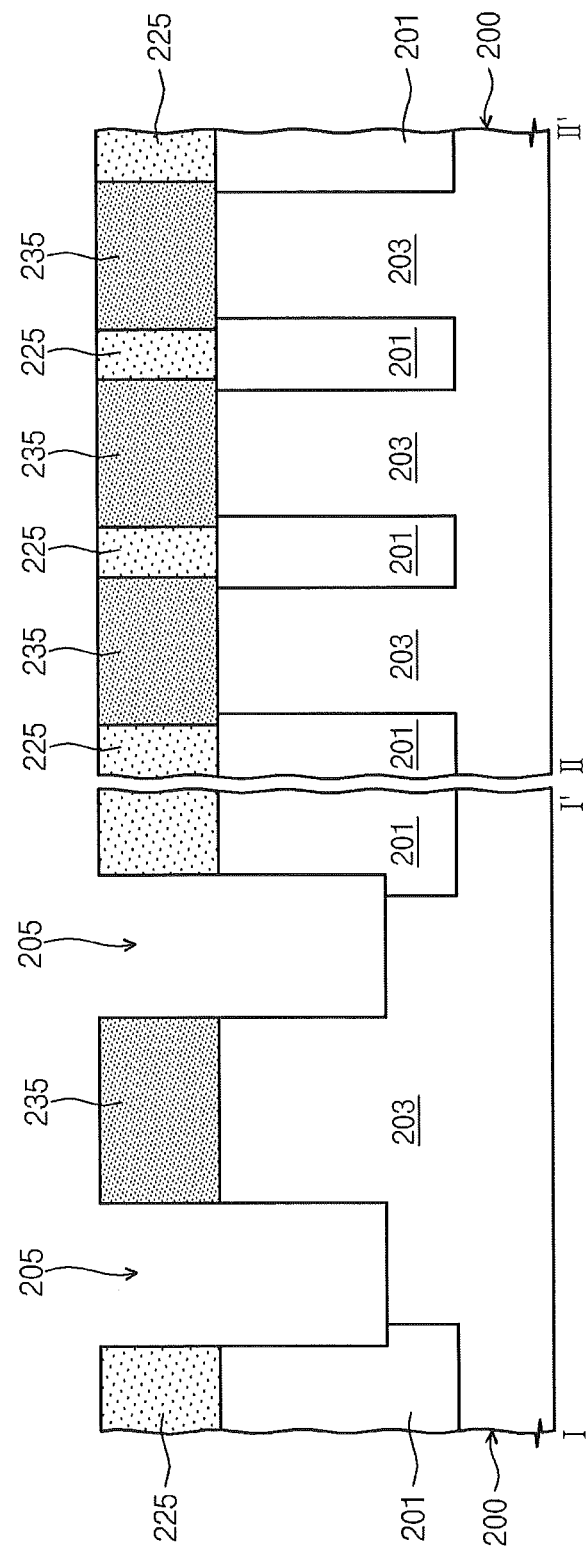

Referring to FIGS. 17A and 17B, a groove 205 may be formed in the substrate 200. The groove 205 may be formed to have a substantially linear shape crossing the active region 203 and the device isolation pattern 201, and may extend along the first direction. The formation of the groove 205 may include forming a pair of mask patterns on substrate 200, and then etching the guide pattern 220, the bulk conductive pattern 230, the active region 203, and the device isolation pattern 201 using the mask pattern as an etch-mask.

During formation of the groove 205, as the result of the etching of the guide patterns 220 and the bulk conductive pattern 230, dielectric patterns 225 and landing pads 235 may be defined on the substrate 200. Each of the landing pads 235 may be coupled to at least a portion of the active region 203. The landing pads 235 may be spaced apart from each other by the dielectric patterns 225.

Figure 18A:
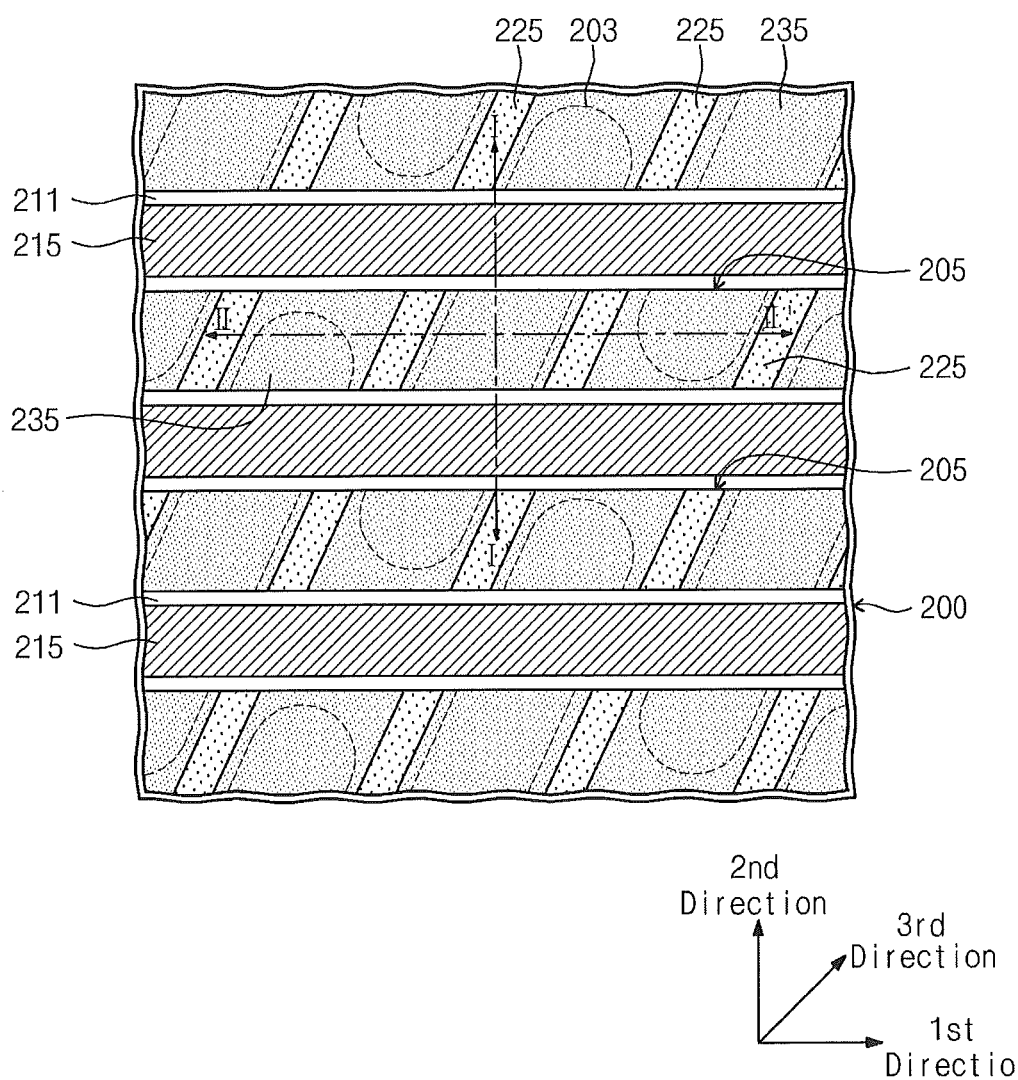
Figure 18B:
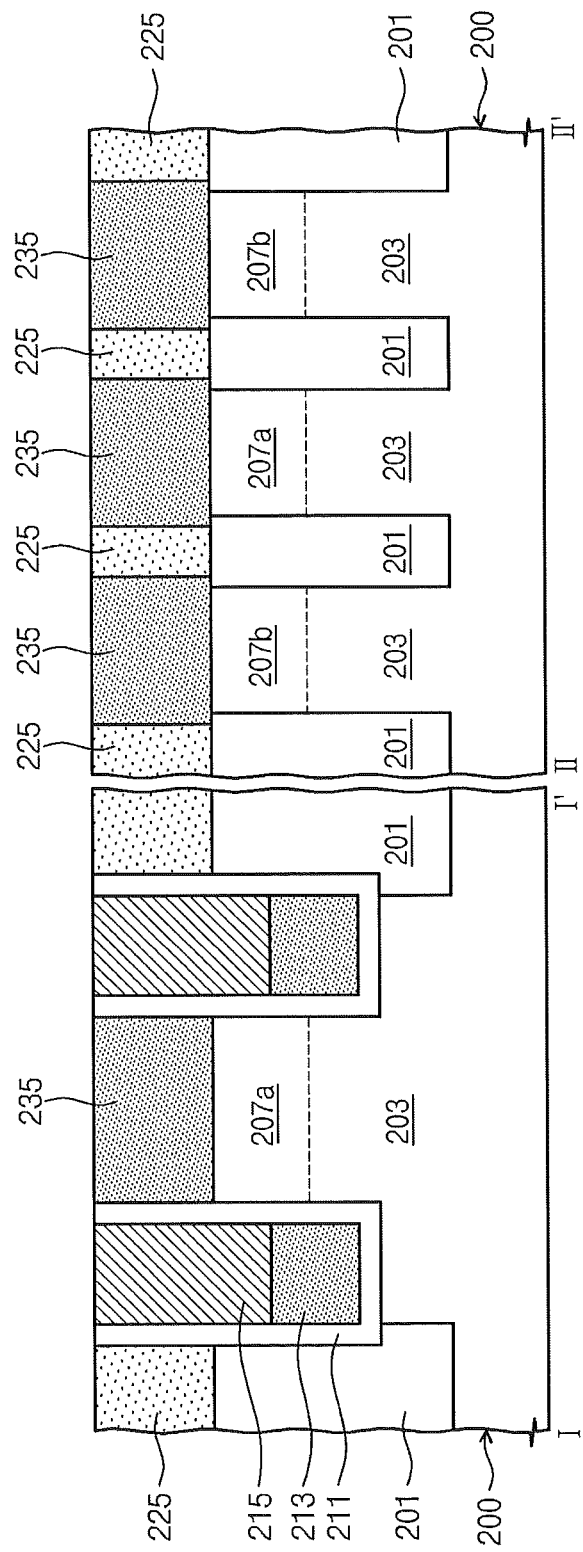

Referring to FIGS. 18A and 18B, a gate dielectric pattern 211, a buried gate electrode 213 and a capping pattern 215 may be formed in each of the grooves 205. The formation of the buried gate electrode 213 may include forming a gate dielectric layer on the substrate 200 to conformally cover an inner surface and sidewalls of the groove 205, forming a gate conductive layer on the substrate 200 to fill the groove 205, and then performing a first etching process to etch the gate conductive layer to define the buried gate electrode 213. The formation of the gate dielectric pattern 211 and the capping pattern 215 may include forming a capping layer on the substrate 200, and then performing a second etching process to etch the capping layer and the gate dielectric layer to expose a top surface of the landing pad 235, thereby defining the capping patter 215.

The gate dielectric pattern 211, the buried gate electrode 213, and the capping pattern 215 may include the same material as those of the gate dielectric pattern 111, the buried gate electrode 113, and the capping pattern 115, respectively. The gate dielectric, the gate conductive layer, and the capping layer may be formed using the same or similar methods as the formation of the corresponding features of the above-described embodiments.

The second etching process of etching the capping layer and the gate dielectric may be performed using at least one of a CMP process, a dry etching process, or a wet etching process. As the result of the second etching process, a top surface of the capping pattern 215 may be formed at substantially the same level as top surfaces of the dielectric patterns 225 and the landing pad 235. In addition, the gate dielectric layer may be partially removed from top surfaces of the dielectric patterns 225 and the landing pad 235 during the second etching process, thereby forming the gate dielectric pattern 211.

A first doped region 207a and a second doped region 207b may be formed in the active region 203. The first doped region 207a may be formed in a portion of the active region 203 adjacent one side of the buried gate electrode 213, and the second doped region 207b may be formed in another portion of the active region 203 adjacent the other side of the buried gate electrode 213. In some embodiments, the first and second doped regions 207a and 207b may be formed by an implantation process injecting dopants into the active region 203 through the landing pads 235. The first and second doped regions 207a and 207b may be formed to have lower boundaries or bottom surfaces downward spaced apart from the top surface of the active region 203 at a specific depth. The bottom surfaces or lower boundaries of the first and second doped regions 207a and 207b may be formed above or at a higher level than the bottom surface of the buried gate electrode 213. The lower boundaries of the first and second doped regions 207a and 207b may also be below or at a lower level than the upper surface of the buried gate electrode 213 in some embodiments.

In some embodiments, the first doped region 207a and a pair of the second doped regions 207b on opposite sides thereof may be formed in the active region 203. In this case, the first doped region 207a may be formed between the pair of the buried gate electrodes 213 formed in the pair of the grooves 205. Furthermore, the pair of the second doped regions 207b may be formed in such a way that the pair of the buried gate electrodes 213 and the first doped region 207a are arranged between the pair of the second doped regions 207b.

Additionally or alternatively, the implantation process for forming the first and second doped regions 207a and 207b may be performed before forming the guide pattern 220. For instance, a bulk doped region may be formed in the active region 203, and then, the groove 205 may be formed in the substrate 200 to cross the active region 203 and the device isolation pattern 201. The bulk doped region may be formed using an ion implantation process injecting dopants into the active region 203, after forming the device isolation pattern 201. A bottom surface of the groove 205 may be formed at a lower level than a bottom surface of the bulk doped region, and thus, the bulk doped region may be separated into the first and second doped regions 207a and 207b.

Figure 19A:
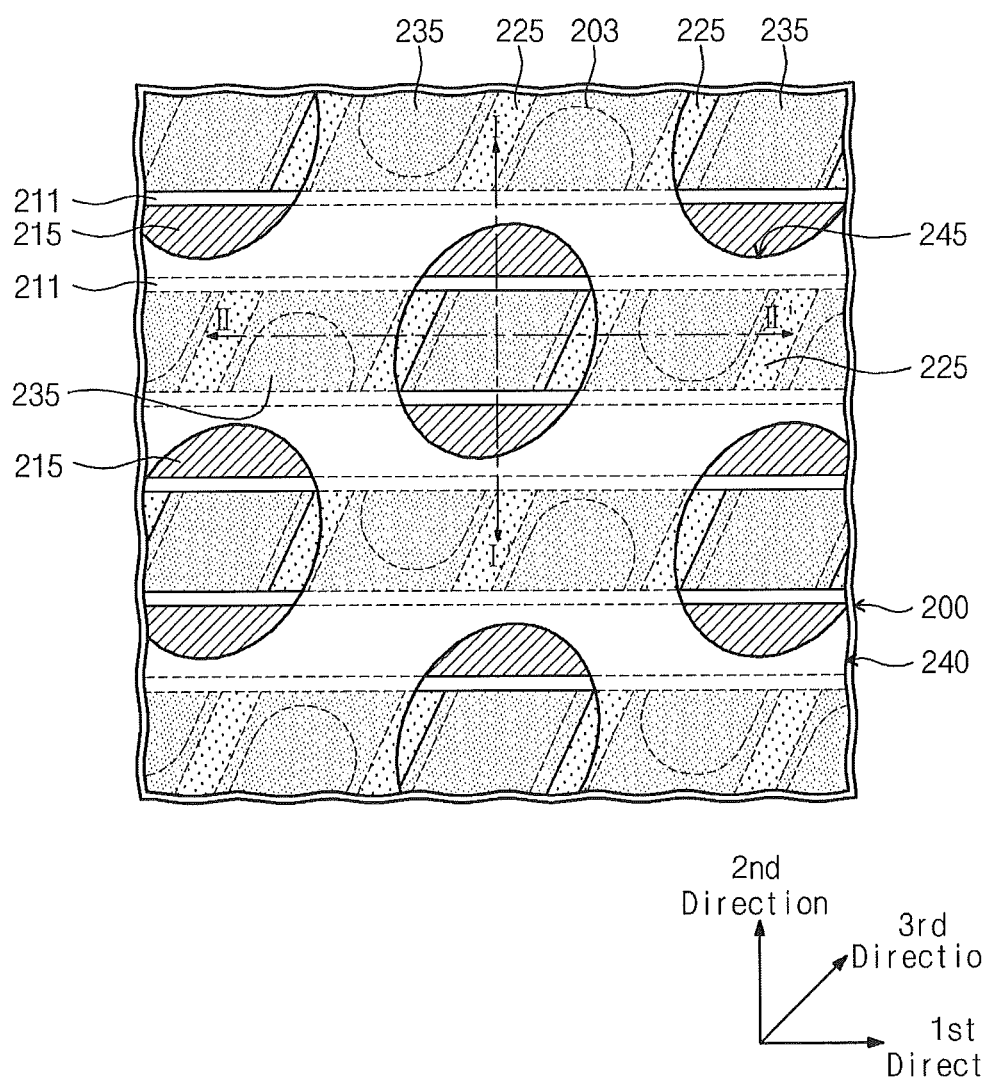
Figure 19B:
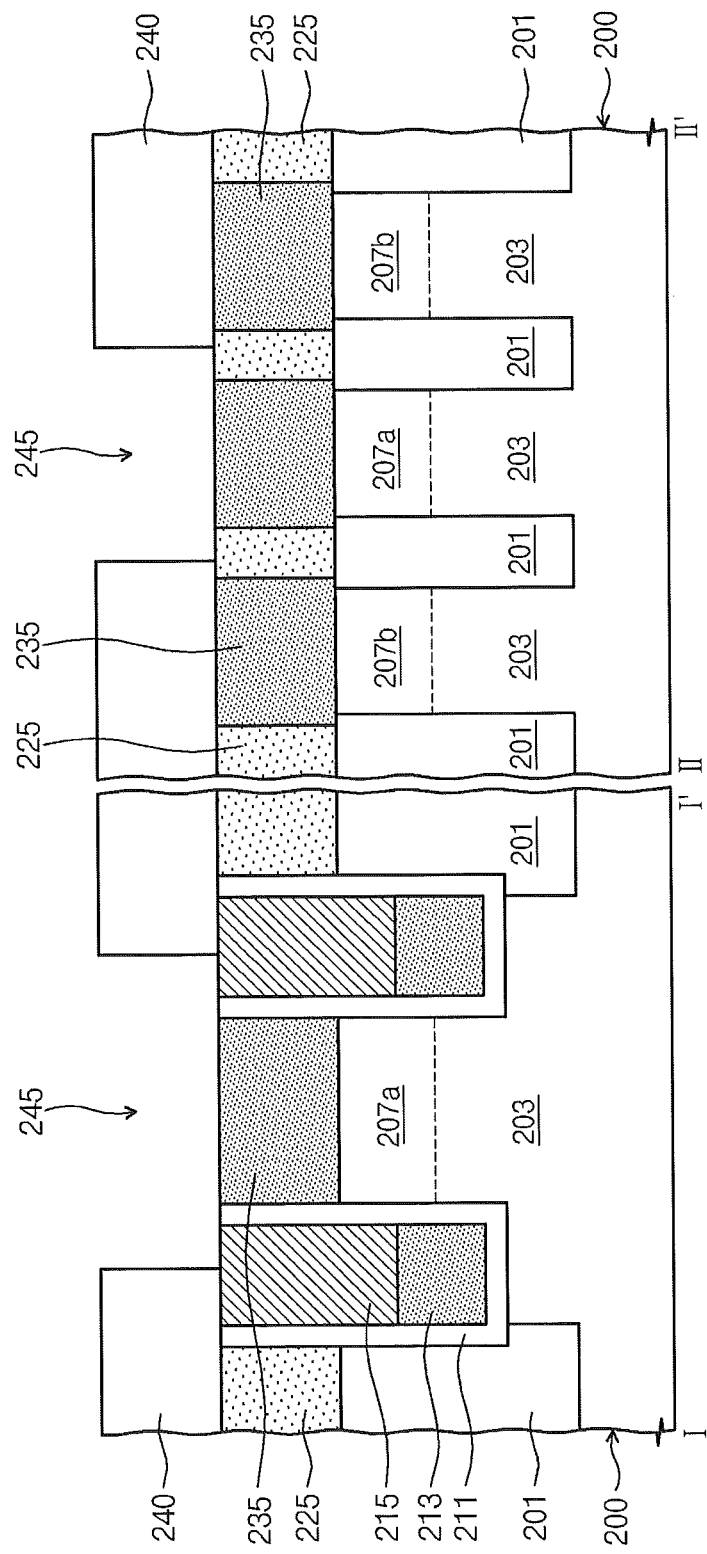

Referring to FIGS. 19A and 19B, a first interlayer dielectric 240 may be formed on the substrate 200. The first interlayer dielectric 240 may be formed using the same or similar methods as the formation of the first interlayer dielectric 140 in the above-described embodiments to have a similar shape and/or configuration as the first interlayer dielectric 140.

The first interlayer dielectric 240 may be patterned to form a first hole 245 exposing a portion of the landing pad 235, which is coupled to the first doped region 207a, through the first interlayer dielectric 240. In some embodiments, the first hole 245 may be formed by performing at least one etching process.

In the case that a plurality of the landing pads 235 are formed on the substrate 200, the landing pads 235 may be classified into a first group coupled to the first doped region 207a and a second group coupled to the second doped region 207b. The landing pads 235 in the first group may be exposed by a plurality of the first holes 245, respectively, formed in the first interlayer dielectric 240.

In some embodiments, the first hole 245 may be formed to have a width along the second direction that is greater than that of the landing pad 235. For instance, the first hole 245 may be formed to partially expose top surfaces of the pair of the capping patterns 215 disposed at both sides of the landing pad 235.

In some embodiments, the first hole 245 may be formed to have a width along the first direction that is greater than that of the landing pad 235. Accordingly, the first hole 245 may expose a portion of the dielectric patterns 225 disposed at both sides of the landing pad 235.

Figure 20A:
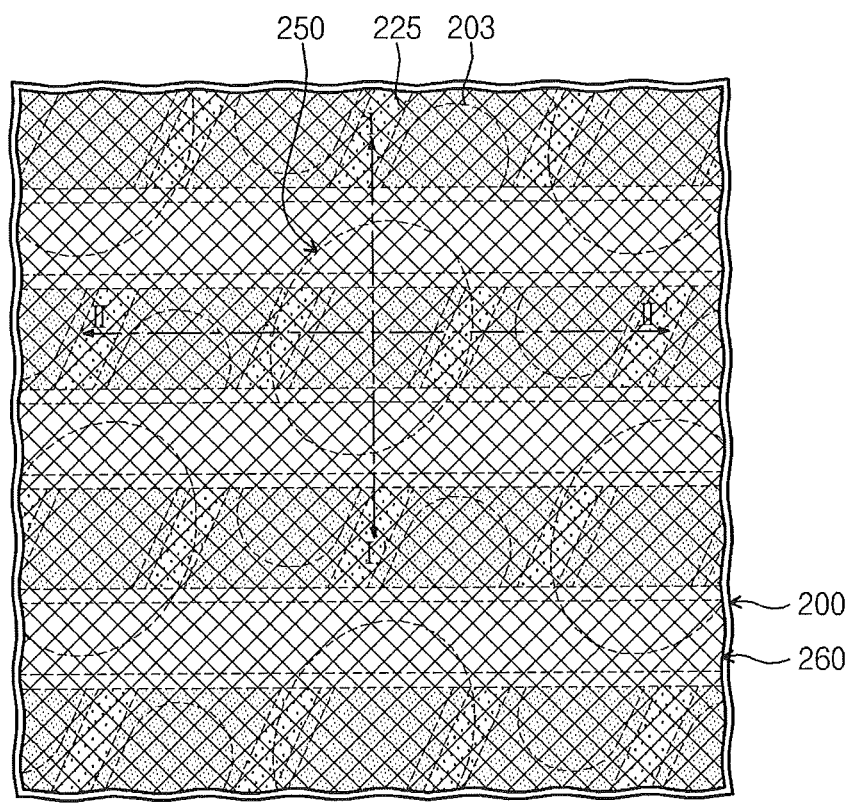
Figure 20A:
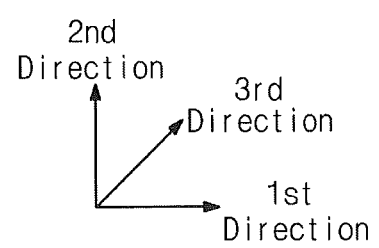
Figure 20B:
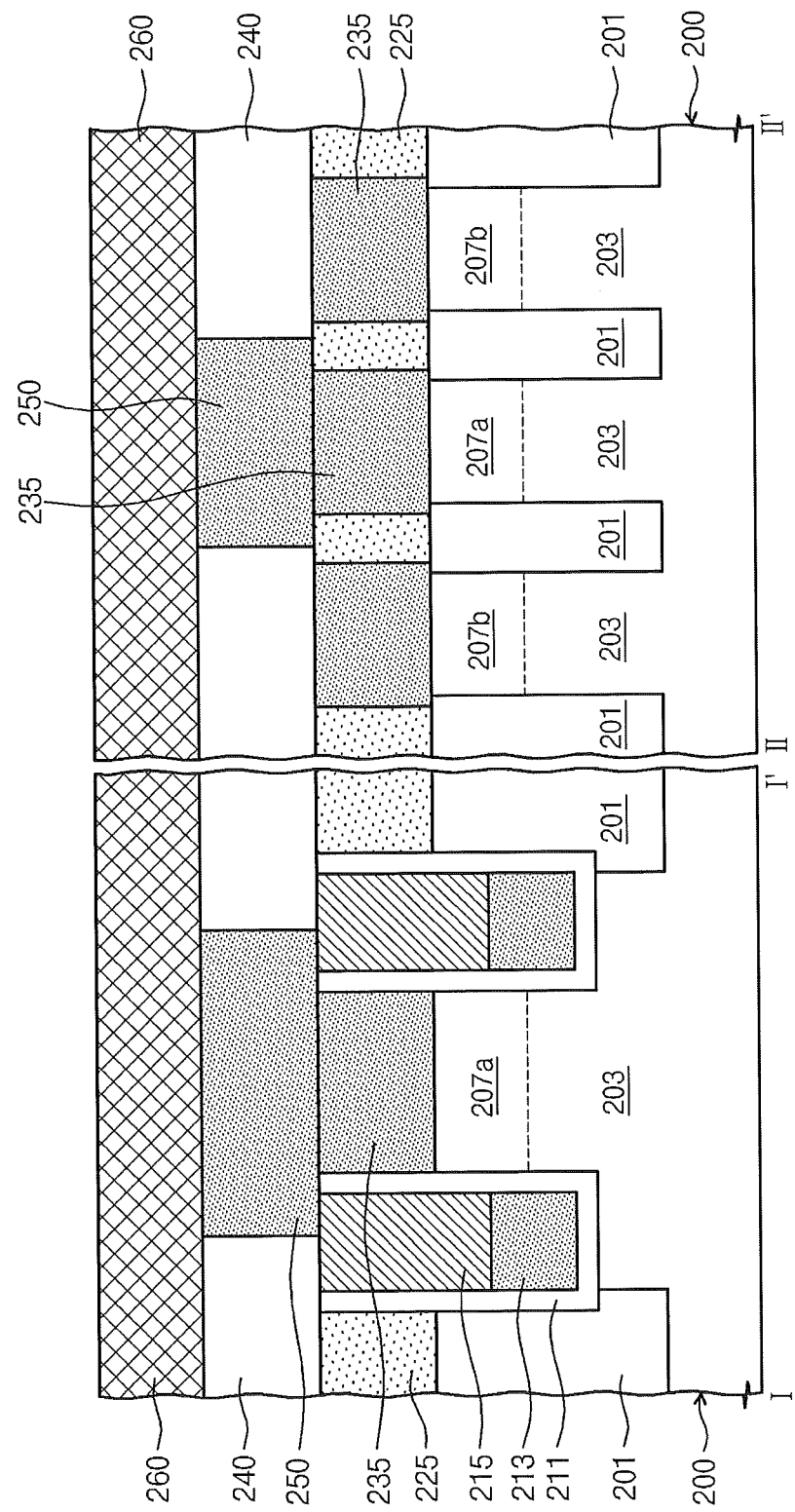

Referring to FIGS. 20A and 20B, a conductive gap-filling pattern 250 may be formed in the first hole 245. The conductive gap-filling pattern 250 may be formed on the landing pad 235 exposed by the first hole 245. In some embodiments, the conductive gap-filling pattern 250 may be in direct contact with the landing pad 235 exposed by the first hole 245. The formation of the conductive gap-filling pattern 250 may include forming a conductive gap-filling layer on the first interlayer dielectric 240 to fill the first hole 245, and then etching the conductive gap-filling layer to expose a top surface of the first interlayer dielectric 240. The conductive gap-filling layer may be formed using at least one of PVD, CVD or ALD processes. The etching of the conductive gap-filling layer may be performed using at least one of a CMP process or a dry etching process.

The conductive gap-filling pattern 250 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum). In some embodiments, the conductive gap-filling pattern 250 may be formed of the same conductive material as the landing pad 235. For instance, in the case where the landing pad 235 includes a polysilicon layer, the conductive gap-filling pattern 250 may also include the same polysilicon layer.

A conductive interconnection layer 260 may be formed on the first interlayer dielectric 240. The conductive interconnection layer 260 may include the same material as the conductive interconnection layer 160 in the above-described embodiments and be formed using the same or similar methods as the formation of the conductive interconnection layer 160.

Figure 21A:
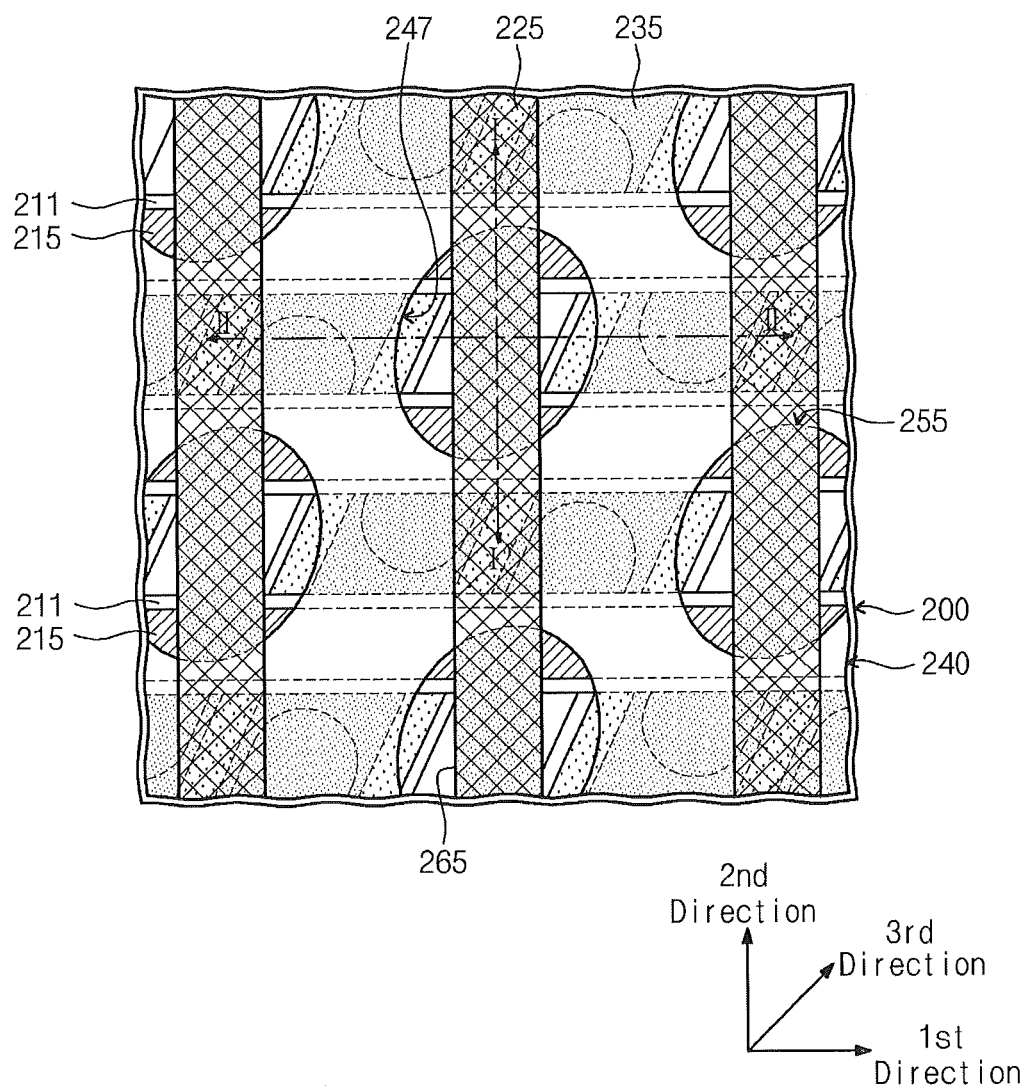
Figure 21B:
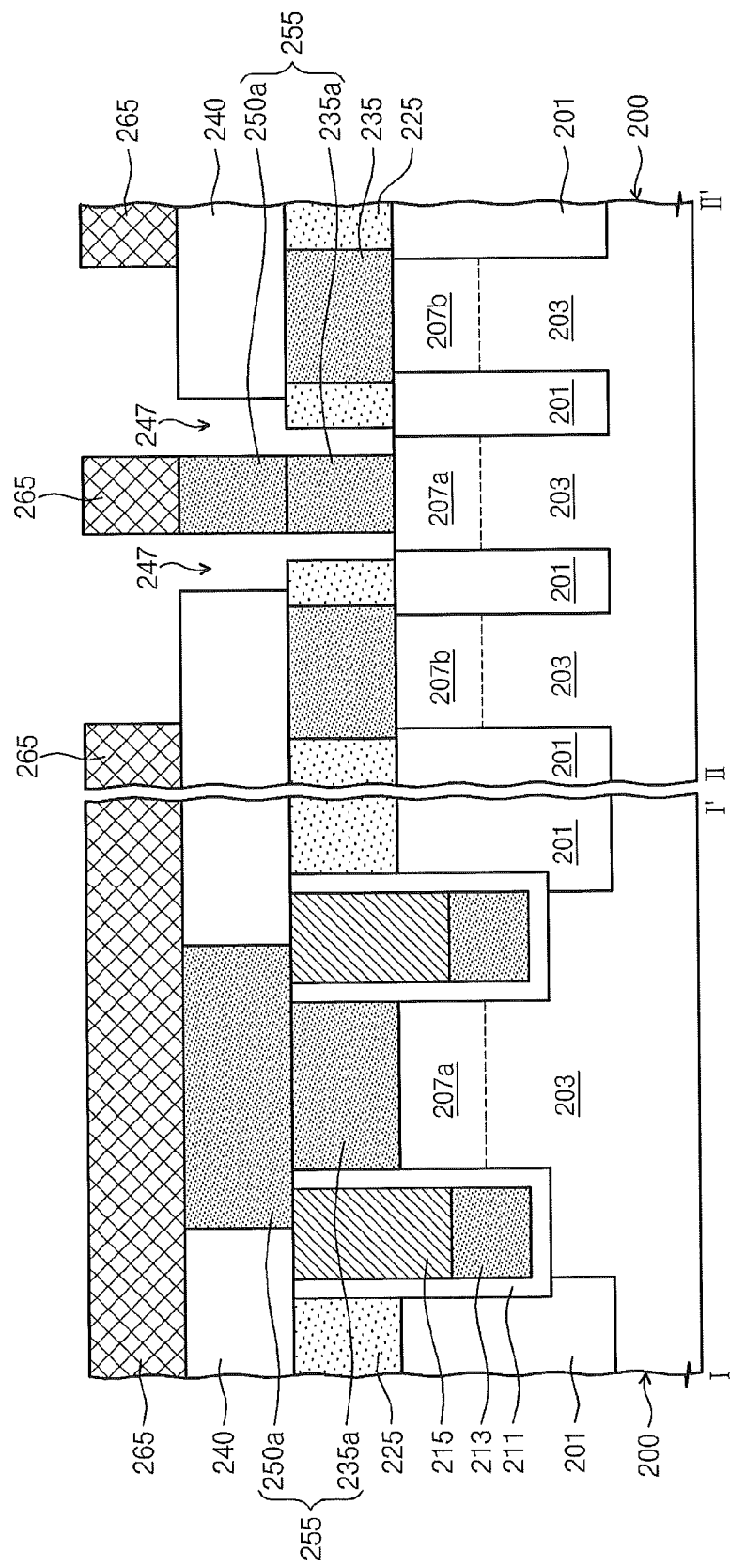

Referring to FIGS. 21A and 21B, the conductive interconnection layer 260, the conductive gap-filling pattern 250, and the landing pad 235 disposed below the conductive gap-filling pattern 250 may be sequentially patterned to form an interconnection line 265 and an interconnection plug 255. The formation of the interconnection line 265 may include forming a mask pattern on the conductive interconnection layer 260, and then etching the conductive interconnection layer 260 using the mask pattern as an etch-mask.

The interconnection plug 255 may be formed by the same etching process using the mask pattern for forming the interconnection line 265 as an etch-mask. The interconnection plug 255 may include a first portion 250a and a second portion 235a. Here, the first portions 250a may be formed by the etching of the conductive gap-filling pattern 250 exposed at both sides of the interconnection line 265, and the second portion 235a may be formed by the etching of the landing pad 235 exposed at both sides of the first portion 250a of the interconnection plug 255.

In some embodiments, the etching of the conductive interconnection layer 260, the etching of the conductive gap-filling pattern 250, and the etching of the landing pad 235 disposed below the conductive gap-filling pattern 250 may be performed in the same and/or in a single reaction chamber.

As the result of the etching process for forming the interconnection plug 255, a second opening 247 may be formed between the landing pad 235 and the interconnection plug 255. In some embodiments, the second opening 247 may be formed to partially expose the active region 203 and the device isolation pattern 201.

The interconnection line 265 may be formed to have a substantially linear shape extending along the second direction. The interconnection line 265 may be electrically coupled to the interconnection plug 255. The interconnection plug 255 may be electrically coupled to the first doped region 207a of the active region 203.

Figure 22A:
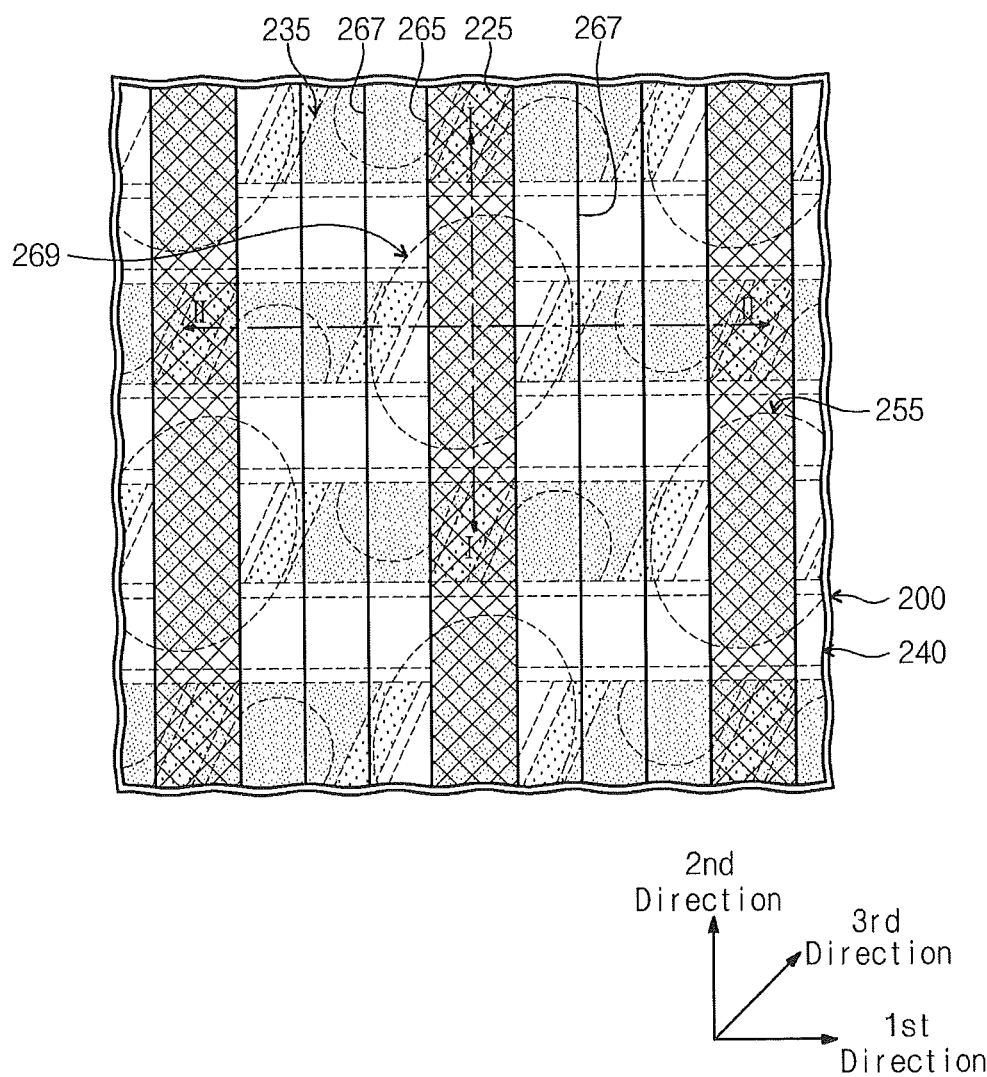
Figure 22B:
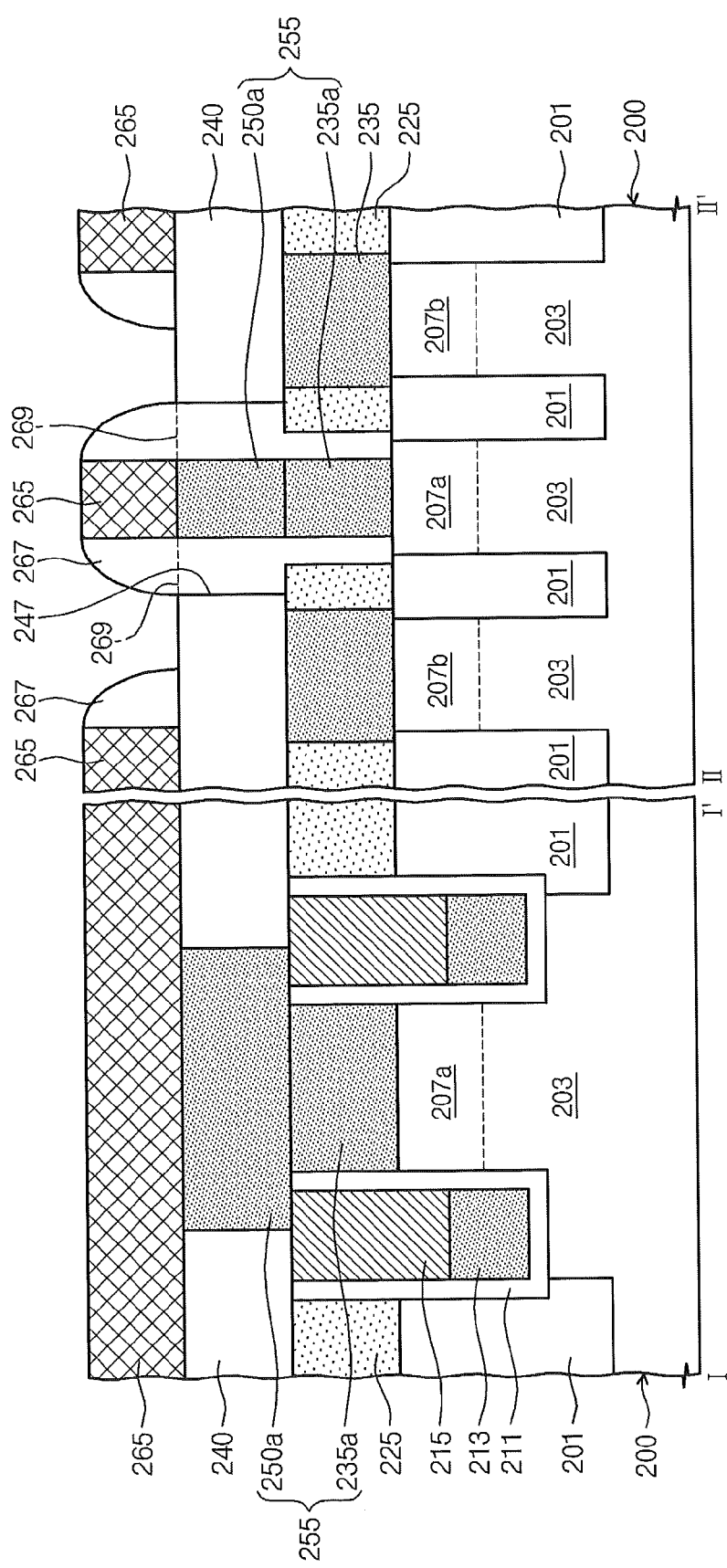

Referring to FIGS. 22A and 22B, a sidewall spacer 267 may be formed on a sidewall of the interconnection line 265. The sidewall spacer 267 may include an extended portion 269 filling the second opening 247. The extended portion 269 may be formed to cover the sidewall of the interconnection plug 255. In some embodiments, the extended portion 269 may be in direct contact with the substrate 200. The sidewall spacer 267 may be formed using the same or similar methods as the formation of the sidewall spacer 167 in the above-described embodiments.

Figure 23A:
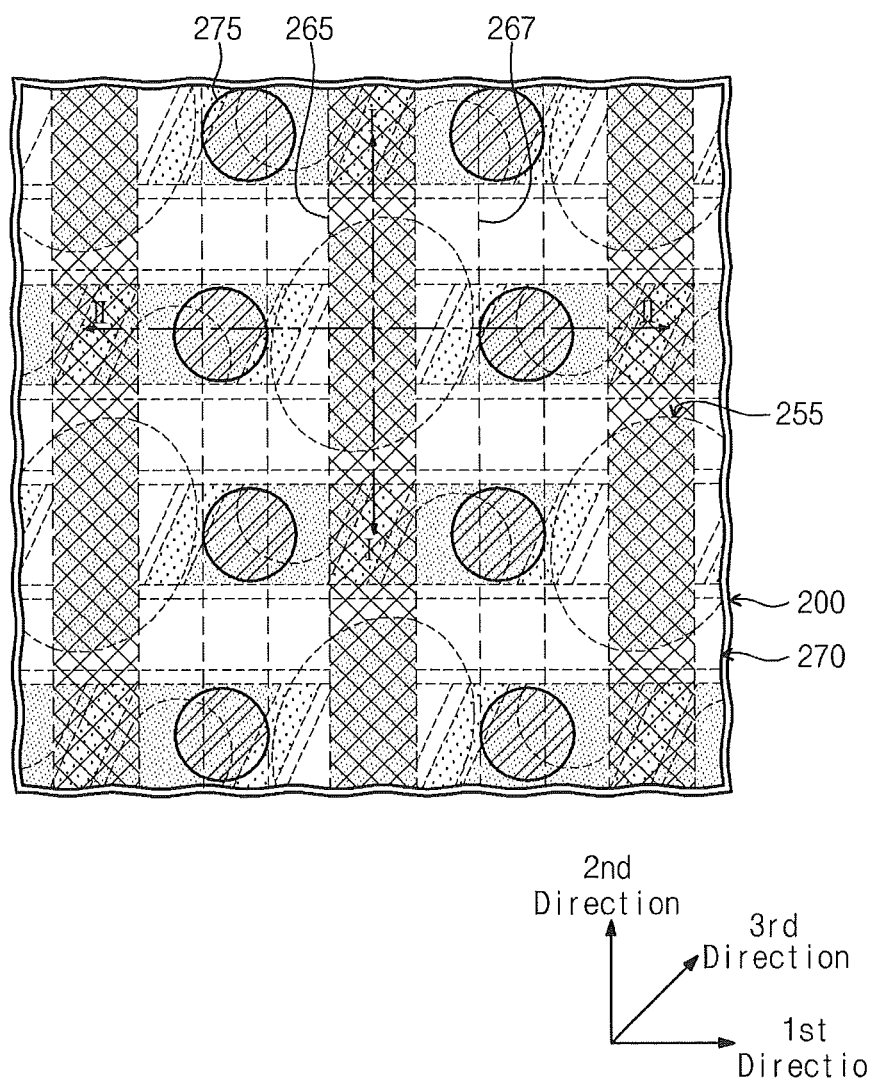
Figure 23B:
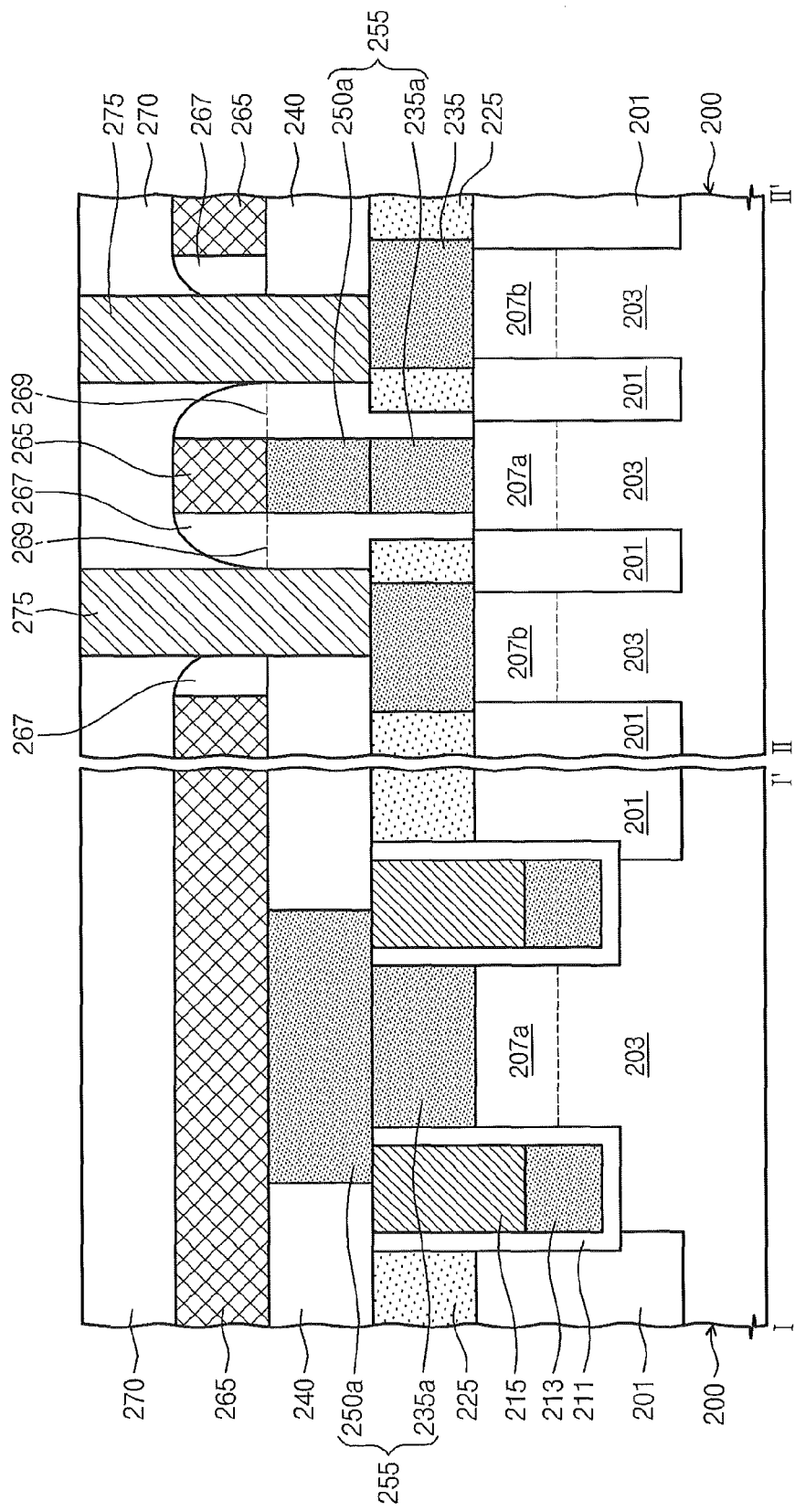

Referring to FIGS. 23A and 23B, a second interlayer dielectric 270 may be formed on the first interlayer dielectric 240 to cover the interconnection line 265. The second interlayer dielectric 270 may be formed using the same or similar methods as the formation of the second interlayer dielectric 170 in the above-described embodiments.

A storage plug 275 may be formed on the landing pad 235 to penetrate or extend through the first interlayer dielectric 240 and the second interlayer dielectric 270. The storage plug 275 may include the same material as the storage plug 175 in the above-described embodiments and may be formed using the same or similar methods as the storage plug 175. The storage plug 275 may be electrically connected to the landing pad 235. In some embodiments, the storage plug 275 may be in direct contact with the landing pad 235.

In some embodiments, the storage plug 275 may be formed on the landing pad 235 provided on the substrate 200. An overlap area between the landing pad 235 and the second doped region 207b may be greater than an overlap area between the storage plug 275 and the second doped region 207b in plan view. This configuration enables improved reliability of the semiconductor memory device. In greater detail, a contact area between the second doped region 207b and the storage plug 275 may be reduced in the case where the landing pad 235 is absent, as compared with the case where the landing pad 235 is present. This reduction in the contact area may result in deterioration in the reliability of the semiconductor memory device. In this sense, in the case that the landing pad 235 is provided as in the above-described embodiments of the inventive concepts, it is possible to overcome this contact area reduction and therefore to improve the reliability of the semiconductor memory device.

Furthermore, since the storage plug 275 is formed on the landing pad 235, it is possible to prevent the storage plug 275 from being in direct contact with the active region 203. Otherwise (e.g., without the landing pad 235), the storage plug 275 may be in direct contact with the second doped region 207b of the active region 203, and in this case, the device isolation pattern 201 may be excessively etched during a subsequent etching process (for instance, during the etching of the first interlayer dielectric 240 to form the second hole for disposing the storage plug 275), which may result in product failures. However, according to the above-described embodiments of the inventive concepts, since the storage plug 275 is provided on the landing pad 235, it is possible to reduce or prevent failures associated with an excessive etching of the device isolation pattern 201.

According to still other example embodiments of the inventive concepts, the semiconductor memory device may include an interconnection line configured to have a different shape from that of some of the aforementioned embodiments. Hereinafter, a method of fabricating a semiconductor memory device according to still other example embodiments of the inventive concepts will be described in more detail with reference to cross-sectional views shown in FIGS. 24A through 24D.

Figure 24A:
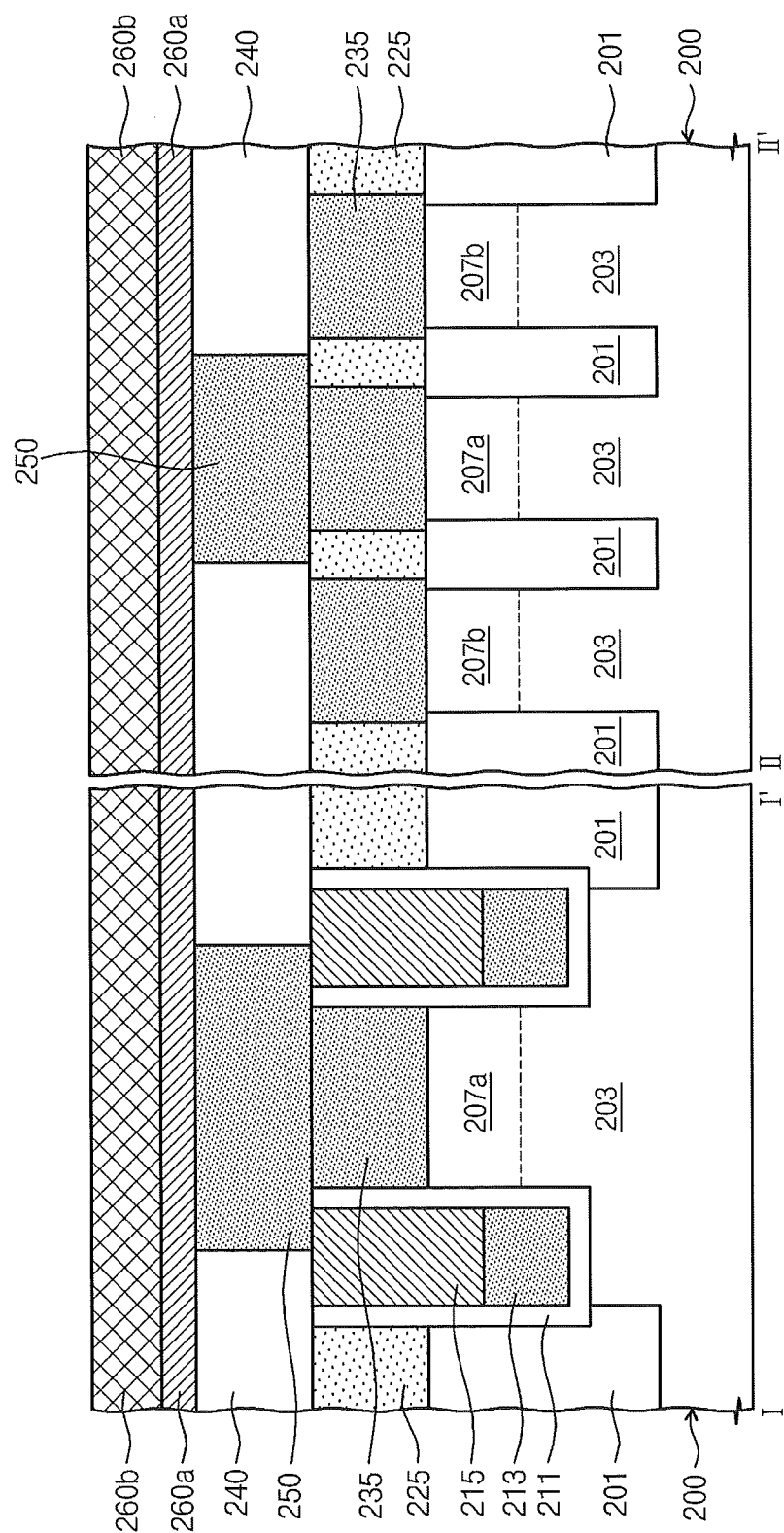

Referring to FIG. 24A, a first conductive interconnection layer 260a and a second conductive interconnection layer 260b may be formed on the first interlayer dielectric 240. The first and second conductive interconnection layers 260a and 260b may be formed using the same or similar methods as the formation of the first and second conductive interconnection layers 160a and 160b of the afore-described embodiments described with reference to FIG. 13A. The first conductive interconnection layer 260a may be formed of the same conductive material as the conductive gap-filling pattern 250. For instance, the conductive gap-filling pattern 250 and the first conductive interconnection layer 260a may be formed of a polysilicon layer. The second conductive interconnection layer 260b may include a conductive material having higher conductivity than that of the first conductive interconnection layer 260a. For instance, in the case that the first conductive interconnection layer 260a includes a polysilicon layer, the second conductive interconnection layer 260b may include a metal layer (e.g., of tungsten).

Referring to FIG. 24B, the first and second conductive interconnection layers 260a and 260b, the conductive gap-filling pattern 250, and the landing pad 235 disposed below the conductive gap-filling pattern 250 may be sequentially patterned to form the interconnection line 265c and the interconnection plug 255. The interconnection line 265c and the first and second portions 250a and 235b of the interconnection plug 255 may be formed using the same or similar methods as those of the afore-described embodiments.

The interconnection line 265c may include a first pattern 265a and a second pattern 265b that are the resultant structures obtained from the patterning of the first and second conductive interconnection layers 260a and 260b, respectively. In some embodiments, the first pattern 265a may be formed to be in direct contact with the first portion 250a of the interconnection plug 255.

According to the embodiments of FIGS. 24A-24D, the interconnection line 265c may include the first pattern 265a formed of the same conductive material as the interconnection plug 255 and the second pattern 265b including a conductive material having higher conductivity than the first pattern 265a. In this case, since the interconnection plug 255 and the first pattern 265a include the same conductive material, it may be possible to reduce contact resistance between the interconnection plug 255 and the interconnection line 265c. In addition, since the second pattern 265b includes a conductive material having higher conductivity than the first pattern 265a, it may be possible to reduce resistance of the interconnection line 265c. As a result, it may be possible to realize a semiconductor memory device having improved electrical characteristics.

Figure 24C:
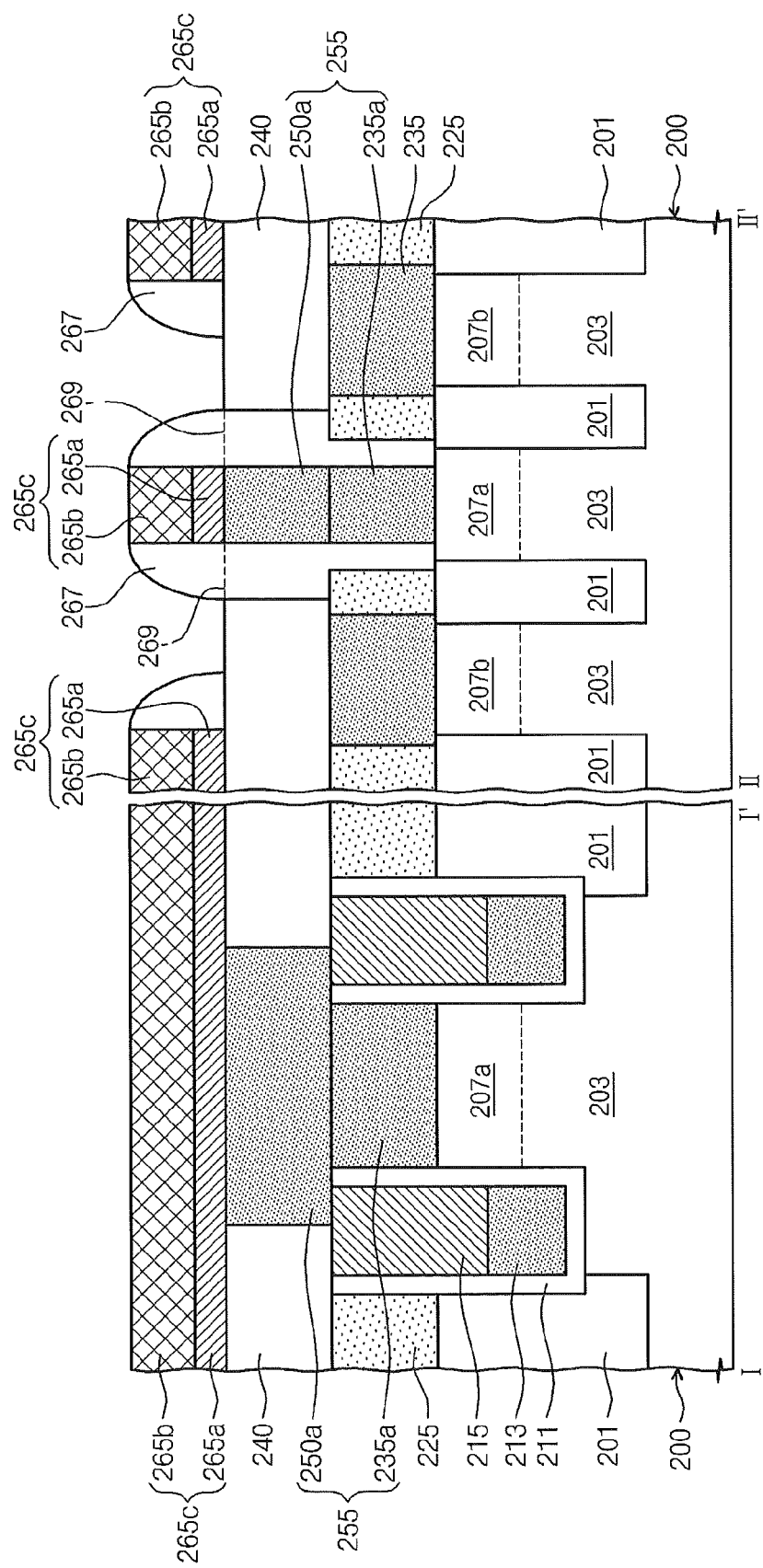

Referring to FIG. 24C, a sidewall spacer 267 may be formed on a sidewall of the interconnection line 265c. The sidewall spacer 267 may include an extended portion 269 filling the second opening 247. The extended portion 269 may be formed to cover the sidewall of the interconnection plug 255. The sidewall spacer 267 may be formed using the same or similar fabrication methods as that of the embodiments described above with reference to FIGS. 22A and 22B.

Figure 24D:
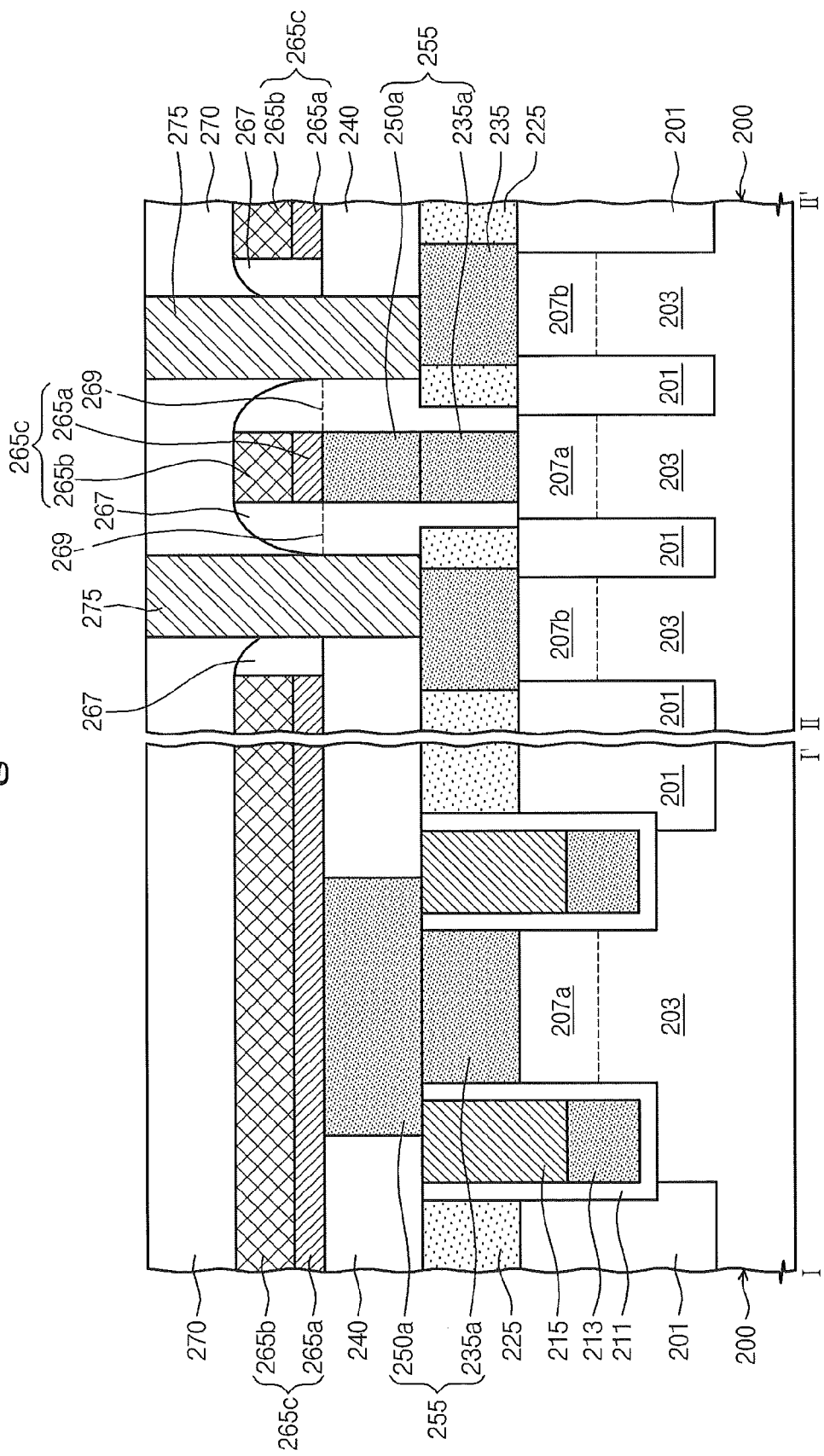

Referring to FIG. 24D, a second interlayer dielectric 270 may be formed on the first interlayer dielectric 240 to cover the interconnection line 265c. A storage plug 275 may be formed on the landing pad 235 to penetrate or extend through the first interlayer dielectric 240 and the second interlayer dielectric 270. The second interlayer dielectric 270 and the storage plug 275 may be formed using the same or similar fabrication methods as that of the embodiments described above with reference to FIGS. 23A and 23B.

Figure 25:
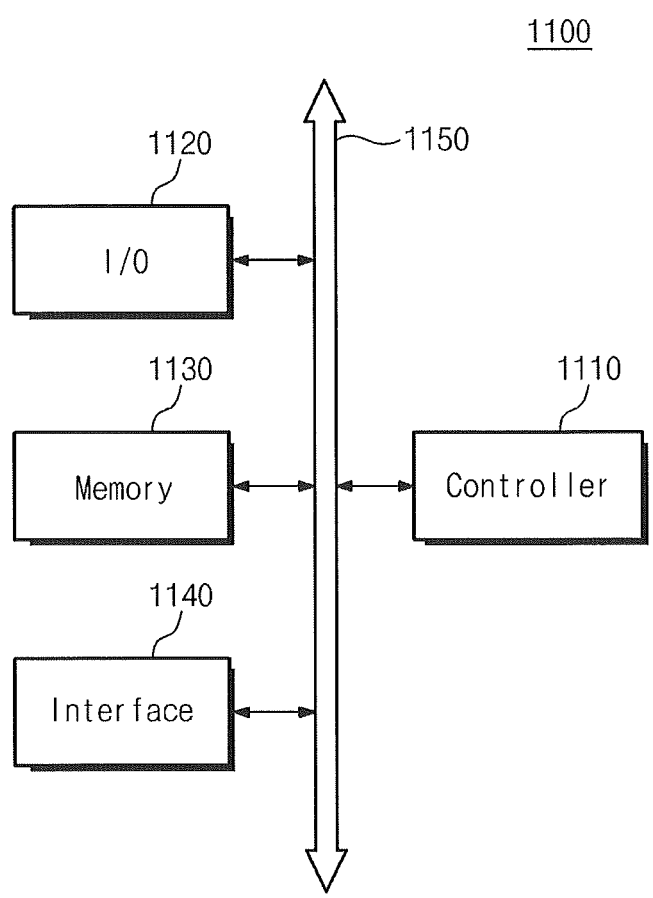
FIG. 25 is a schematic block diagram illustrating an example of memory systems including semiconductor memory devices according to embodiments of the inventive concept.

FIG. 25 is a schematic block diagram illustrating an example of a memory system including semiconductor memory devices according to embodiments of the inventive concept.

Referring to FIG. 25, an electronic system 1100 according to some embodiments may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the semiconductor memory devices according to the embodiments described above. The memory device 1130 may further include another type of semiconductor memory devices which are different from the semiconductor memory devices described above. For example, the memory device 1130 may further include a nonvolatile memory device, a magnetic memory device, a phase change memory device, and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a faster SRAM device that acts as a cache memory for improving operations and/or speed of the controller 1110.

The electronic system 1100 may be used in a personal digital assistant (PDA), a portable computer, a web tablet, a wireless phone, a mobile phone, a digital music player, a memory card, and/or other electronic products. The electronic products may receive or transmit information data by wireless communication.

Figure 26:
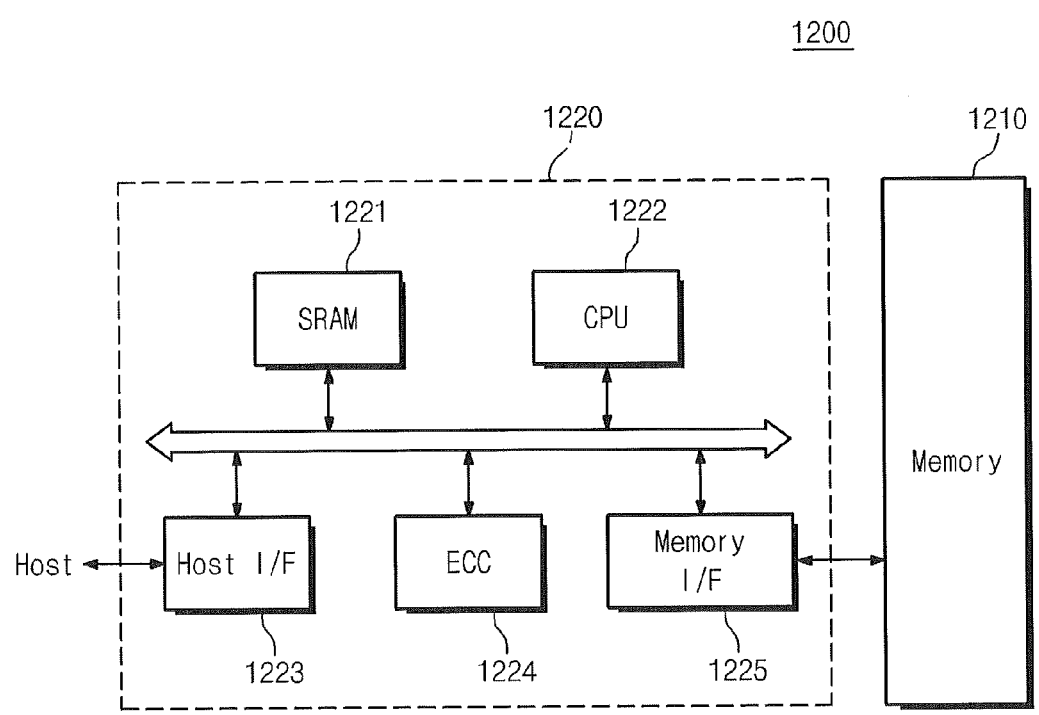
FIG. 26 is a schematic block diagram illustrating an example of memory cards including the semiconductor memory devices according to embodiments of the inventive concept.

FIG. 26 is a schematic block diagram illustrating an example of a memory card including the semiconductor memory devices according to some embodiments of the inventive concept. Referring to FIG. 26, a memory card 1200 according to some embodiment of the inventive concept may include a memory device 1210. The memory device 1210 may include at least one of the semiconductor memory devices according to the various embodiments mentioned above. In other embodiments, the memory device 1210 may further include another type of semiconductor memory device which is different from the semiconductor memory devices according to the embodiments described above. For example, the memory device 1210 may further include a nonvolatile memory device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to use a data communication protocol for communication between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Additionally or alternatively, the memory card 1200 may be a solid state disk or drive (SSD) used in addition to or to replace hard disks of computer systems.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the operations of the semiconductor memory device.

According to example embodiments of the inventive concepts, a semiconductor memory device may include a landing pad disposed on a substrate and a storage plug disposed on the landing pad. Here, the landing pad may be disposed at one side of a buried gate electrode. From this configuration, the storage plug disposed on the landing pad enables an increase in an alignment margin of the storage plug. In addition, since the storage plug is formed not to be in direct contact with the substrate, it is possible to reduce or prevent the substrate from being excessively etched during forming the storage plug.

According to some aspects of the inventive concepts, an interconnection plug on the substrate may be formed to have the substantially same width as an interconnection line on the interconnection plug. This enables to prevent the interconnection plug from (or at least reduce the likelihood of) being connected to storage plugs and/or other interconnection lines adjacent thereto, thereby causing an electrical short circuit. As a result, it is possible to realize a semiconductor memory device having improved reliability.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
   an active region protruding from a substrate, the active region comprising first and second doped regions therein and a trench therein separating the first and second doped regions;
   a buried gate structure extending in a first direction along the trench between first and second opposing sidewalls thereof;
   a conductive interconnection plug on the first doped region adjacent the first sidewall of the trench;
   a conductive interconnection line on the conductive interconnection plug opposite the first doped region and extending in a second direction substantially perpendicular to the first direction, wherein the conductive interconnection line and the conductive interconnection plug have a substantially similar width along the first direction such that opposing sidewalls thereof are aligned at an interface therebetween;
   a conductive landing pad on the second doped region adjacent the second sidewall of the trench, the conductive landing pad having a width greater than that of the second doped region of the active region along the first direction;
   a conductive storage node contact plug on the conductive landing pad opposite the second doped region, the conductive storage node contact plug having a narrower width than the conductive landing pad along the first direction; and
   a storage element on the conductive storage node contact plug opposite the conductive landing pad, wherein the conductive storage node contact plug extends from the conductive landing pad to the storage element.

2. The device of claim 1, wherein, in plan view, an overlap area between the conductive landing pad and the second doped region is greater than an overlap area between the conductive storage node contact plug and the second doped region.

3. The device of claim 1, wherein a contact area between the conductive landing pad and the second doped region is greater than a cross-sectional area of a portion of the conductive storage node contact plug that overlaps with the second doped region in plan view.

4. The device of claim 1, further comprising:
a spacer layer extending between the conductive interconnection plug and the conductive landing pad to provide electrical isolation therebetween, wherein the spacer layer further extends between the conductive interconnection line and the conductive storage node contact plug to provide electrical isolation therebetween.

5. The device of claim 4, wherein the conductive landing pad and the conductive interconnection plug comprise portions of a same layer.

6. The device of claim 1, further comprising:
a dielectric guide pattern extending between the conductive landing pad and a landing pad of an adjacent active region of the substrate.

7. The device of claim 6, wherein the dielectric guide pattern extends substantially parallel to the active region.

8. The device of claim 1, wherein the active region extends in a direction non-parallel and non-perpendicular to the first and second directions.

9. The device of claim 1, wherein the conductive interconnection line comprises a first conductive layer directly on the conductive interconnection plug and a second conductive layer directly on the first conductive layer, wherein the second conductive layer comprises a material having a higher conductivity than that of the first conductive layer.

10. A semiconductor memory device, comprising:
an active region protruding from a substrate, the active region comprising first and second doped regions therein and a trench therein separating the first and second doped regions;
a buried gate structure extending in a first direction along the trench between first and second opposing sidewalls thereof, the buried gate structure comprising a buried gate electrode and a capping pattern thereon in the trench;
a conductive interconnection plug on the first doped region adjacent the first sidewall of the trench;
a conductive interconnection line on the conductive interconnection plug opposite the first doped region, the conductive interconnection line extending in a second direction substantially perpendicular to the first direction, wherein the conductive interconnection line and the conductive interconnection plug have a substantially similar width along the first direction such that opposing sidewalls thereof are aligned at an interface therebetween;
a conductive landing pad on the second doped region adjacent the second sidewall of the trench, the conductive landing pad having a width greater than that of the second doped region of the active region along the first direction;
a storage node contact plug on the conductive landing pad opposite the second doped region, the storage node contact plug having a narrower width than the conductive landing pad along the first direction, wherein an overlap area between the conductive landing pad and the second doped region is greater than an overlap area between the storage node contact plug and the second doped region in plan view;
a spacer layer extending between the conductive interconnection plug and the conductive landing pad to provide electrical isolation therebetween, wherein the spacer layer further extends between the conductive interconnection line and the storage node contact plug to provide electrical isolation therebetween; and
a storage element on the storage node contact plug opposite the conductive landing pad, wherein the storage node contact plug extends from the conductive landing pad to the storage element.

* * * * *